(12) United States Patent
Kato et al.

(10) Patent No.: US 12,509,415 B2
(45) Date of Patent: *Dec. 30, 2025

(54) COMPOUNDS, LIQUID COMPOSITIONS INCLUDING COMPOUNDS, AND ELECTROLUMINESCENT DEVICES

(71) Applicant: SAMSUNG ELECTRONICS CO., LTD., Suwon-si (KR)

(72) Inventors: Fumiaki Kato, Yokohama (JP); Tomoyuki Kikuchi, Yokohama (JP); Hiroko Endo, Yokohama (JP); Keigo Furuta, Yokohama (JP); Keisuke Korai, Yokoham (JP); Mitsunori Ito, Yokohama (JP); Naotoshi Suganuma, Yokohama (JP); Takao Motoyama, Hwaseong-si (JP); Dae Young Chung, Suwon-si (KR); Eun Joo Jang, Suwon-si (KR); Ha Il Kwon, Suwon-si (KR); Hyo Sook Jang, Suwon-si (KR); Soonmin Cha, Suwon-si (KR); Tae Ho Kim, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 961 days.

This patent is subject to a terminal disclaimer.

(21) Appl. No.: 17/560,931

(22) Filed: Dec. 23, 2021

(65) Prior Publication Data

US 2022/0213022 A1    Jul. 7, 2022

(30) Foreign Application Priority Data

Dec. 24, 2020    (JP) .................................. 2020-215216

(51) Int. Cl.
*H01L 51/54*    (2006.01)
*C07C 211/54*    (2006.01)
(Continued)

(52) U.S. Cl.
CPC .......... *C07C 211/54* (2013.01); *C07C 211/61* (2013.01); *C07D 209/82* (2013.01);
(Continued)

(58) Field of Classification Search
None
See application file for complete search history.

(56) References Cited

U.S. PATENT DOCUMENTS 9,515,267 B2    12/2016    Park et al.
9,525,134 B1    12/2016    Radu et al.
(Continued)

FOREIGN PATENT DOCUMENTS

JP    2000186066 A    7/2000
JP    2007182432 A    7/2007
(Continued)

OTHER PUBLICATIONS

English Translation of Japanese Office Action dated Feb. 4, 2025, of the corresponding JP Application No. 2020215216, 2 pp.
English Translation of Japanese Office Action dated Sep. 3, 2024, of the corresponding JP Application No. 2020215216, 4 pp.
(Continued)

*Primary Examiner* — Andrew K Bohaty
(74) *Attorney, Agent, or Firm* — CANTOR COLBURN LLP

(57) ABSTRACT

Provided is a compound represented by Chemical Formula 1 capable of manufacturing an EL device by inkjet printing.

[Chemical Formula 1]

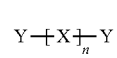

In Chemical Formula 1,
n is an integer of greater than or equal to 3 and less than or equal to 10,
X is a group represented by Chemical Formula 2 and a plurality of X's may be the same or different from each other, and
Y is a group represented by Chemical Formula 3 and a plurality of Y's may be the same or different from each other.

[Chemical Formula 2]

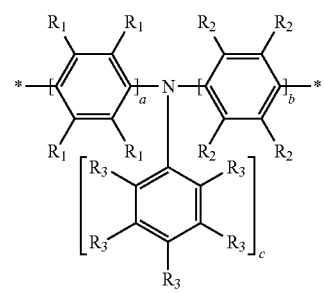

[Chemical Formula 3]

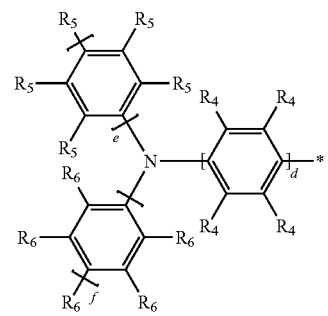

33 Claims, 2 Drawing Sheets

(51) Int. Cl.
    *C07C 211/61*     (2006.01)
    *C07D 209/82*     (2006.01)
    *H10K 71/13*     (2023.01)
    *H10K 71/15*     (2023.01)
    *H10K 85/60*     (2023.01)
    *H10K 50/11*     (2023.01)
    *H10K 50/15*     (2023.01)

(52) U.S. Cl.
    CPC .......... H10K 71/135 (2023.02); H10K 71/15 (2023.02); H10K 85/631 (2023.02); H10K 85/6572 (2023.02); *H10K 50/11* (2023.02); *H10K 50/15* (2023.02)

(56) References Cited

U.S. PATENT DOCUMENTS

| | | | |
|---|---|---|---|
| 10,199,577 | B2 | 2/2019 | Park et al. |
| 10,950,797 | B2 | 3/2021 | Hayashi et al. |
| 10,954,440 | B2 | 3/2021 | Won et al. |
| 11,043,639 | B2 * | 6/2021 | Numata ............ H10K 85/6576 |
| 11,591,518 | B2 | 2/2023 | Won et al. |
| 11,981,852 | B2 | 5/2024 | Won et al. |
| 2006/0232198 | A1 | 10/2006 | Kawamura et al. |
| 2010/0187507 | A1 | 7/2010 | Park et al. |
| 2019/0326519 | A1 * | 10/2019 | Shin ................... H10K 85/6572 |
| 2020/0212313 | A1 | 7/2020 | Numata et al. |
| 2020/0335703 | A1 | 10/2020 | Mochizuki et al. |

FOREIGN PATENT DOCUMENTS

| | | | |
|---|---|---|---|
| JP | 2013531658 | A | 8/2013 |
| JP | 2018525830 | A | 9/2018 |
| JP | 2019157129 | A | 9/2019 |
| JP | 2020105156 | A | 7/2020 |
| KR | 20200011153 | A | 2/2020 |
| WO | 2006120859 | A1 | 11/2006 |
| WO | 11159872 | A1 | 12/2011 |
| WO | 17051765 | A1 | 3/2017 |
| WO | 19098234 | A1 | 5/2019 |

OTHER PUBLICATIONS

Japanese Office Action dated Feb. 4, 2025, of the corresponding JP Application No. 2020215216, 2 pp.
Japanese Office Action dated Sep. 3, 2024, of the corresponding JP Application No. 2020215216, 4 pp.

* cited by examiner

COMPOUNDS, LIQUID COMPOSITIONS INCLUDING COMPOUNDS, AND ELECTROLUMINESCENT DEVICES

CROSS-REFERENCE TO RELATED APPLICATION

This application claims priority to Japanese Patent Application No. 2020-215216 filed in the Japan Patent Office on Dec. 24, 2020, and all the benefits accruing therefrom under 35 U.S.C. § 119, the entire content of which is herein incorporated by reference.

BACKGROUND

1. Field

A compound, a liquid composition including the compound, and an electroluminescent device are disclosed.

2. Description of the Related Art

Research and development of electroluminescent devices (EL devices) are actively progressing. In particular, EL devices are expected to be used as solid-light emitting types that are inexpensive and can be used in large area full color display devices or recording light source arrays. An EL device is a light emitting device including a thin film of several nanometers to several hundred nanometers between an anode and a cathode. In addition, the EL devices usually further include a hole transport layer, a light emitting layer, an electron transport layer, or the like.

Among these, the light emitting layer includes a fluorescent light emitting material and a phosphorescent light emitting material. A phosphorescent light emitting material is a material expected to have a high luminous efficiency compared with a fluorescent light emitting material. In addition, in order to cover a wide color gamut, an RGB light source requires an emission spectrum having a narrow full width at half maximum. Although deep blue is particularly desirable for blue, there are currently no devices found to have a long life-span and satisfactory color purity.

As a method of solving such a problem, some conventional light emitting devices use "quantum dots" which include an inorganic light emitting material as a light emitting material (See, Patent Document 1, Japanese Patent Laid-Open Publication No. 2010-199067). Quantum dots (QD) are semiconductor materials having crystal structures of several nanometers in size and are made up of hundreds to thousands of atoms.

Because quantum dots are very small in size, a surface area per unit volume is large. For this reason, most of the atoms are present on the surface of the nanocrystals, and exhibit quantum confinement effects.

Due to the quantum confinement effect, conventional approaches have adjusted the size of the quantum dot to adjust the emission wavelength resulting in improved characteristics such as improved color purity and high photoluminescence (PL) efficiency. A quantum dot light emitting diode (QD LED) is a multi-layered device including a hole transport layer and an electron transport layer (ETL) with a quantum dot light emitting layer located between the HTL and the ETL, which is known as the basic device.

SUMMARY

In recent years, an EL device is desirable to manufacture by inkjet printing from the viewpoint of a large screen, higher manufacturing efficiency, a lower cost, and the like. On the other hand, in a stacked structure of a lower layer (for example, a hole transport layer) and an upper layer (for example, a light emitting layer), when the lower layer is formed by inkjet printing, a material for the lower layer desirably includes the following two features:

(i) An ink obtained by dissolving the material for the lower layer in a solvent having low viscosity.

(ii) When the upper layer is formed, the lower layer has a high residual film rate (i.e., low solubility in a solvent included in an ink for the upper layer (solvent resistance)).

However, hole transport materials described in Patent Reference 1 (for example, TFB) lack these features.

Accordingly, a technology capable of manufacturing an EL device by inkjet printing is provided.

An embodiment provides a compound having a specific structure.

An embodiment provides a compound represented by Chemical Formula 1.

[Chemical Formula 1]

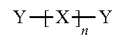

In Chemical Formula 1, n is an integer of greater than or equal to 3 and less than or equal to 10, X is a group represented by Chemical Formula 2 and a plurality of X's are the same or different from each other, and Y is a group represented by Chemical Formula 3 and a plurality of Y's are the same or different from each other,

[Chemical Formula 2]

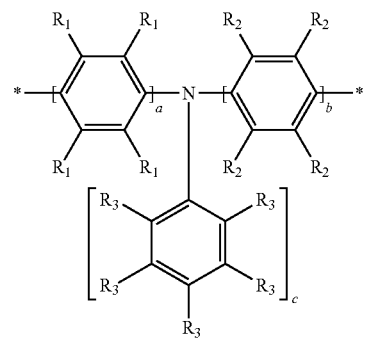

wherein, in Chemical Formula 2, $R_1$, $R_2$, and $R_3$ are each independently a hydrogen atom, a single bond, or an alkyl group having 1 to 10 carbon atoms and may be the same or different and may be linked to each other to form a ring, a and b are each independently an integer of greater than or equal to 2 and less than or equal to 10, and c is greater than or equal to 1 and less than or equal to 6;

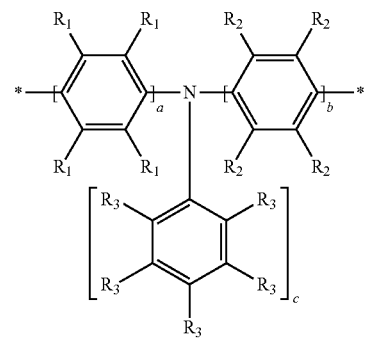

[Chemical Formula 2]

wherein, in Chemical Formula 2, $R_1$, $R_2$, and $R_5$ are each independently a hydrogen atom, a single bond, or an alkyl group having 1 to 10 carbon atoms and may be the same or different and may be linked to each other to form a ring, a and b are each independently an integer of greater than or equal to 2 and less than or equal to 10, and c is greater than or equal to 1 and less than or equal to 6;

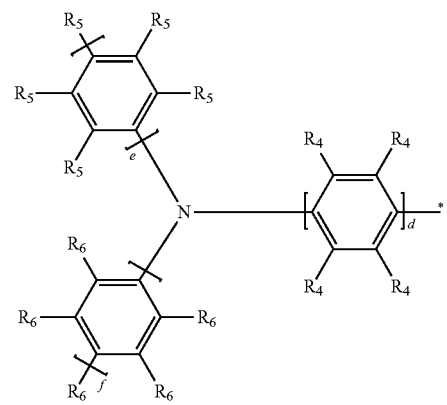

[Chemical Formula 3]

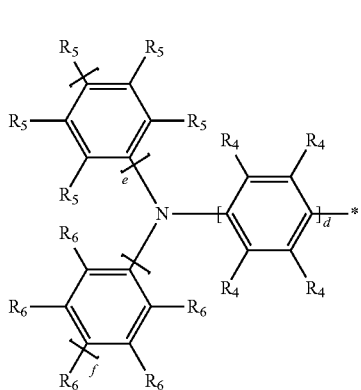

[Chemical Formula 3]

wherein, in Chemical Formula 3, $R_4$, $R_5$, and $R_6$ are each independently a hydrogen atom, a single bond, or an alkyl group having 1 to 8 carbon atoms and may be the same or different and may be linked to each other to form a ring, d is greater than or equal to 1 and less than or equal to 5, and e and f are each independently greater than or equal to 1 and less than or equal to 6.

According to the present disclosure, technologies for manufacturing an EL device by inkjet printing may be provided.

DETAILED DESCRIPTION

Figure 1:
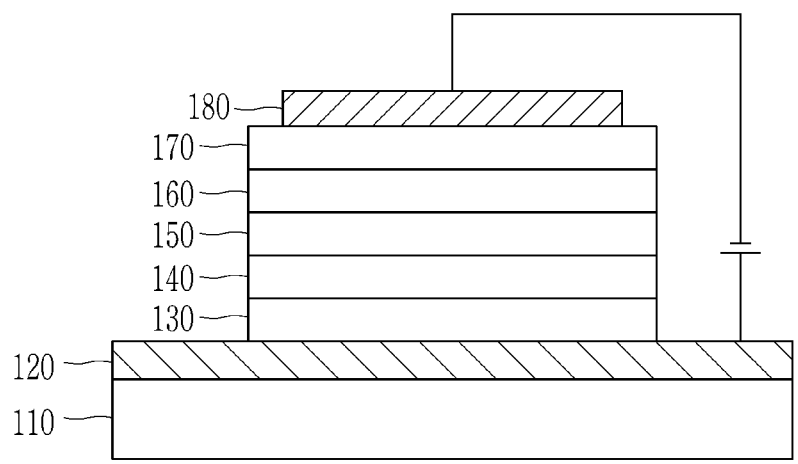
FIG. 1 is a schematic view illustrating an electroluminescent device according to an exemplary embodiment.

According to an embodiment, a compound represented by Chemical Formula 1 is provided:

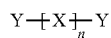

[Chemical Formula 1]

wherein, in Chemical Formula 1, n is an integer of greater than or equal to 3 and less than or equal to 10, X is a group represented by Chemical Formula 2, wherein a plurality of X's may be the same or different from each other, and Y is a group represented by Chemical Formula 3, wherein a plurality of Y's may be the same or different from each other, wherein, in Chemical Formula 3, $R_4$, $R_5$, and $R_6$ are each independently a hydrogen atom, a single bond, or an alkyl group having 1 to 8 carbon atoms and may be the same or different and may be linked to each other to form a ring d is greater than or equal to 1 and less than or equal to 5, and e and f are each independently greater than or equal to 1 and less than or equal to 6.)

In the present disclosure, "compound represented by Chemical Formula 1" is also referred to as "compound" or "compound of the present disclosure."

Another embodiment provides a liquid composition including the compound and a solvent.

According to another embodiment, an electroluminescent device includes a first electrode and a second electrode, and an organic layer including one or more layers disposed between the first electrode and the second electrode, wherein at least one of the organic layers includes the aforementioned compound of Chemical Formula 1.

As used herein, the electroluminescent device is simply referred to as "LED."

Quantum dot electroluminescent devices are also referred to simply as "QLEDs."

An organic electroluminescent device is also simply referred to as "OLED."

The electroluminescent device may be manufactured by sequentially stacking a hole transport layer, a light emitting layer, a charge transport layer, and the like. As a method of forming such a layered structure, a vapor deposition method using a low molecular weight material or a wet method using a polymer material is currently used. Among these, the wet method may desirably be used from the viewpoint of increasing a screen size and efficiency, and reducing a cost. In recent years, in order to provide a device with higher image quality, a coating process by inkjet printing may be employed. However, on the other hand, a design of a material capable of forming a stacked structure has become a major challenge.

Since the compound according to the embodiment has the aforementioned two features (low viscosity and high residual film rate), an electroluminescent device may be manufactured by inkjet printing.

The mechanism of exhibiting a working effect by the constitution of this disclosure is estimated as follows.

The compounds represented by Chemical Formula 1 has a lower molecular weight than a conventional polymer compound. Moreover, since the compounds have many rotation axes in a main chain, various structures are possible. Moreover, since the compounds have a chain structure, there is little entanglement between molecules. Due to these structural features, the aforementioned compounds may have improved solubility and low viscosity when prepared as a solution. In addition, since the compounds represented by Chemical Formula 1 have a linear structure, it is considered to form a packing structure in which molecules are densely arranged (stacked) in a layer. Therefore, once the film is formed, even when it comes into contact with other solvents (for example, an upper layer ink is applied on the film), the other solvent that enters the gap between the compounds is minimized to provide a film having excellent solvent resistance. For this reason, even when another layer is formed on the surface of this layer by a wet method, it has a high residual film rate. The aforementioned features are particularly exhibited when the aforementioned compound is used in the hole transport layer.

Therefore, according to the compound according to an embodiment, the electroluminescent device may be manufactured by inkjet printing. In addition, by applying the compound according to the embodiment to the electroluminescent device (particularly, the hole transport layer of the electroluminescent device), a higher luminous efficiency may be exhibited compared with the device using a known material. It is also found that by applying the compounds according to the present disclosure to an electroluminescent device (particularly, a hole transport layer of the electroluminescent device), durability (luminescence life-span) may be improved compared with the device using known materials. Without wishing to be bound by theory and according to the compounds represented by Chemical Formula 1, since molecules are densely arranged in the layer as described above, the obtained film has excellent hole transport properties.

In addition, the compounds represented by Chemical Formula 1 have a HOMO level suitable for hole injection into the light emitting layer (particularly the quantum dot light emitting layer). Therefore, the electroluminescent device (especially quantum dot electroluminescent device) may exhibit high luminous efficiency. Moreover, durability (luminescence life-span) of an electroluminescent device may be improved by a dense film. In addition, the aforementioned mechanism is theoretical, and the present disclosure is not limited by the aforementioned mechanism.

Hereinafter, embodiments are described. On the other hand, the present disclosure is not limited to the following embodiments. In addition, each drawing is exaggerated for better understanding and ease of description, and the dimensional ratio of each constituent element in each drawing may differ from reality. In addition, when the embodiment of the present disclosure has been described with reference to the drawings, the same reference numerals are given to the same elements in the description of the drawings, and redundant descriptions are omitted.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper,"

depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as' limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

In the present specification, unless otherwise specified, operation and physical properties are measured under the conditions of room temperature (20° C. or more and 25° C. or less)/relative humidity of 40% RH or more and 50% RH or less.

In the present specification, unless otherwise defined, the aromatic hydrocarbon group may be an aryl group or an arylene group derived from an aromatic compound (arene) and the aromatic heterocyclic group may be a heteroaryl group or a heteroarylene group derived from a heterocyclic aromatic compound (heteroarene), and may include at least one, for example, 1 to 3 heteroatoms selected from N, O, S, Se, Te, Si, and P in the ring.

As used herein, unless otherwise specified, "substituted" refers to substitution with an alkyl group, a cycloalkyl group, a hydroxyalkyl group, an alkoxyalkyl group, an alkoxy group, a cycloalkoxy group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxyl group (—OH), a carboxyl group (—COOH), a thiol group (—SH), or a cyano group (—CN). Also, optionally the substituents are not same as the groups being substituted. For example, an alkyl group is not substituted with an alkyl group.

Herein, the alkyl group as the substituent may be either a linear or branched saturated aliphatic hydrocarbon monovalent group, for example a linear alkyl group having 1 to 20 carbon atoms or a branched alkyl group having 3 to 20 carbon atoms. Specifically, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-icosyl group, and the like.

As the substituent, the cycloalkyl group refers to a monovalent saturated hydrocarbon monocyclic group having 3 to 10 carbon atoms, and non-limiting examples thereof include a cyclopropyl group, a cyclobutyl group, a cyclopentyl group, and a cyclohexyl group.

As the hydroxyalkyl group, for example, the alkyl group may be substituted with 1 to 3 (for example 1 or 2, and more desirably 1) hydroxy groups (for example, hydroxymethyl group, hydroxyethyl group).

As the alkoxyalkyl group, for example, the alkyl group may be substituted with 1 to 3 (desirably 1 or 2 and more desirably 1) alkoxy groups.

The alkoxy group refers to a monovalent group represented by —OA$_{101}$ (wherein A$_{101}$ is the alkyl group) as the substituent and may be either linear or a branched, but desirably a linear alkoxy group having 1 to 20 carbon atoms or a branched alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, a 3-ethylpentyloxy group, an octyloxy group, a 2-ethylhexyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, and the like.

The cycloalkoxy group as a substituent refers to a monovalent group represented by —OA$_{102}$ (wherein A$_{102}$ is the cycloalkyl group) and may be, for example, a cyclopropyl oxy group, a cyclobutyl oxy group, a cyclopentyl oxy group, a cyclohexyl oxy group, and the like.

The alkenyl group refers to a hydrocarbon group formed by including at least one carbon-carbon double bond in the middle or at the terminus of the alkyl group and may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group as a substituent refers to a hydrocarbon group formed by including at least one carbon-carbon triple bond in the middle or at the terminus of the alkyl group and may include, for example, an acetylenyl group, a 1-propynyl group, a 2-propynyl group, a 1-butynyl group, a 2-butynyl group, a 3-butynyl group, a 1-pentetyl group, a 2-pentetyl group, a 3-pentetyl group, 1-hexynyl group, a 2-hexynyl group, a 3-hexynyl group, a 1-heptinyl group, a 2-heptinyl group, a 5-heptinyl group, a 1-octynyl group, a 3-octynyl group, a 5-octynyl group, and the like.

Examples of the aryl group as the substituent refer to a monovalent group having a carbocyclic aromatic system having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

The aryloxy group as the substituent indicates —$OA_{103}$ (wherein $A_{103}$ is the aryl group having 6 to 30 carbon atoms) and may include, for example, a phenoxy group, and a naphthyloxy group.

The alkylthio group as the substituent indicates —$SA_{104}$ (wherein $A_{104}$ is the aryl group having 6 to 30 carbon atoms) and may include, for example, a methylthio group, an ethylthio group, a propylthio group, a pentylthio group, a hexylthio group, an octylthio group, a dodecylthio group, and the like.

The cycloalkylthio group as the substituent indicates —$SA_{105}$ (wherein $A_{105}$ is the cycloalkyl group) and may include, for example, a cyclopentylthio group and a cyclohexylthio group.

The arylthio group as the substituent indicates —$SA_{106}$ (wherein $A_{106}$ is the aryl group having 6 to 30 carbon atoms) and may include, for example, a phenylthio group, a naphthylthio group, and the like.

The alkoxycarbonyl group (also known as an alkyl ester group) as the substituent may include, for example, a methyloxy carbonyl group, an ethyloxy carbonyl group, a butyloxy carbonyl group, an octyloxy carbonyl group, a dodecyloxycarbonyl group, and the like.

The aryloxycarbonyl group (also known as an aryl ester group) as the substituent may include, for example, a phenyloxycarbonyl group, a naphthyloxycarbonyl group, and the like.

Compound

An embodiment provides a compound represented by Chemical Formula 1. The compounds of this disclosure have low viscosity when they are prepared as a solution, and have a high residual film rate. Therefore, using the compound according to an embodiment, the EL device may be manufactured by inkjet printing. In addition, an electroluminescent device (particularly quantum dot electroluminescent device) including the compounds according to the present disclosure (especially in a hole transport layer) may have excellent luminous efficiency and durability (long luminescence life-span).

[Chemical Formula 1]

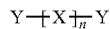

In Chemical Formula 1, X may be a group represented by Chemical Formula 2. In this case, when a plurality of X's are present, X's may be the same or different from each other.

[Chemical Formula 2]

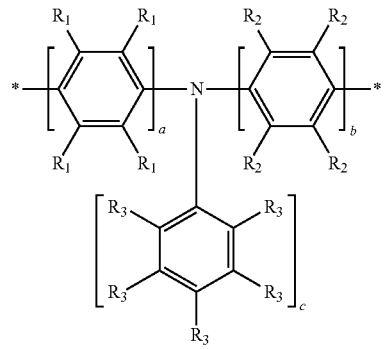

In Chemical Formula 2, $R_1$, $R_2$, and $R_3$ may each independently be a hydrogen atom, a single bond, or an alkyl group having 1 to 10 carbon atoms. In this case, a plurality of $R_1$'s, a plurality of $R_2$'s, and a plurality of $R_3$'s may be the same or different from each other. Further, any two or more of $R_1$, $R_2$, and $R_3$ may be linked to each other to form a ring. The alkyl group having 1 to 10 carbon atoms may be either linear or branched, and is not particularly limited.

The alkyl group having 1 to 10 carbon atoms may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, and the like.

In an embodiment, $R_1$, $R_2$, and $R_3$ may each independently desirably be a hydrogen atom, a single bond, or an alkyl group having 1 to 6 carbon atoms, more desirably a hydrogen atom, a methyl group, an n-propyl group, or an n-hexyl group, much more desirably a hydrogen atom, a methyl group, or an n-propyl group, and particularly desirably a hydrogen atom or a methyl group. These $R_1$, $R_2$, and $R_3$ groups impart improved solubility, and at the same time imparts low viscosity when prepared into a solution. Moreover, since it has the outstanding solvent resistance, it has a high residual film rate.

Herein, the forms in which $R_1$, $R_2$, and $R_3$ are linked to each other to form a ring are not particularly limited, but may be for example, forms in which (a1) two $R_1$'s that are each linked to an adjacent benzene ring are linked to each other to form a ring, (a2) two $R_2$'s that are each linked to an adjacent benzene ring are linked to each other to form a ring, (a3) two $R_3$'s that are each linked to an adjacent benzene ring are linked to each other to form a ring; (a4) $R_1$ and $R_2$ linked to an adjacent benzene ring through a nitrogen atom (N) are linked to each other to form a ring, (a5) $R_1$ and $R_3$ that are linked to an adjacent benzene ring through a nitrogen atom (N) are linked to each other to form a ring, or (a6) $R_2$ and $R_3$ that are linked to an adjacent benzene ring through a nitrogen atom (N) are linked to each other to form a ring.

In an embodiment, in the forms of (a1) to (a3), a methyl group and a hydrogen atom may be linked to each other to form a ring, thereby forming a fluorene structure. In another embodiment, in the forms (a4) to (a6), a hydrogen atom and a hydrogen atom may be linked to each other to form a ring, thereby forming a carbazole structure.

In Chemical Formula 2, a and b may each independently be an integer of greater than or equal to 2 and less than or equal to 10.

When a and b are less than 2, it is difficult to have a packing structure in which molecules are densely arranged (stacked) in the layer, and a sufficient residual film rate may not be obtained.

Moreover, when a and b are less than 2, a HOMO level of the aforementioned compounds becomes shallow, and sufficient luminous efficiency may not be acquired. When a and b exceed 10, a low-viscosity ink suitable for inkjet printing may not be obtained.

From the above viewpoint, a and b may each independently be as follows: one is greater than or equal to 2 and less than or equal to 10 and the other is greater than or equal to 3 and less than or equal to 10; desirably one is greater than or equal to 2 and less than or equal to 8, and the other is greater than or equal to 3 and less than or equal to 8; more desirably one is greater than or equal to 2 and less than or equal to 6 and the other is greater than or equal to 3 and less than or equal to 6; and particularly desirably one is greater than or equal to 2 and less than or equal to 4 and the other is 3 or 4. Further, when a and b satisfy the above numerical range, the sum of a and b may desirably be greater than or equal to 5 and less than or equal to 20, more desirably greater than or equal to 5 and less than or equal to 15, much more desirably greater than or equal to 5 and less than or equal to 10, and particularly desirably greater than or equal to 5 and less than or equal to 7.

In Chemical Formula 2, c may be greater than or equal to 1 and less than or equal to 6. When c exceeds 6, a low-viscosity ink suitable for inkjet printing may not be obtained, or a sufficient remaining-film rate may not be obtained. From the above viewpoint, c may be desirably greater than or equal to 1 and less than or equal to 4, more desirably greater than or equal to 1 and less than or equal to 3, much more desirably 1 or 2, and particularly desirably 2.

In Chemical Formula 2, * indicates a binding site with Y (a group represented by Chemical Formula 3).

In Chemical Formula 1, n may be an integer of greater than or equal to 3 and less than or equal to 10. When'n is less than 3, it is difficult to obtain a densely arranged (stacked) packing structure in which molecules are densely arranged in a layer, and thus a sufficient residual film rate may not be obtained. In addition, when n is less than 3, a HOMO level of the compounds according to the present disclosure becomes shallow, and sufficient luminous efficiency may not be obtained. When n exceeds 10, a low-viscosity ink suitable for inkjet printing may not be obtained. From the above viewpoint, n may be desirably greater than or equal to 3 and less than or equal to 8, more desirably greater than or equal to 3 and less than or equal to 6, and still more desirably 4 or 5.

In Chemical Formula 1, Y may be a group represented by Chemical. Formula 3. In this case, a plurality of Y's may be the same or different from each other.

[Chemical Formula 3]

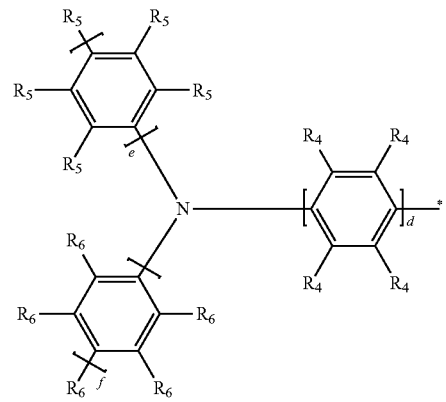

In Chemical Formula 3, $R_4$, $R_5$, and $R_6$ may each independently be a hydrogen atom, a single bond, or an alkyl group having 1 to 8 carbon atoms. In this case, a plurality of $R_4$'s, a plurality of $R_5$'s, and a plurality of $R_6$'s may be the same or different from each other. Further, $R_4$, $R_5$, and $R_6$ may be linked to each other to form a ring.

The alkyl group having 1 to 8 carbon atoms may be either linear or branched, and is not particularly limited. The alkyl group having 1 to 8 carbon atoms may be a methyl group, ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, and the like.

In an embodiment, $R_4$, $R_5$, and $R_6$ may each independently desirably be a hydrogen atom, a single bond, or an alkyl group having 1 to 6 carbon atoms, more desirably a hydrogen atom, or an alkyl group having 1 to 3 carbon atoms, and much more desirably a hydrogen atom, a methyl group, or an n-propyl group. These $R_4$, $R_5$, and $R_6$ imparts improved solubility, and at the same time imparts low viscosity when prepared into a solution. Moreover, since it has the outstanding solvent resistance, it has a high residual film rate.

Herein, the forms in which $R_4$, $R_5$, and $R_6$ are linked to each other to form a ring are not particularly limited, but may be for example, forms in which (b1) two $R_4$'s that are each linked to an adjacent benzene ring are linked to each other to form a ring, (b2) two $R_5$'s that are each linked to an adjacent benzene ring are linked to each other to form a ring, (b3) two $R_6$'s that are each linked to an adjacent benzene ring are linked to each other to form a ring, (b4) $R_4$ and $R_5$ that are linked to an adjacent benzene ring through a nitrogen atom (N) are linked to each other to form a ring, (b5) $R_4$ and $R_6$ that are linked to an adjacent benzene ring through a nitrogen atom (N) are linked to each other to form a ring, or (b6) $R_5$ and $R_6$ that are linked to an adjacent benzene ring through a nitrogen atom (N) are linked to each other to form a ring.

In an embodiment, in the forms of (b1) to (b3), one of $R_4$, $R_5$, and $R_6$ is a single bond and one of $R_4$, $R_5$, and $R_6$ is a methyl group that is linked to a carbon of an aryl ring of Chemical Formula 3 to form a ring, thereby forming a fluorene structure. In another embodiment, in the forms (b4) to (b6), two of $R_4$, $R_5$, and $R_6$ are single bonds and the carbons of the aryl rings of Chemical Formula 3 are linked to each other to form a ring, thereby forming a carbazole structure.

In Chemical Formula 3, d may be an integer of greater than or equal to 1 and less than or equal to 5. When d exceeds 5, a low-viscosity ink suitable for inkjet printing may not be obtained. From the above viewpoint, d may be, desirably greater than or equal to 1 and less than or equal to 4, more desirably, greater than or equal to 1 and less than or equal to 3, much more desirably 1 or 2, or particularly desirably 1.

In Chemical Formula 3, e and f may each independently be an integer of greater than or equal to 1 and less than or equal to 6. When e and f exceed 6, a low-viscosity ink suitable for inkjet printing may not be obtained, or a sufficient residual film rate may not be obtained. From the above viewpoint, e and f may each independently desirably greater than or equal to 1 and less than or equal to 4, more desirably greater than or equal to 1 and less than or equal to 3, much more desirably 1 or 2, or particularly desirably 2.

In Chemical Formula 3, * may be a binding site with X (the group represented by Chemical Formula 2).

In the compound according to an embodiment, in Chemical Formula 1, n may be greater than or equal to 3 and less than or equal to 8; in Chemical Formula 2, $R_1$, $R_2$, and $R_3$ may each independently be a hydrogen atom, or an alkyl group having 1 to 6 carbon atoms, a and b may each independently be greater than or equal to 3 and less than or equal to 8, and c may be greater than or equal to 1 and less than or equal to 4; and in Chemical Formula 3, $R_4$, $R_5$, and $R_6$ may each independently be hydrogen, or an alkyl group having 1 to 6 carbon atoms, d may be greater than or equal to 1 and less than or equal to 4, and e and f may each independently be greater than or equal to 1 and less than or equal to 4.

In the compound according to another embodiment, in Chemical Formula 1, n may be greater than or equal to 3 and less than or equal to 6; in Chemical Formula 2, $R_1$, $R_2$, and $R_3$ may each independently be hydrogen, a single bond, a methyl group, an n-propyl group, or an n-hexyl group, a and b may each independently be greater than or equal to 3 and less than or equal to 6, and c may be greater than or equal to 1 and less than or equal to 3; and in Chemical Formula 3, $R_4$, $R_5$, and $R_6$ may each independently be hydrogen, a single bond, or an alkyl group having 1 to 3 carbon atoms, d may be greater than or equal to 1 and less than or equal to 3, and e and f may each independently be greater than or equal to 1 and less than or equal to 3.

The compounds according to the aforementioned embodiments have excellent solubility and at the same time have a lower viscosity when prepared into a solution. Moreover, these compounds also have excellent solvent resistance and have a high residual film rate even when another layer is formed on the surface of the layer by a wet method. Moreover, an electroluminescent device including these compounds may exhibit high luminous efficiency and durability (luminescence life-span), compared with the device including a well-known material.

Hereinafter, specific examples of the aforementioned compounds may include compounds of Group 1.

[Group 1]
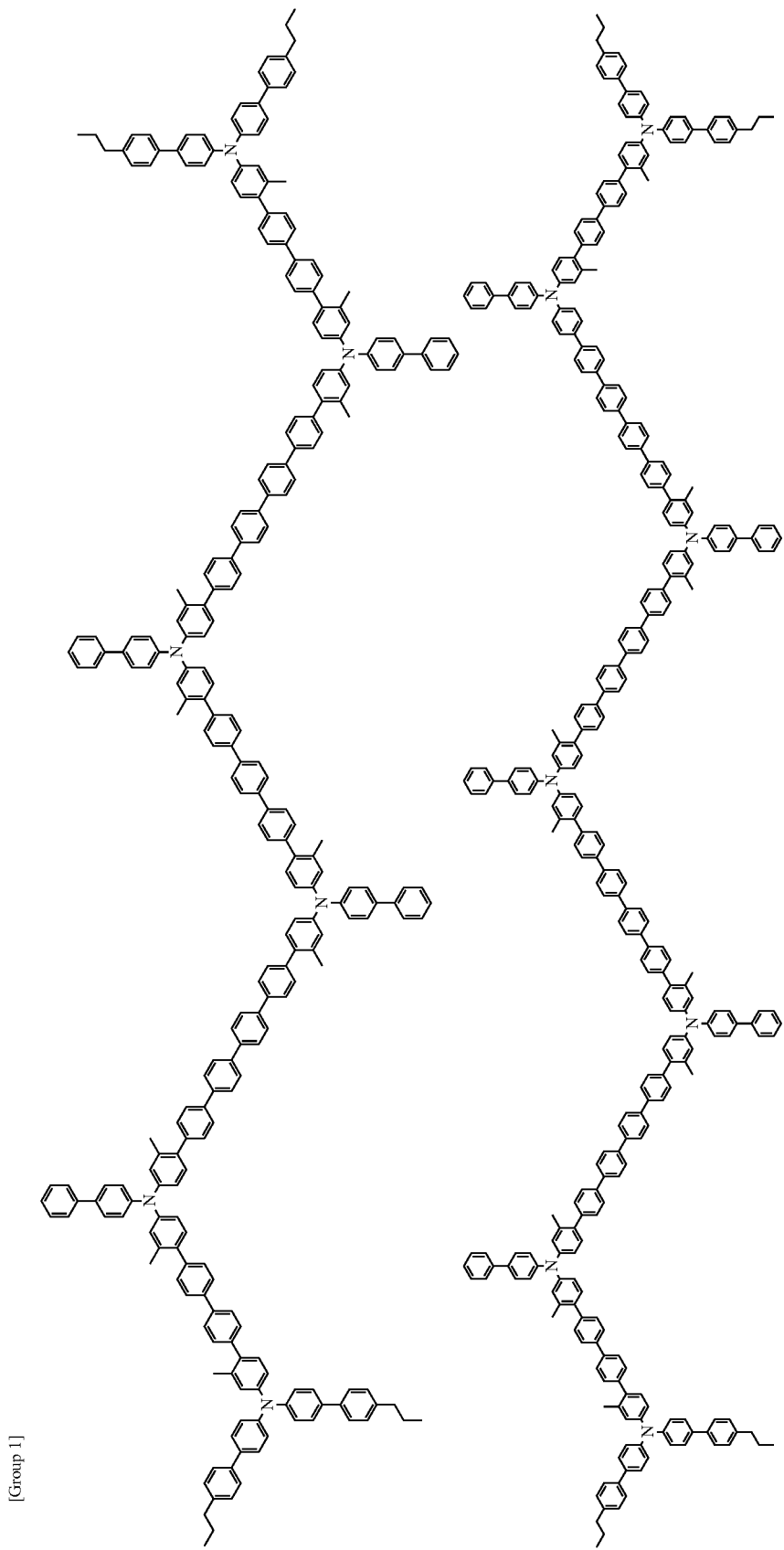

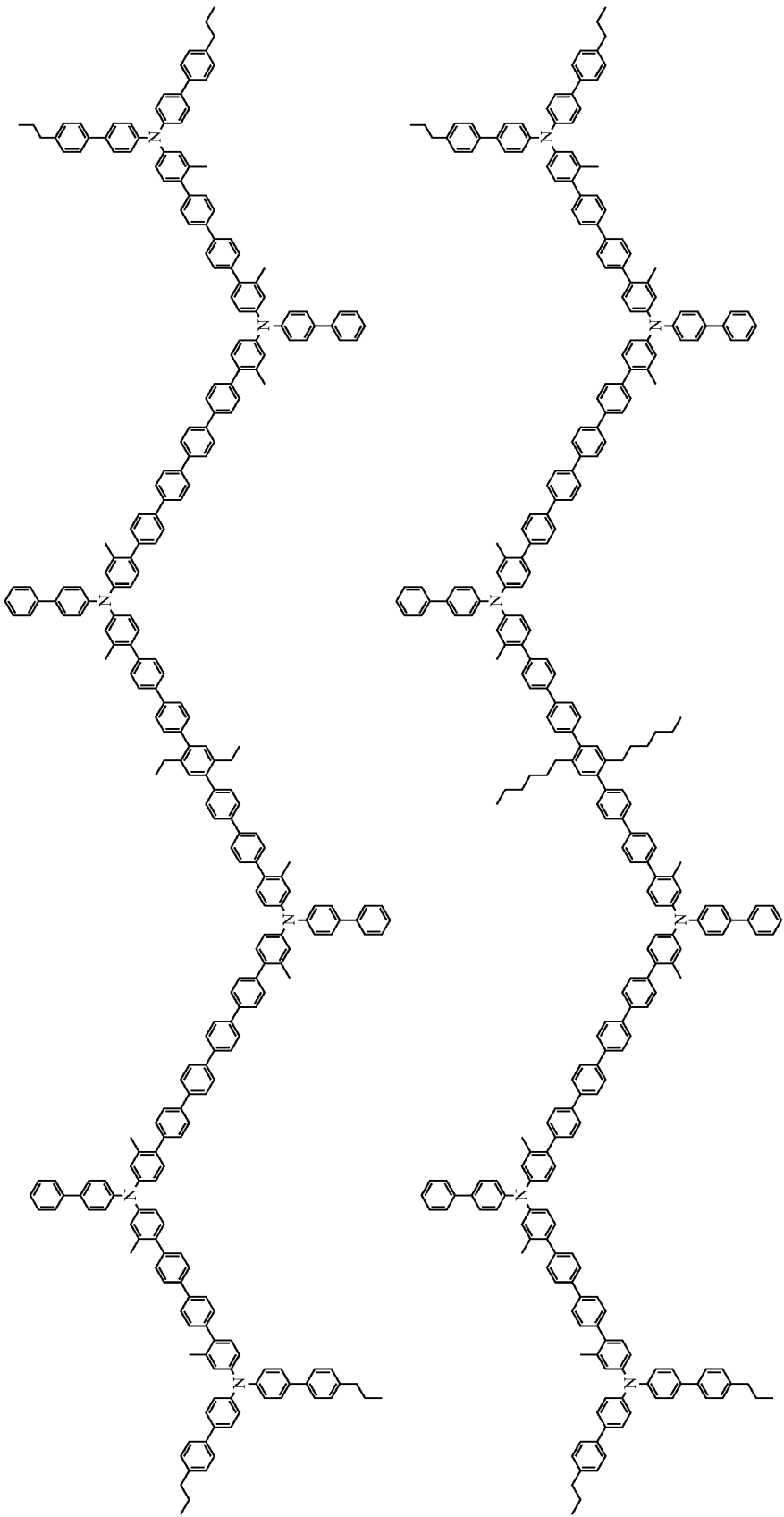

-continued
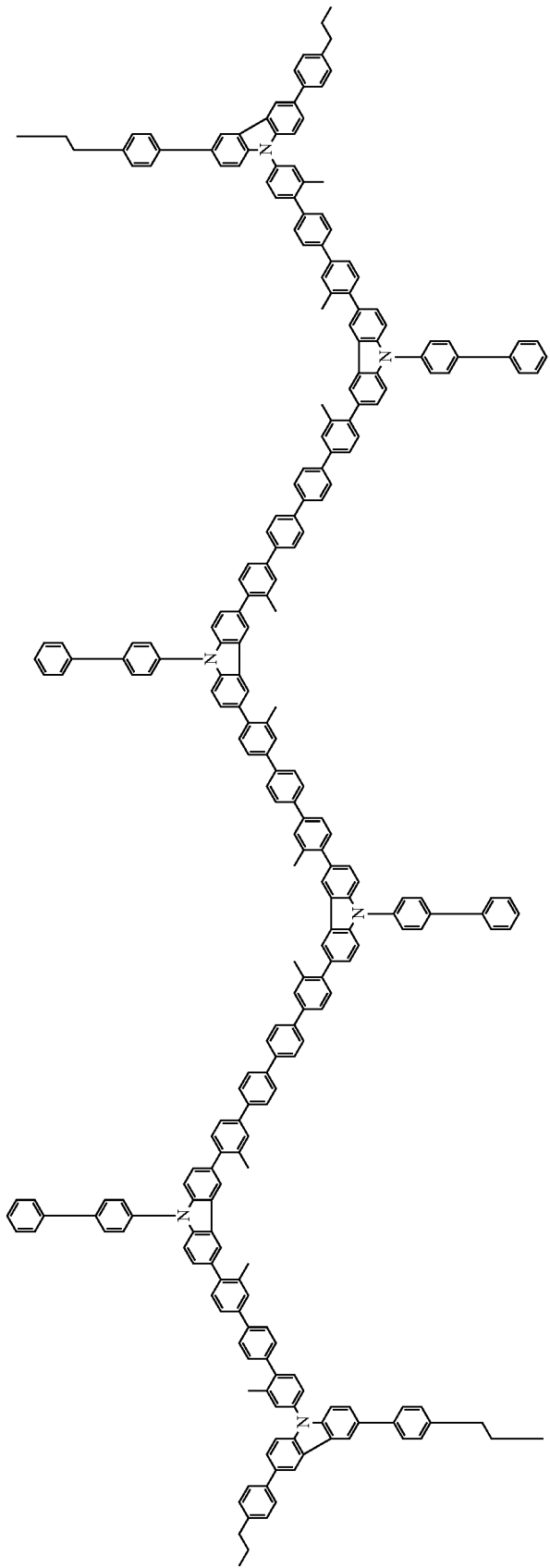

A molecular weight of the aforementioned compounds is not particularly limited, but may be greater than or equal to about 3000 g/mole and less than or equal to about 10000 g/mole, desirably greater than or equal to about 3000 g/mole and less than or equal to about 8000 g/mole, and more desirably greater than or equal to about 3000 g/mole and less than or equal to about 6000 g/mole. When the molecular weight is greater than or equal to about 3000 g/mole, a residual film rate may be improved. When the molecular weight is less than or equal to about 10000 g/mole, the viscosity of the ink may be further reduced.

In addition, unless otherwise specified, the molecular weight (molecular weight of the compounds according to the present disclosure, low molecular weight compound, and polymer compound) in this specification adopts a value measured by gel permeation chromatography under the following conditions.

The molecular weight is measured by GPC (manufactured by Shimadzu Corporation, trade name: LC-20AD) using polystyrene as a standard substance.

At this time, the sample to be measured is dissolved in tetrahydrofuran to a concentration of about 0.05 wt %, and then 20 μL of the sample is injected into GPC. Tetrahydrofuran (THF) is used for the mobile phase of GPC, and it flows at a flow rate of 1.0 mL/min. As a column, PLgel MIXED-B (manufactured by Polymer Research Institute) is used. As a detector, a UV-VIS detector (manufactured by Shimadzu Corporation, trade name: SPD-10AV) is used.

The aforementioned compounds may be synthesized using a known organic synthesis method. Specific methods of synthesizing the aforementioned compounds may be easily understood by those skilled in the art with reference to the examples to be described later.

Specifically, the aforementioned compounds may be produced by reacting a compound represented by Chemical Formula 4 with a compound represented by Chemical Formula 5.

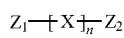
[Chemical Formula 4]

[Chemical Formula 5]

In Chemical Formulas 4 and 5, X, Y, and n are the same as in Chemical Formula 1. $Z_1$, $Z_2$, and $Z_{1'}$ may each independently be a halogen atom (a fluorine atom, a chlorine atom, a bromine atom, an iodine atom, particularly a bromine atom) or a group represented by Chemical Formula A.

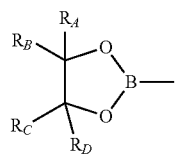
[Chemical Formula A]

In Chemical Formula A,
$R_A$ to $R_D$ are each independently an alkyl group having 1 to 3 carbon atoms. Desirably, each of $R_A$ to $R_D$ may be a methyl group.

Meanwhile, $Z_1$ and $Z_2$ of Chemical Formula 4 may be the same or different from each other. $Z_1$ and $Z_2$ of Chemical Formula 4 and $Z_{1'}$ of Chemical Formula 5 may be different from each other.

The compounds represented by Chemical Formula 4 and the compounds represented by Chemical Formula 5 may be synthesized by appropriately combining known synthetic reactions, and their structures may be identified according to known methods (e.g., NMR, LC-MS, etc.).

Composition

The compounds of this disclosure may be used as a composition in combination with other compounds. In other words, according to an embodiment, a composition including the aforementioned compounds and a low molecular weight compound having a molecular weight of less than or equal to about 2000 g/mole, wherein a content of the low molecular weight compound is less than or equal to about 30 wt %, is provided. The aforementioned compositions may be used for preparation of an ink for inkjet printing and thus the viscosity of the ink may be further reduced. In addition, not wishing to be bound by theory, when the aforementioned composition is used to form an organic layer (e.g., a hole transport layer or a hole injection layer, desirably, the hole transport layer) of an electroluminescent device, the low molecular weight compound may enter voids between the aforementioned compounds and thus form a dense film. Thereby, performance of the organic layer (for example, hole injection performance of the hole transport layer, hole transport performance of the hole injection layer, desirably, the hole transport performance of the hole transport layer) may be improved. Accordingly, device performance may be improved.

In addition, another embodiment provides a composition including the aforementioned compound, and a polymer compound having a molecular weight of greater than or equal to about 10000 g/mole, wherein a content of the polymer compound may be less than or equal to about 60 wt %. When the composition may be used to form an organic layer of an electroluminescent device (e.g., a hole transport layer or a hole injection layer, desirably, the hole transport layer), the aforementioned compounds and the polymer compounds may be entangled with each other to further improve a residual film rate. In addition, the aforementioned compounds and the polymer compounds may be combined and thus improve performance of the organic layer (for example, hole transport performance of the hole transport layer or hole injection performance of the hole injection layer, desirably, the hole transport performance of the hole transport layer).

Another embodiment provides a composition including the aforementioned compound, a low molecular weight compound having a molecular weight of less than about 2000 g/mole, and a polymer compound having a molecular weight of greater than about 10000 g/mole, wherein a content of the low molecular weight compound is less than or equal to about 30 wt %, and a content of the polymer compound is less than or equal to about 60 wt %. By using the composition, both the performance of the aforementioned device and the residual film rate may be compatibly improved.

In the present specification, "the low molecular weight compound having a molecular weight of less than about 2000 g/mole" is also simply referred to as a "low molecular weight compound."

"The polymer compound having a molecular weight of greater than about 10000 g/mole" is also simply referred to as a "polymer compound."

In addition, the composition including the aforementioned compound, the low molecular weight compound, and/or the polymer compound in a predetermined ratio is also referred to as a "composition."

Low Molecular Weight Compound

The low molecular weight compound is not particularly limited as long as the molecular weight is less than about 2000 g/mole. According to one embodiment, the low molecular weight compound may be at least one compound represented by Chemical Formulas J1 to J3.

[Chemical Formula J1]

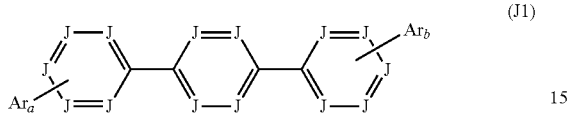

(J1)

In Chemical Formula J1, $Ar_a$ and $Ar_b$ may each independently be a substituted or unsubstituted monovalent aromatic hydrocarbon group or monovalent aromatic heterocyclic group. Desirably, $Ar_a$ and $Ar_b$ may be a substituted or unsubstituted phenyl group, biphenyl group, or terphenyl group. $Ar_a$ and $Ar_b$ may be combined with adjacent aromatic rings to form a ring.

In Chemical Formula J1, J may be $=C(R_a)-$ or $=N-$, and desirably $=C(R_a)-$. Herein, $R_a$ may be a hydrogen atom, a single bond, an alkyl group, a cyano group, a monovalent aromatic hydrocarbon group, a monovalent aromatic heterocyclic group, a hydrocarbon group-substituted silyl group, an alkoxy group, or a halogen group. A plurality of $R_a$'s may be combined with each other to form a ring. The compound represented by Chemical Formula J1 may be a compound represented by Chemical Formula J1-1.

[Chemical Formula J1-1]

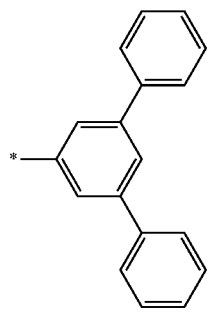

In Chemical Formula J1-1, $Ar_a'$ and $Ar_b'$ may be a group of Group J1-1. In addition, a hydrogen atom contained in the group of Group J1-1 may be replaced by the substituent. In addition, in the group of Group J1-1, * indicates a bond with the benzene ring carbon of Chemical Formula J1-1. In Chemical Formula J1-1, $R_a$ may each independently be a linear alkyl group having 1 to 12 carbon atoms, and desirably a linear alkyl group having 3 to 8 carbon atoms.

[Group J1-1]

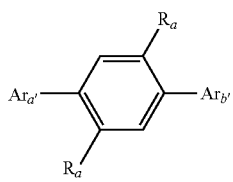

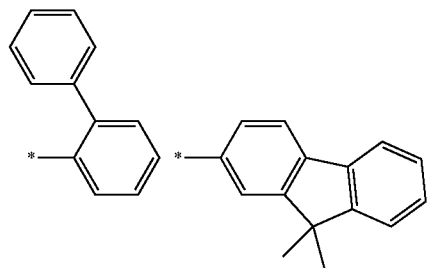

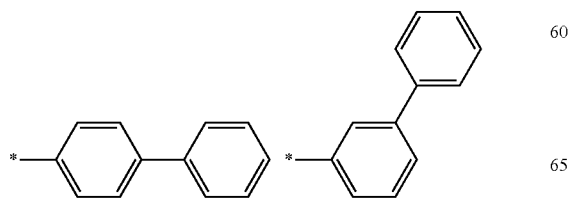

Specific examples of the low molecular weight compound represented by Chemical Formula J1 may include compounds represented by Group J1. These may be used alone or may be used as a mixture of 2 or more types.

[Group J1]

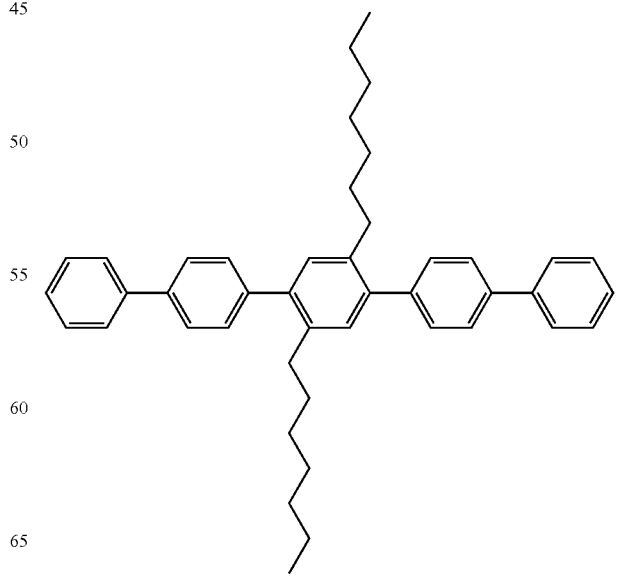

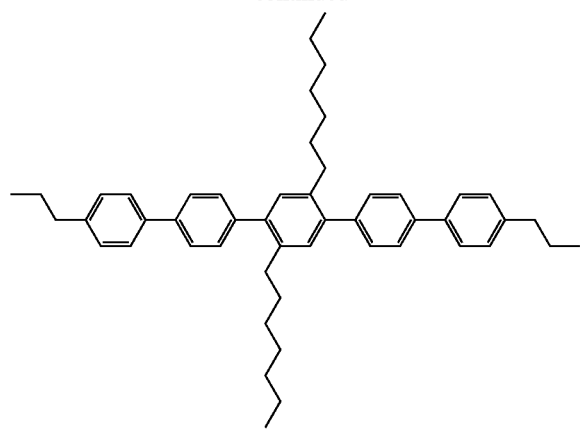
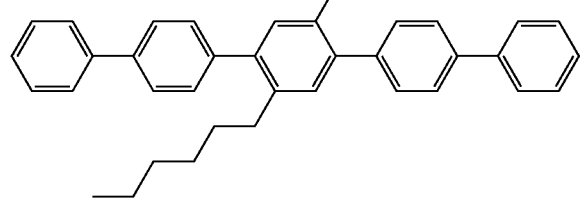
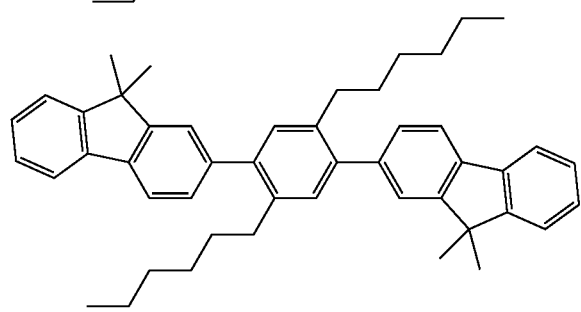
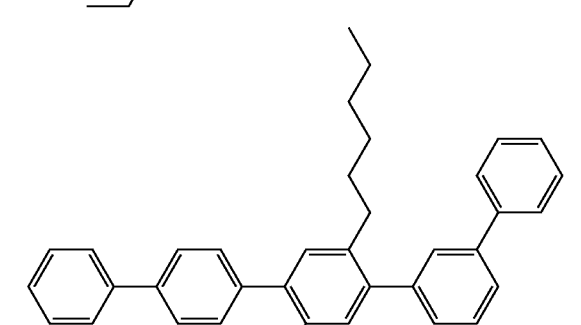
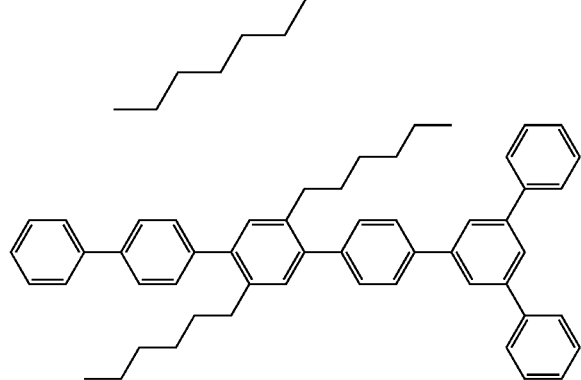

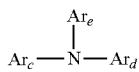

[Chemical Formula J2]

In Chemical Formula J2, $Ar_c$ to $Ar_e$ may each independently be a substituted or unsubstituted monovalent aromatic hydrocarbon group or monovalent aromatic heterocyclic group. Desirably, $Ar_c$ to $Ar_e$ may each independently be a substituted or unsubstituted phenyl group, biphenyl group, fluorenyl group, or dibenzofuranyl group. $Ar_c$ to $Ar_e$ may be the same or different from each other, but at least two of $Ar_c$ to $Ar_e$ may be the same.

Specific examples of the low molecular weight compound represented by Chemical Formula J2 may include compounds represented by Group J2. These may be used alone or may be used as a mixture of 2 or more types.

[Group J2]

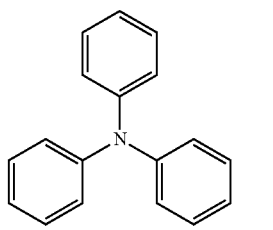
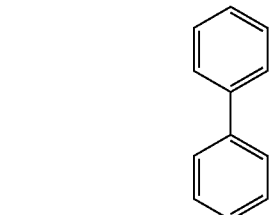
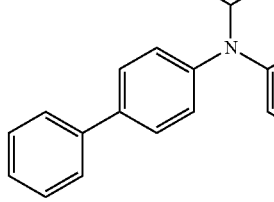
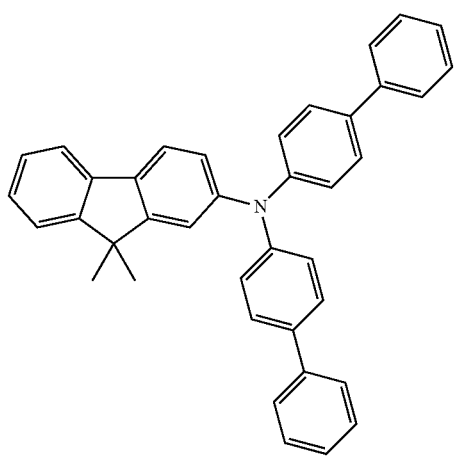

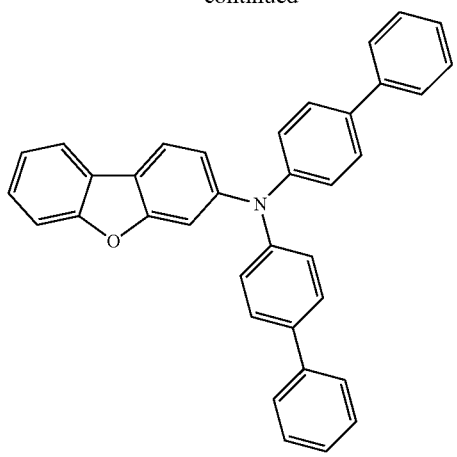

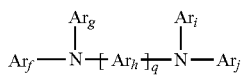

[Chemical Formula J3]

In Chemical Formula J3, $Ar_f$, $Ar_g$, $Ar_i$, and $Ar_j$ may each independently be a substituted or unsubstituted monovalent aromatic hydrocarbon group or monovalent aromatic heterocyclic group. Desirably, $Ar_f$, $Ar_g$, $Ar_i$, and $Ar_j$ may each independently be a substituted or unsubstituted phenyl group, biphenyl group, or fluorenyl group. $Ar_f$, $Ar_g$, $Ar_i$, and $Ar_j$ may be combined with each other to form a ring.

In Chemical Formula J3, $Ar_h$ may be a substituted or unsubstituted divalent aromatic hydrocarbon group or divalent aromatic heterocyclic group. Desirably, $Ar_h$ may be a phenylene group. $Ar_h$ may be combined with $Ar_f$, $Ar_g$, $Ar_i$, and $Ar_j$ to form a ring. In Chemical Formula J3, q is an integer of greater than or equal to 1 and less than or equal to 10, and desirably of greater than or equal to 2 and less than or equal to 5.

Specific examples of the low molecular weight compound represented by Chemical Formula J3 may include compounds represented by Group J3. These may be used alone or may be used as a mixture of 2 or more types.

[Group J3]

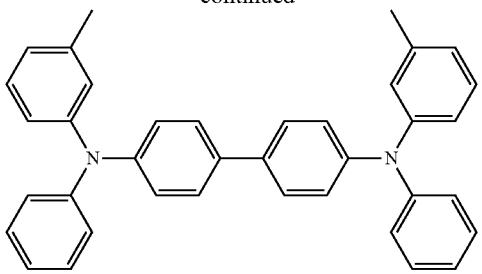

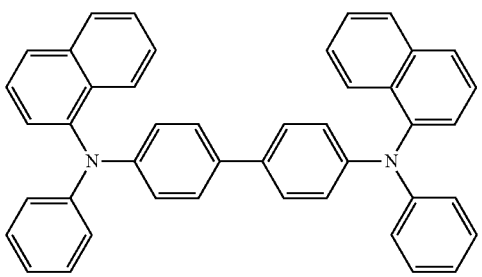

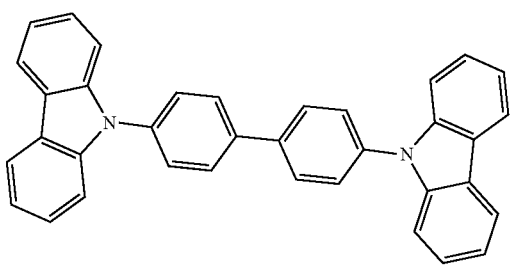

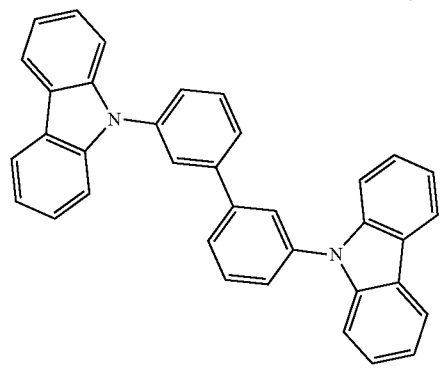

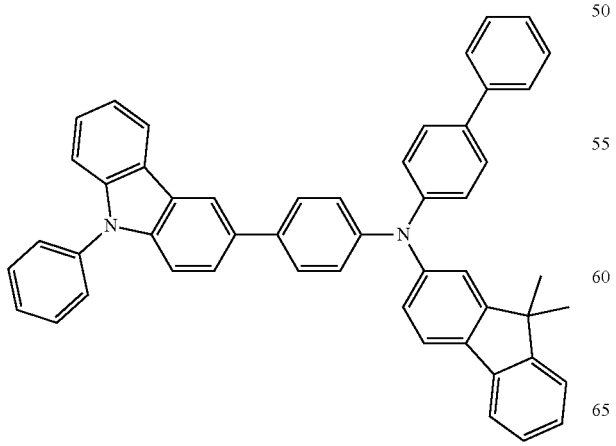

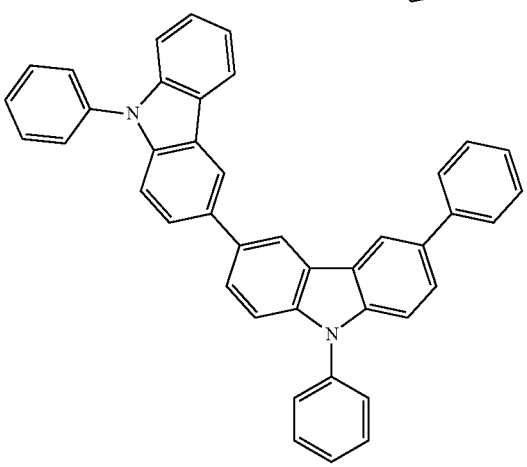

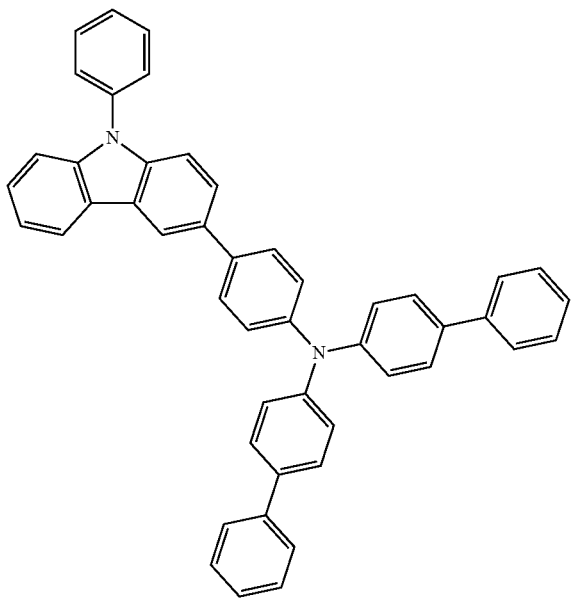

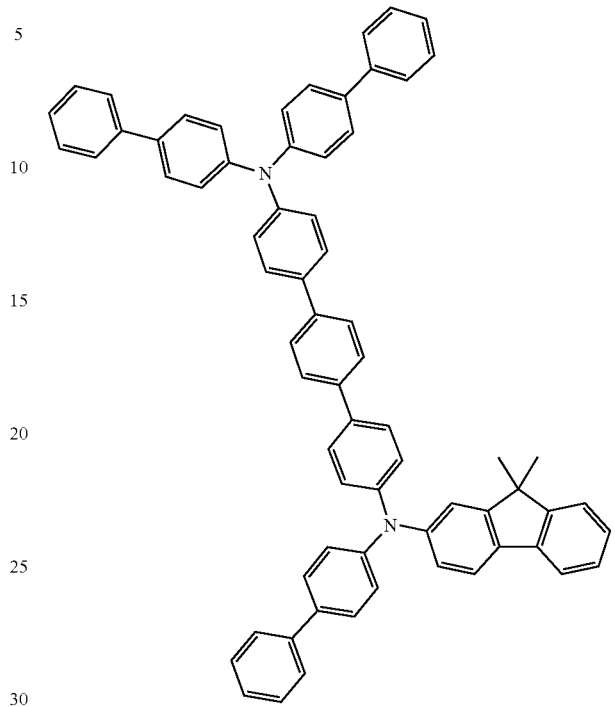

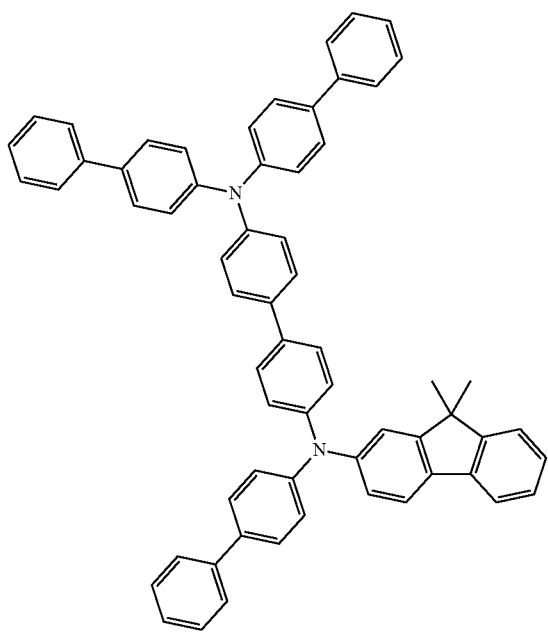

As the low molecular weight compound, a low molecular weight material described in, for example, Japanese Patent Laid-Open No. 2020-107866 may be appropriately used in addition to the compounds represented by Chemical Formulas J1 to J3.

When the composition incudes the low molecular weight compound, a content of the low molecular weight compound may be desirably less than or equal to about 30 wt %, more desirably, greater than or equal to about 1 wt % and less than or equal to about 30 wt %, much more desirably, greater than or equal to about 3 wt % and less than or equal to about 25 wt %, and particularly desirably, greater than or equal to about 5 wt % and less than or equal to about 20 wt % based on 100 wt % of a solid content of the composition. When the content of the low molecular weight compound is less than or equal to about 30 wt %, a sufficient residual film rate may be maintained. When the content of the low molecular weight compound is greater than or equal to about 1 wt %, the viscosity reduction effect due to the low molecular weight compound may be further exhibited.

Polymer Compound

The polymer compounds are not particularly limited as long as the molecular weight exceeds about 10000 g/mole. According to an embodiment, the polymer compound may include a structural unit represented by Chemical Formula 6.

[Chemical Formula 6]

$$\pmb{\{}A\text{—}B\pmb{\}}_n$$

In Chemical Formula 6, A may be a group of Group 6A.
[Group 6A]
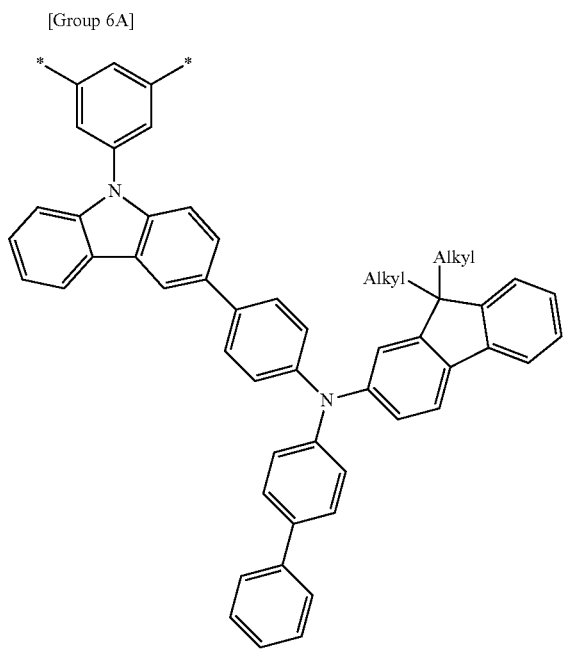
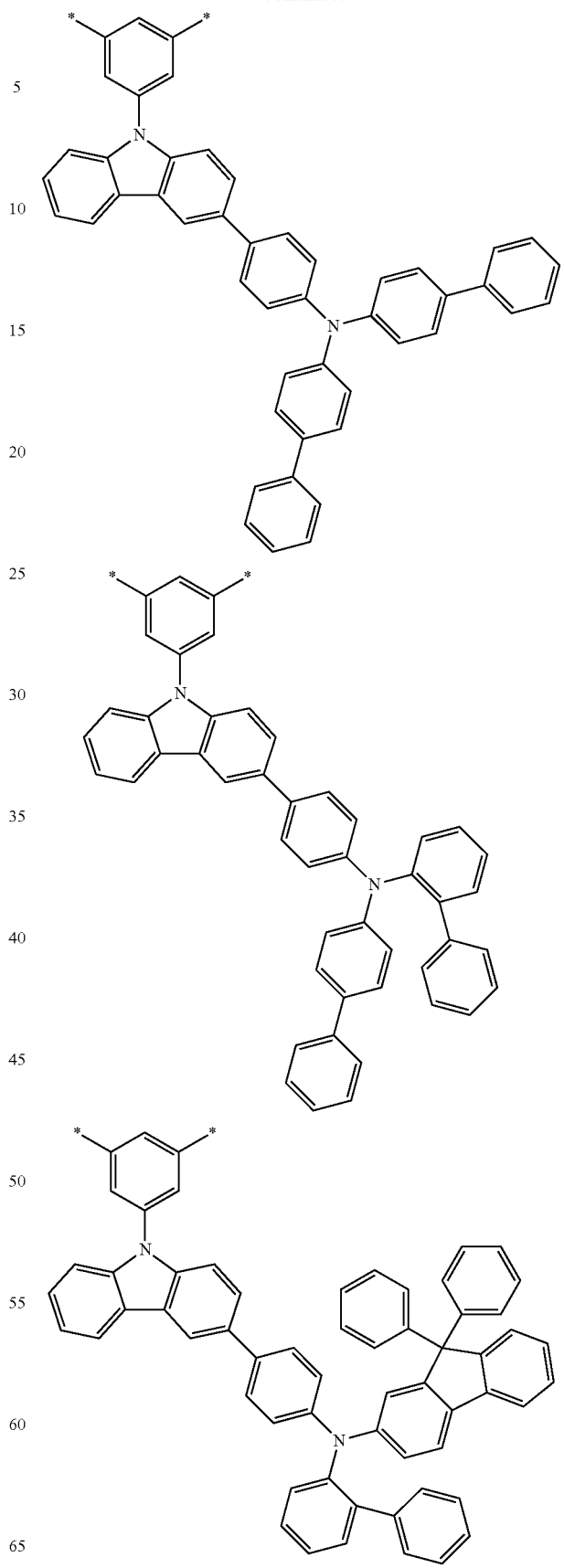

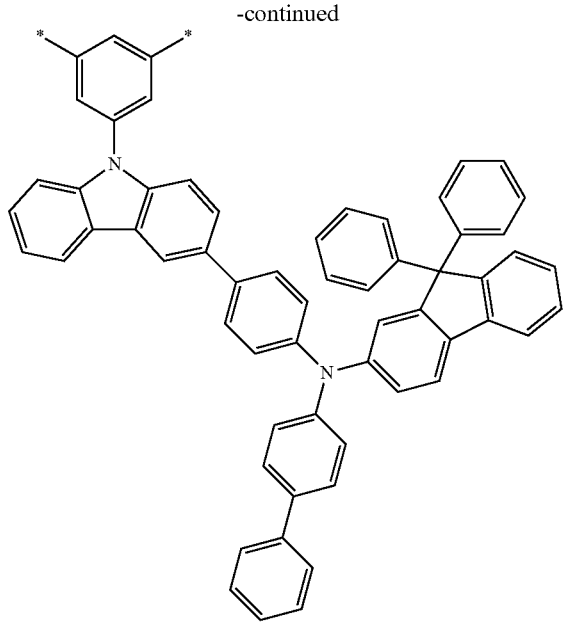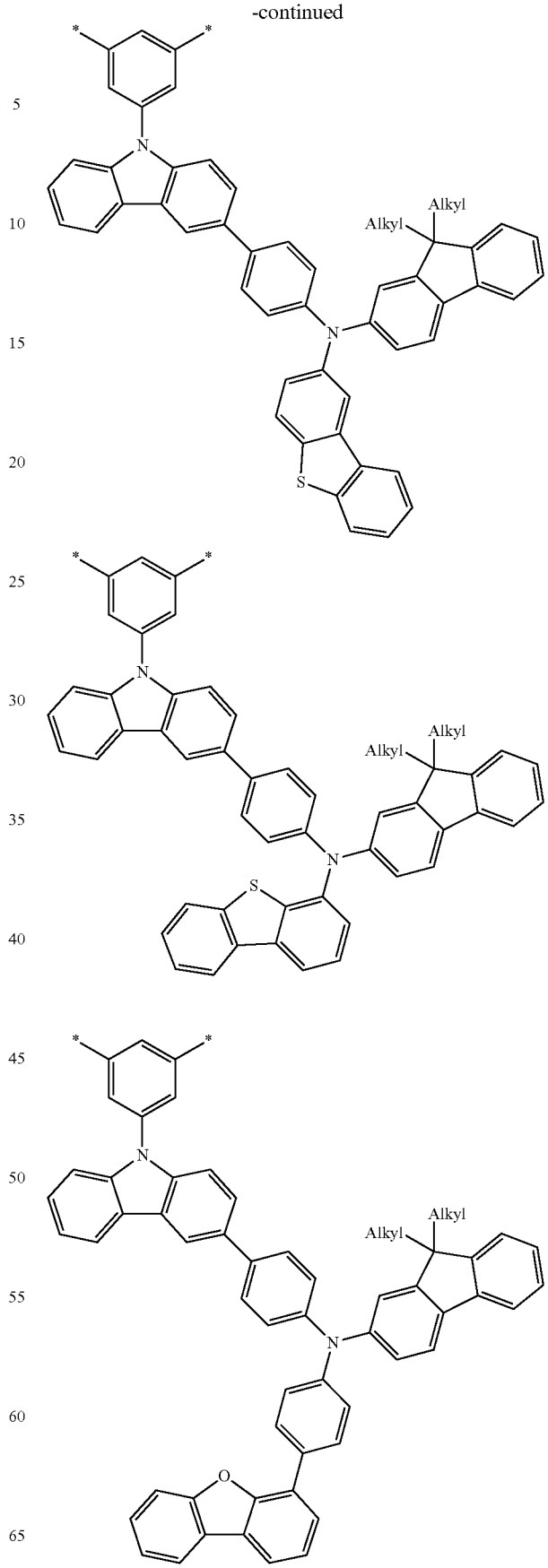

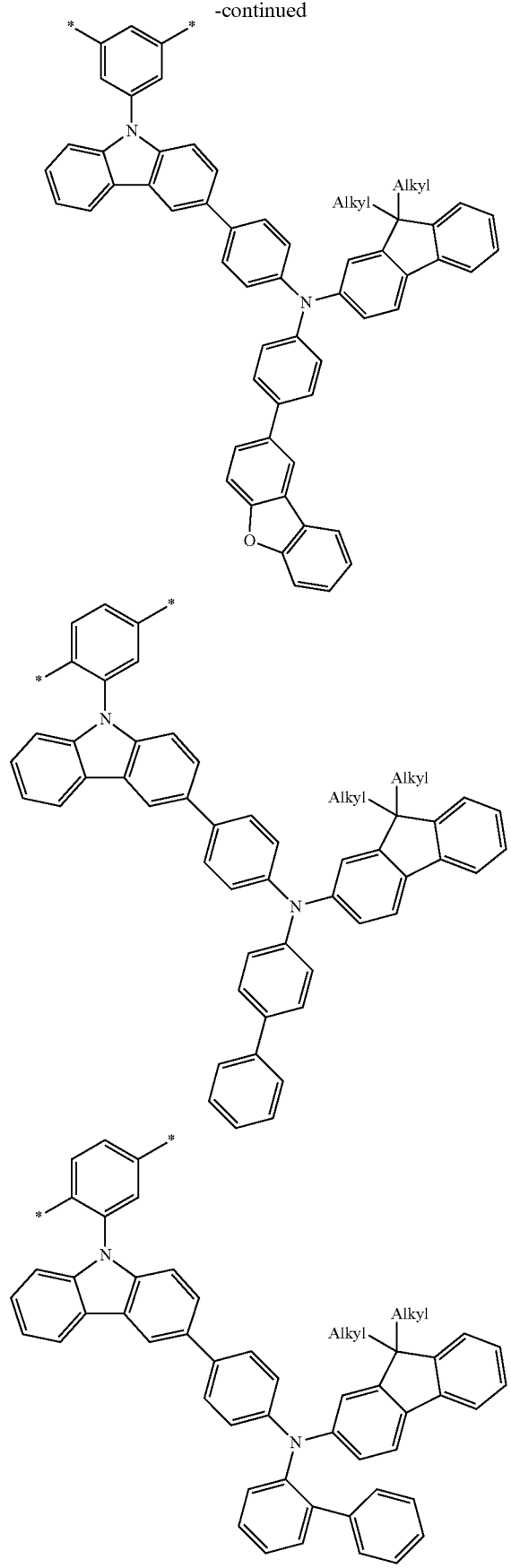
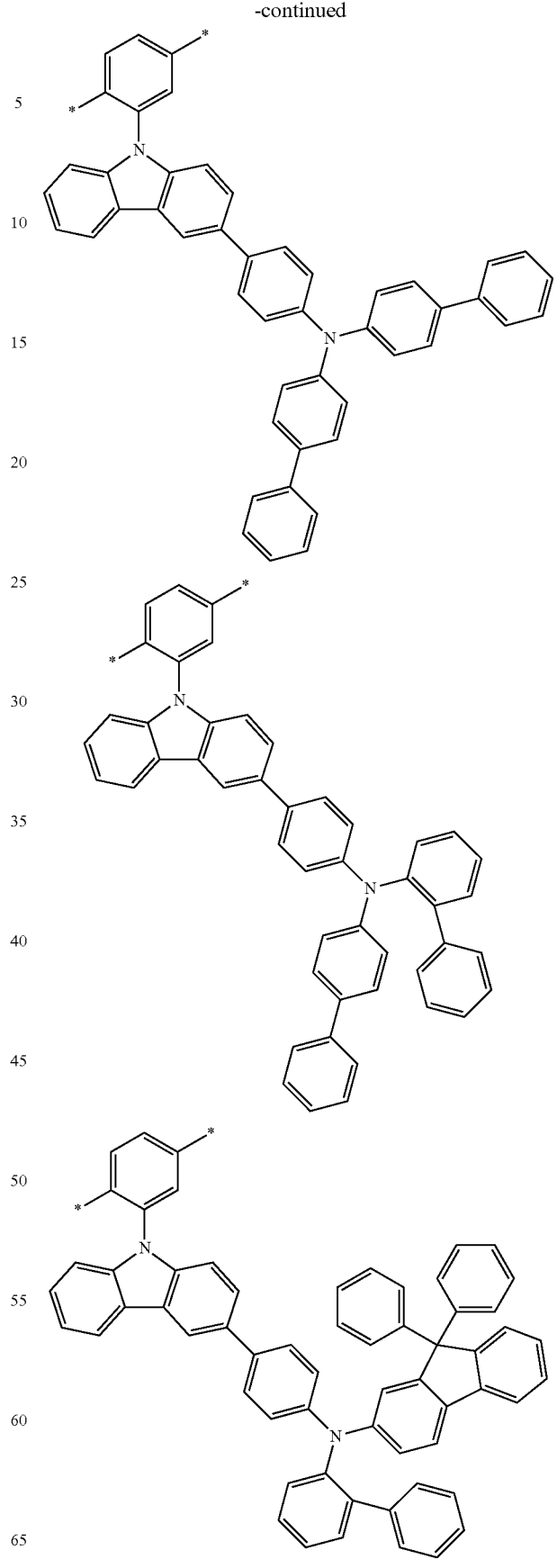

37
-continued
38
-continued
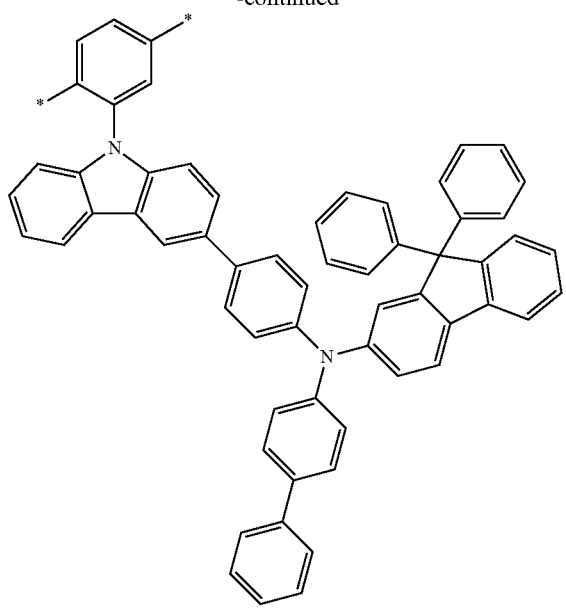
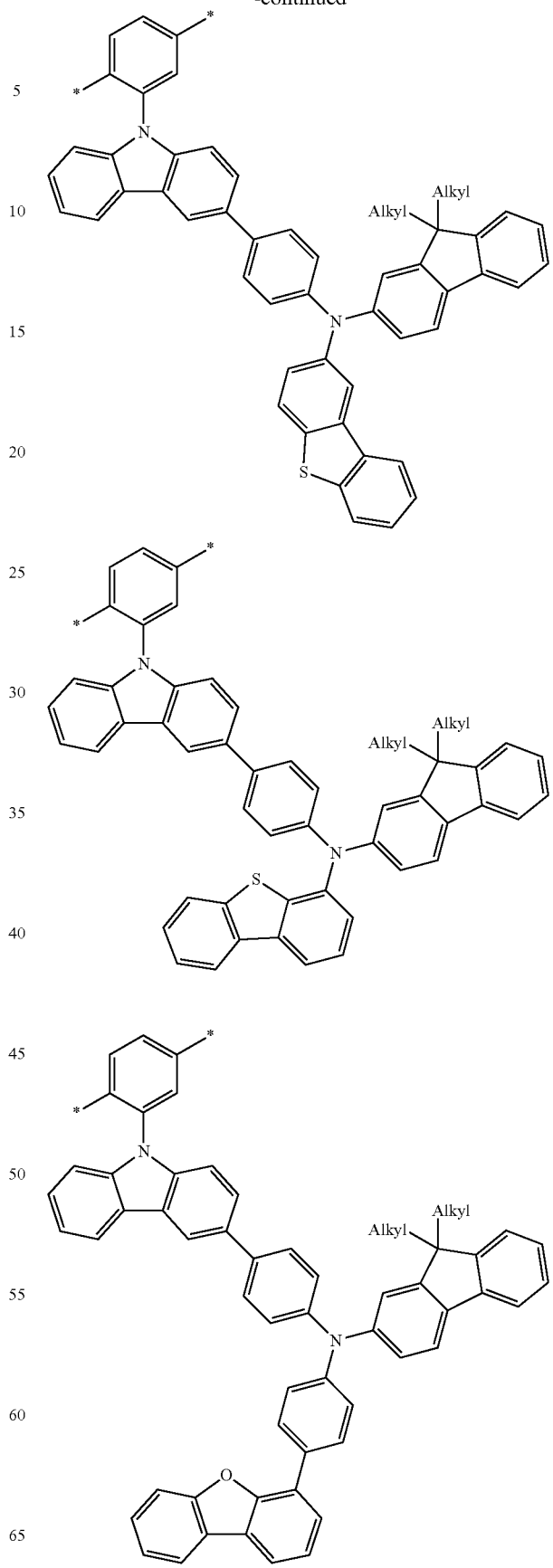

39
-continued
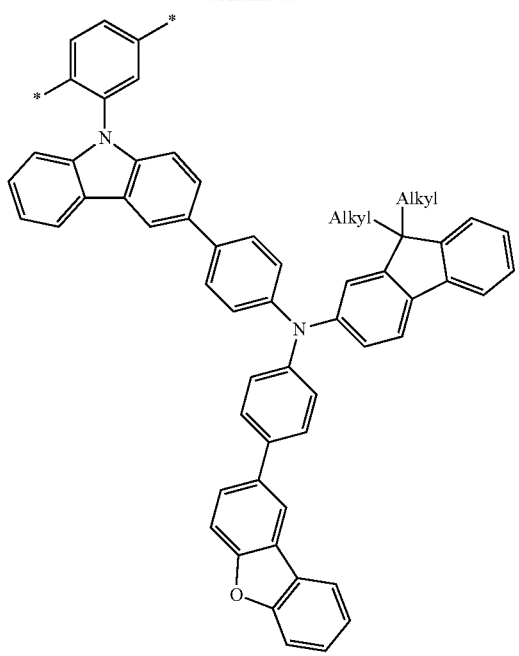
40
-continued
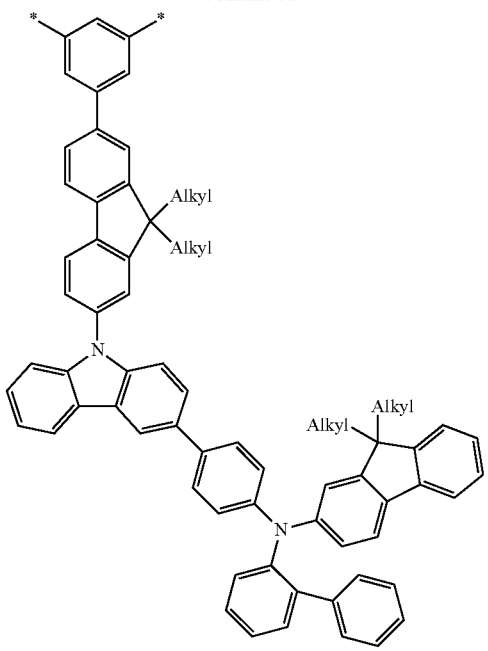
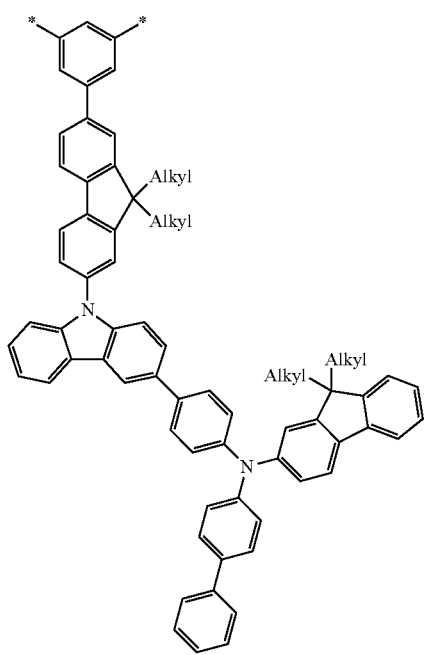
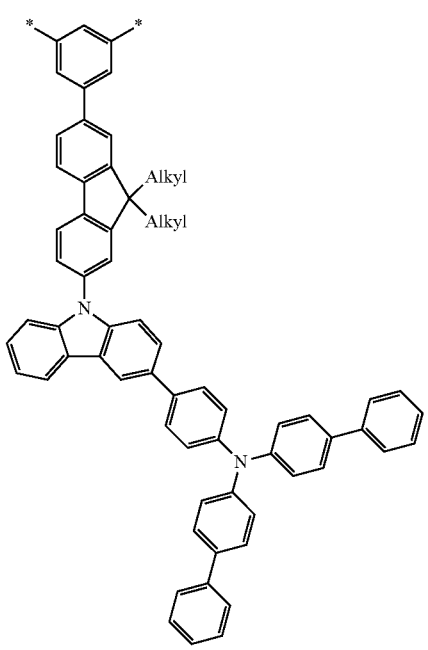

41
-continued
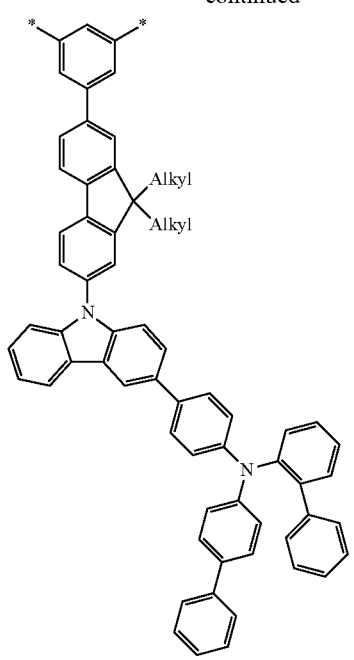
42
-continued
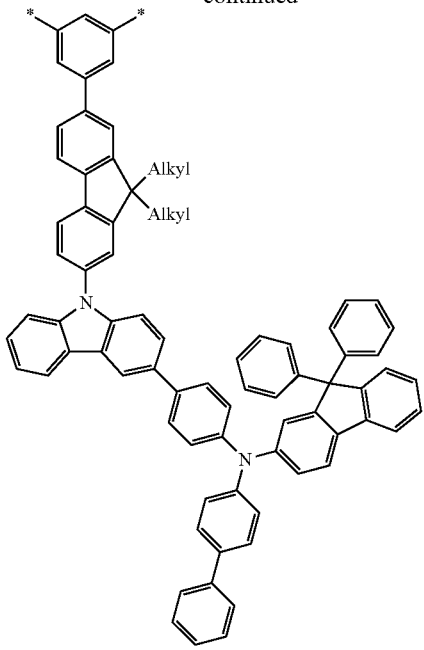
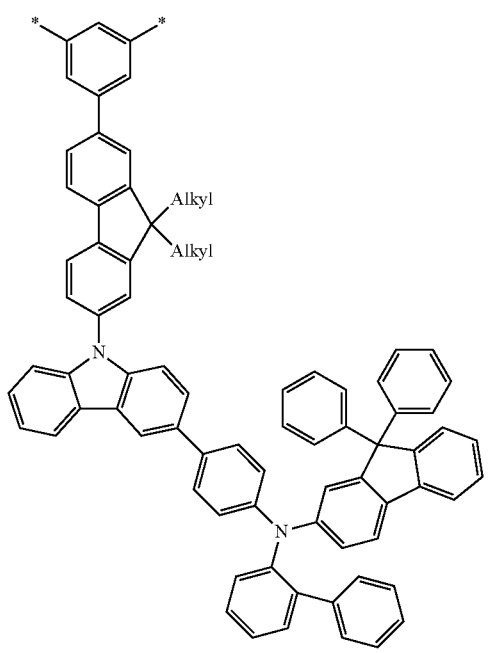
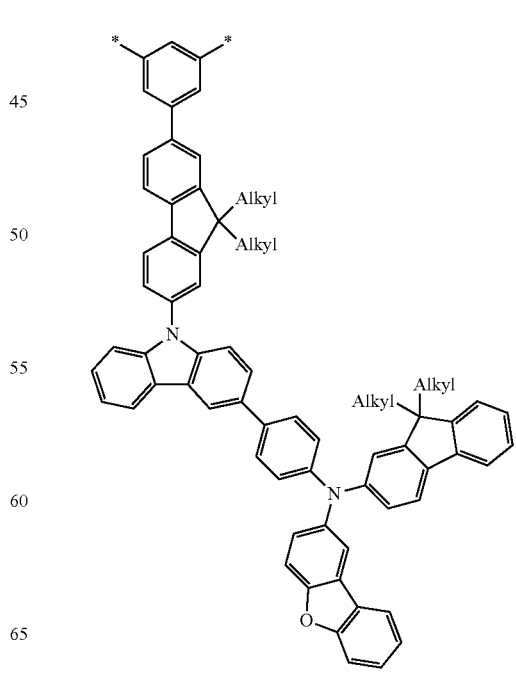

43
-continued
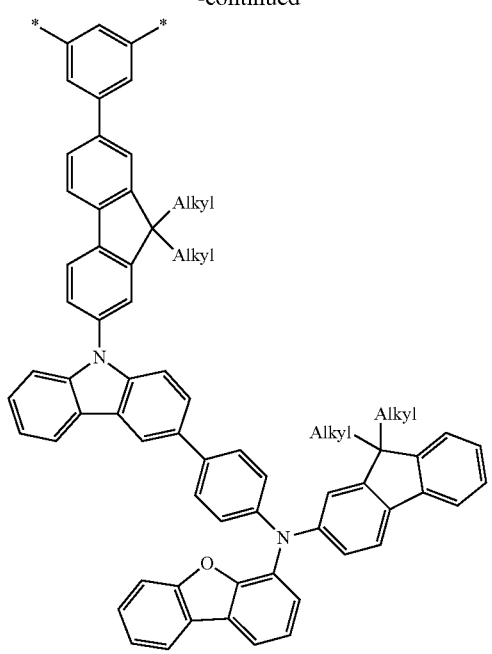
44
-continued
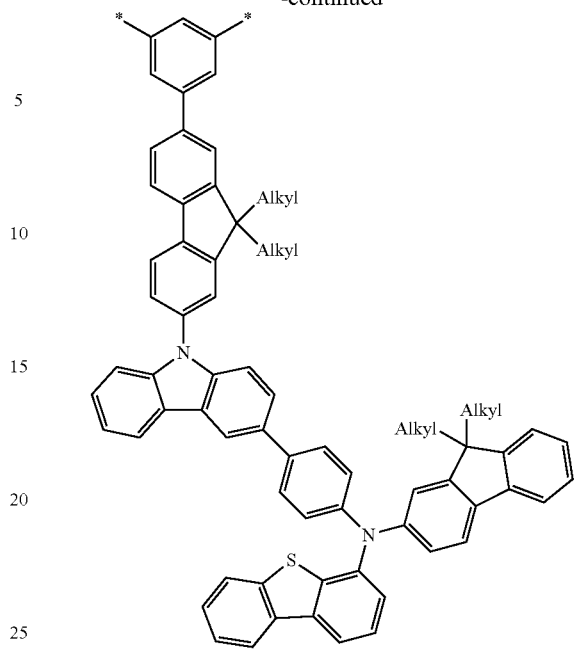
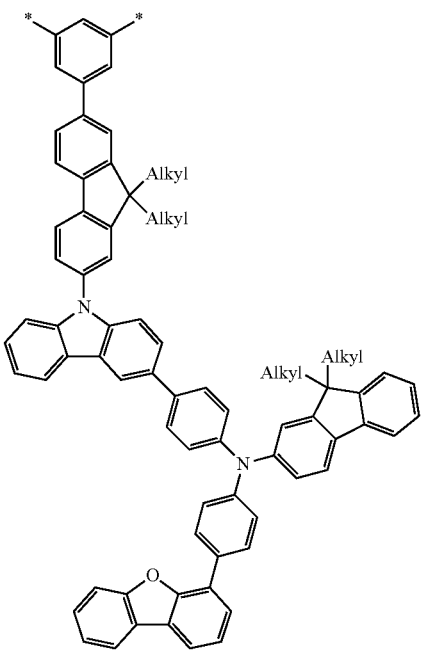

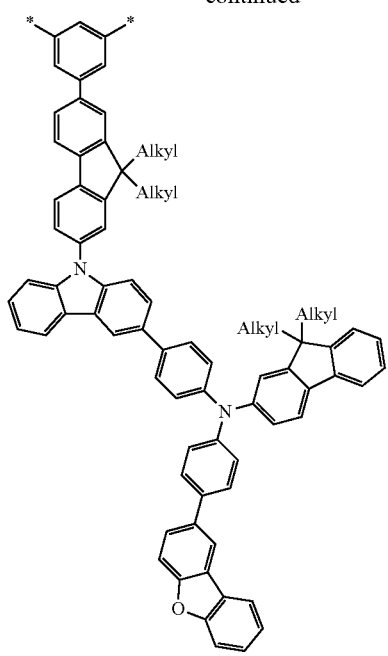
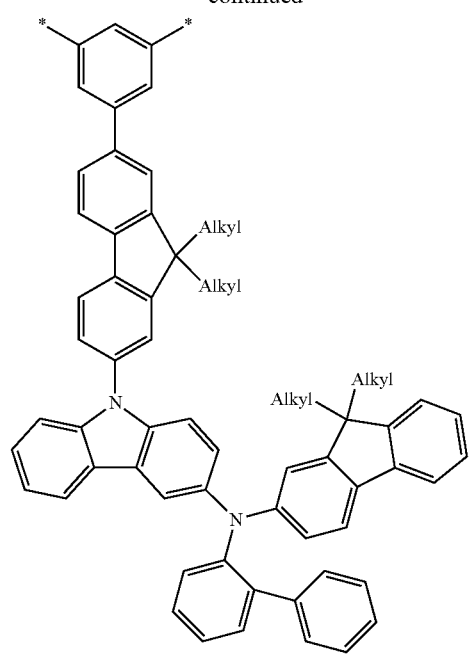
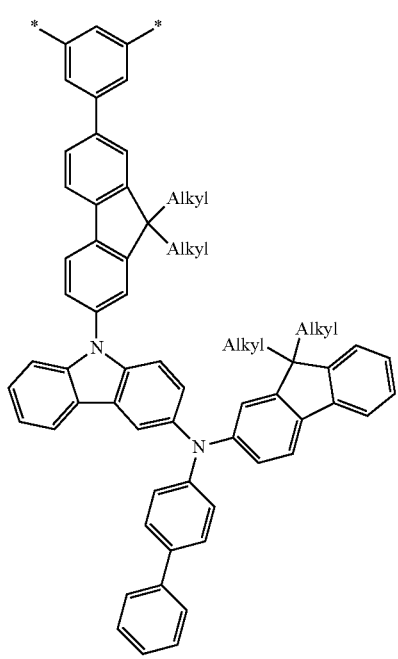
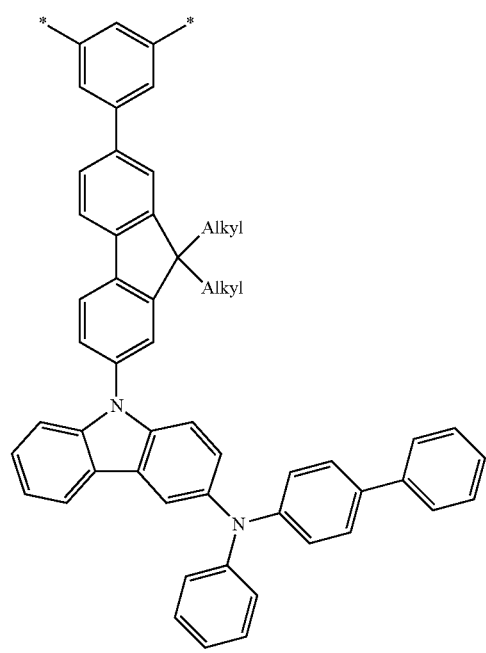

-continued

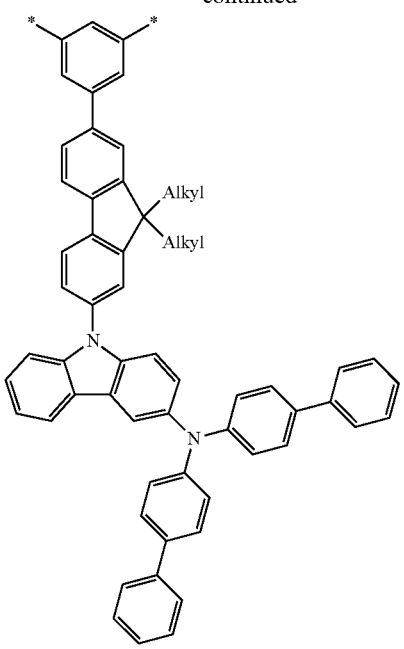

-continued

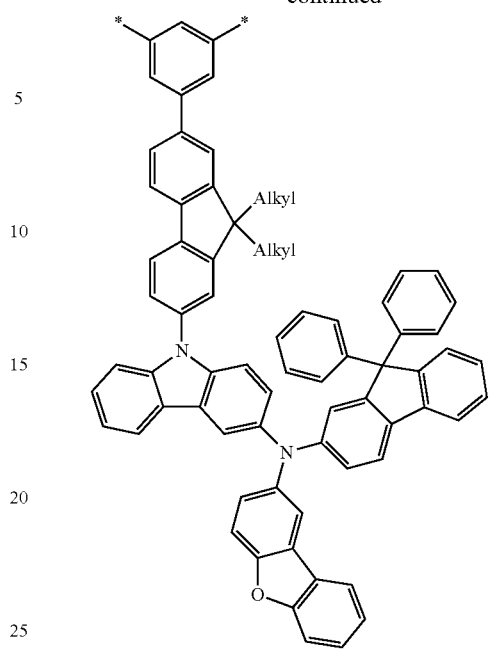

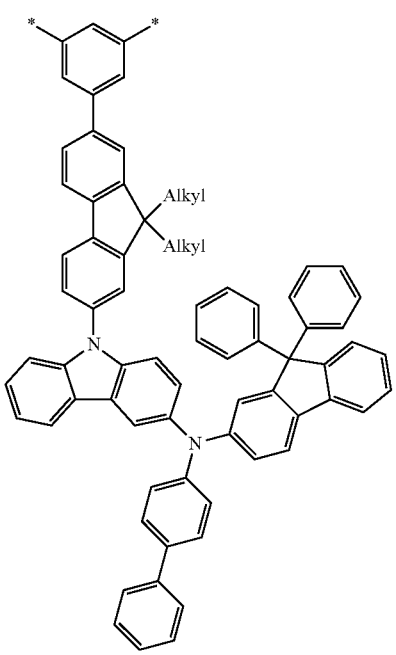

In Group 6A, * indicates a binding site, and "Alkyl" indicates substituted or unsubstituted in an alkyl group.

The alkyl group may be a linear or branched alkyl group having 1 to 20 carbon atoms, and may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, an 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyi group, an n-tridecyi group, an n-tetradecyl group, an n-pentadecyl group, an n-hexadecyl group, an n-heptadecyl group, an n-octadecyl group, or an n-eicosyl group.

In Chemical Formula 6, B may be a group of Group 6B.

[Group 6B]

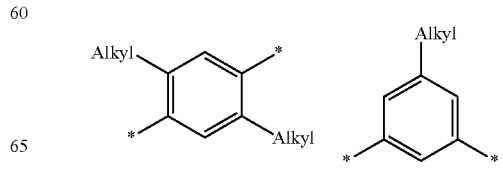

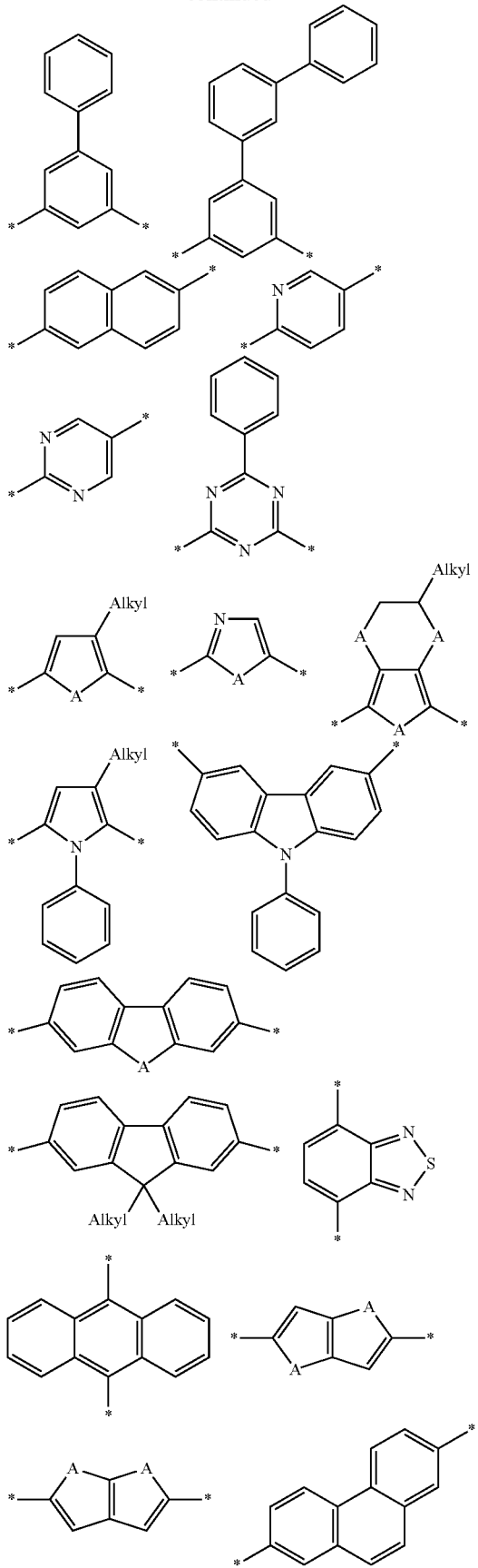

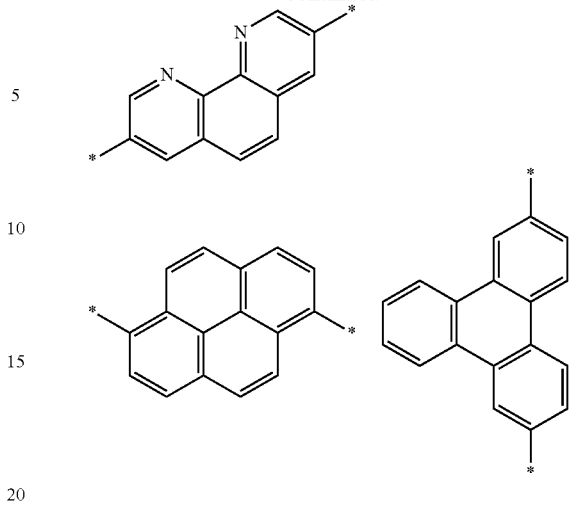

In Group 6B, A may be O, S, or Se. In Chemical Formula 6, when a plurality of B's are present, the plurality of B's may be the same or different. In addition, * indicates a binding site, and "Alkyl" indicates unsubstituted or substituted with an alkyl group. The alkyl group may be the same as that described for A.

Specifically, the polymer compounds including the structural unit represented by Chemical Formula 6 may include the following structural units represented by Chemical Formula 6-1.

[Chemical Formula 6-1]

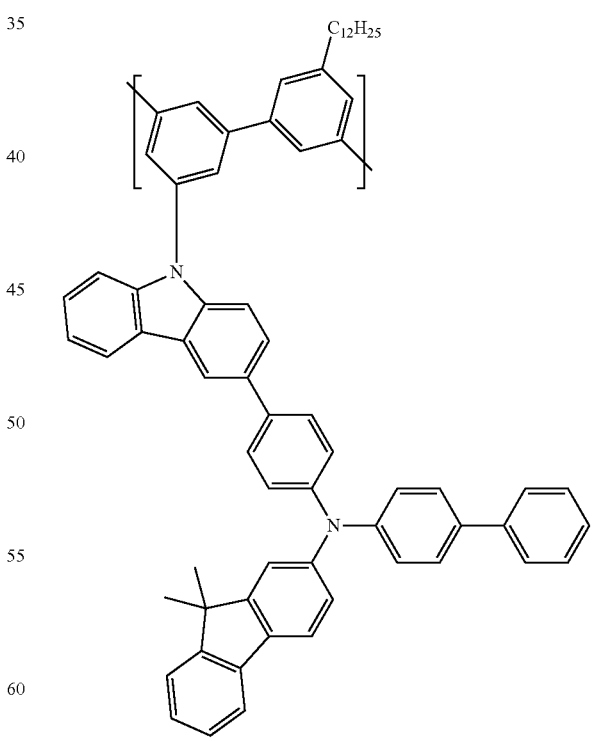

The aforementioned polymer compounds, in addition to the compound including the structural unit represented by Chemical Formula 6, may be, for example, poly[(9,9-dioctylfluorenyl-2,7-diyl)-co-(4,4)'-(N-(4-sec-butylphenyl)diphenylamine)] (TFB) or a polymer material described in Japanese Patent Laid-Open Publication No. 2020-107866.

When the composition includes the polymer compounds, a content of the polymer compounds may be desirably less than or equal to 60 wt %, more desirably, greater than or equal to 1 wt % and less than or equal to 60 wt %, much more desirably, greater than or equal to 1 wt % and less than or equal to 30 wt %, and particularly desirably, greater than or equal to 5 wt % and less than or equal to 20 wt % based on 100 wt % of the solid content of the composition. When the content of the polymer compounds is less than or equal to about 60 wt %, the viscosity reduction effect of an ink due to the aforementioned compounds may be inadequate. When the content of the polymer compounds is greater than or equal to 1 wt %, the residual film rate-improving effect due to the polymer compounds may be obtained.

Liquid Composition

The compounds or compositions according to an embodiment (hereinafter, referred to be as "compounds/compositions") have low viscosity, when prepared as a solution, and thus may be desirably used as an ink for inkjet printing. In other words, according to an embodiment, a liquid composition including the aforementioned compounds or compositions and a solvent (hereinafter, referred to as a "liquid composition") is provided.

Solvent

In the liquid composition, the solvent is not particularly limited. However, in consideration solubility of the aforementioned compound/composition, the solvent may be desirably at least one selected from a benzene ring-containing compound, a condensed ring-containing compound (however, excluding those containing a benzene ring), a heterocyclic compound (however, excluding those containing a benzene ring and/or a condensed ring), an ester compound (however, excluding those containing a benzene ring, a condensed ring, and/or a heterocycle), an ether compound (however, excluding those containing a benzene ring, a condensed ring, a heterocycle, and/or an ester group) and more desirably, a benzene ring-containing compound.

According to an embodiment, viscosity of the solvent may be desirably about 1 mPa·s to about 10 mPa·s, more desirably, about 3 mPa·s to about 7 mPa·s, and more desirably, about 3 mPa·s to about 6 mPa·s. In addition, in the present specification, the viscosity of the solvent may be measured with a rheometer (made by Anton-Paar GmbH) at 25° C. Examples of the solvent may include 3-phenoxytoluene (viscosity: 4.4 mPa·s), methyl benzoate (viscosity: 2.3 mPa·s), methyl benzoate (viscosity: 2.0 mPa·s), methyl benzoate (viscosity: 8.5 mPa·s), dichlorobenzene (viscosity: 1.32 mPa·s), and a mixed solvent thereof. These solvents may be used to much reduce viscosity of a liquid composition, so that the liquid composition may be desirably used as an ink for inkjet printing.

In the liquid composition according to an embodiment, a concentration of the aforementioned compound/composition is not particularly limited but desirably greater than or equal to about 0.1 wt % and less than or equal to about 10 wt %, more desirably greater than or equal to about 0.2 wt % and less than or equal to about 5 wt %, and much more desirably greater than or equal to about 0.5 wt % and less than or equal to about 3 wt % based on the total amount of the liquid composition. When the concentration is greater than or equal to about 0.1 wt %, a wet method may be adopted to coat a sufficient amount of the compound or composition. When the concentration is less than or equal to about 10 wt %, the viscosity of the liquid composition is not increased so high but desirably used as an ink for inkjet printing.

The viscosity of the liquid composition may be desirably less than or equal to about 10 mPa·s, more desirably greater than or equal to about 0.1 mPa·s and less than or equal to about 10 mPa·s, more desirably greater than or equal to about 1 mPa·s and less than or equal to about 8 mPa·s, and much more desirably greater than or equal to about 2 mPa·s and less than or equal to about 7 mPa·s. When the viscosity is less than or equal to about 10 mPa·s, the composition may be desirably used as an ink for inkjet printing.

Electroluminescent Device Material

The compound/composition according to an embodiment may provide an electroluminescent device having excellent luminous efficiency and durability (particularly luminescence life-span). In addition, the compound/composition has low viscosity when prepared as a solution and high solvent resistance when formed into a film, providing a film by inkjet printing. Accordingly, higher image quality, a larger screen, higher manufacturing efficiency, and a lower cost of electroluminescent devices may be achieved. An embodiment provides an electroluminescent device material including the aforementioned compounds or compositions.

Alternatively, uses of the electroluminescent device material of the aforementioned compounds or compositions are provided.

Electroluminescent Device

As described above, the compounds or compositions may be suitably used for an electroluminescent device. According to an embodiment, an electroluminescent device includes a first electrode, a second electrode, and at least one organic layer between the first electrode and the second electrode, wherein at least one layer of the organic layers includes the aforementioned compounds or compositions. Such an electroluminescent device may exhibit improved luminous efficiency and durability (particularly luminescence life-span).

In addition, the aforementioned compound/composition may have an improved hole injection property and hole mobility. Therefore, it can be suitably used for formation of any organic layer, such as a hole injecting material, a hole transporting material, or a light emitting material (host). Among them, from the viewpoint of hole transporting properties, it may be used as a hole injecting material or a hole transporting material, and desirably a hole transporting material.

Hereinafter, referring to FIG. 1, an electroluminescent device according to the present embodiment is described in detail. FIG. 1 is a schematic view showing an electroluminescent device according to the present embodiment. In addition, in this specification, an "electroluminescent device" may be abbreviated as "EL device."

As shown in FIG. 1, the EL device 100 according to the present embodiment includes a substrate 110, a first electrode 120 on the substrate 110, a hole injection layer 130 on the first electrode 120, a hole transport layer 140 on the hole injection layer 130, a light emitting layer 150 on hole transport layer 140, an electron transport layer 160 on the light emitting layer 150, an electron injection layer 170 on the electron transport layer 160, and a second electrode 180 on the electron injection layer 170.

Herein, the compound/composition according to the present embodiment is included in, for example, any one organic layer (organic film) disposed between the first electrode 120 and the second electrode 180. Specifically, the compound/composition may be included in the hole injection layer 130 as a hole injection material, in the hole transport layer 140 as a hole transport material, or in the light emitting layer 150 as a light emitting material (host). The compound/composition may be included in the hole injection layer 130 as a hole injection material or in the hole transport layer 140 as a hole transport material. The compound/composition may be included in the hole transport layer 140 as a hole transport material. That is, in an embodiment, the organic layer including the compound/composition may be a hole transport layer, a hole injection layer, or a light emitting layer. In an embodiment, the organic layer including the compounds/compositions may be a hole transport layer or a hole injection layer. In an embodiment, the organic layer including the compounds/compositions may be a hole transport layer.

In addition, the organic layer including the compound/composition may be formed by a coating method (solution coating method). Specifically, the organic layer may be formed by a solution coating method such as a spin coating method, a casting method, a micro gravure coating method, a gravure coating method, a bar coating method, a roll coating method, a wire bar coating method, a dip coating method, a spray coating method, a screen-printing method, a flexographic printing method, an offset printing method, an inkjet printing method, and the like.

As the solvent used in the solution coating method, any solvent may be used as long as it is capable of dissolving the compounds/compositions, and the solvent may be appropriately selected according to types of the compounds/compositions. For example, the solvent may be toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of coating, a concentration of the compound/composition may desirably be greater than or equal to about 0.1 wt % and less than or equal to about 10 wt %, or greater than or equal to about 0.5 wt % and less than or equal to about 5 wt %.

In addition, the film-formation method of layers other than the organic layer including the compounds/compositions is not specifically limited. The layers other than the organic layer including the compounds/compositions according to the present embodiment may be formed by, for example, a vacuum deposition method or may be formed by a solution coating method.

The substrate 110 may be a substrate used in a general EL device. For example, the substrate 110 may be a semiconductor substrate such as a glass substrate, a silicon substrate, and the like, or a transparent plastic substrate.

On the substrate 110, the first electrode 120 is formed. The first electrode 120 is specifically an anode, and is formed by a material having a large work function among a metal, an alloy, or a conductive compound. For example, the first electrode 120 may be formed as a transmissive electrode by indium tin oxide ($In_2O_3$—$SnO_2$:ITO), indium zinc oxide ($In_2O_3$—ZnO), tin oxide ($SnO_2$), zinc oxide (ZnO) or the like due to improved transparency and conductivity. The first electrode 120 may be formed as a reflective electrode by laminating magnesium (Mg), aluminum (Al), or the like on the transparent conductive layer. After forming the first electrode 120 on the substrate 110, washing and UV-ozone treatment may be performed as necessary.

On the first electrode 120, the hole injection layer 130 is formed. The hole injection layer 130 is a layer that facilitates injection of holes from the first electrode 120, and may be formed to have a thickness (dry film thickness; the same below) of specifically greater than or equal to about 10 nm and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl) borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4''-tris(3-methylphenylphenylamino)triphenylamine (m-MTDATA), N,N'-di(1-naphthyl)-N,N'-diphenylbenzidine. (NPB), 4,4',4''-tris(diphenylamino)triphenylamine (TDATA), 4,4',4''-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), and polyaniline/10-camphorsulfonic acid, and the like.

On the hole injection layer 130, the hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be formed by a solution coating method using the compound/composition according to the present embodiment. According to this method, the durability (luminescence life-span) of the EL device 100 may be extended. In addition, the performance (luminous efficiency) of the EL device 100 may be improved. In addition, since the hole transport layer may be formed by the solution coating method, a large area may be formed efficiently.

However, when one organic layer of the EL device 100 includes the compound/composition according to the present embodiment, the hole transport layer 140 may be formed from a known hole transport material.

The known hole transport material may include, for example, 1,1-bis[(di-4-tolylamino)phenyl]cyclohexane (TAPC), a carbazole derivative such as N-phenylcarbazole, polyvinylcarbazole, and the like, N,N'-bis(3-methylphenyl)-N, N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine (NPB).

On the hole transport layer 140, the light emitting layer 150 is formed. The light emitting layer 150 is a layer that emits light by fluorescence, phosphorescence, and the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. As the light emitting material of the light emitting layer 150 may include a known light emitting material. However, the light emitting material included in the light emitting layer 150 is desirably a light emitting material capable of emitting light (i.e., phosphorescence emission) from triplet excitons. In such a case, the driving life-span of the EL device 100 may be further improved.

The light emitting layer 150 is not particularly limited and may have a known configuration. In an embodiment, the light emitting layer may include a semiconductor nanoparticle or an organometallic complex. That is, in an embodiment of the present disclosure, the organic layer has a light emitting layer including semiconductor nanoparticles or organometallic complexes.

When the light emitting layer includes semiconductor nanoparticles, the EL device may be a quantum dot electroluminescent device (QLED) or a quantum dot light emitting diode. In addition, when the light emitting layer includes an organometallic complex, the EL device is an organic electroluminescent device (OLED).

In the form in which the light emitting layer includes semiconductor nanoparticles (QLED), the light emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light emitting layer may be synthesized by a wet chemical process, an organometallic chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light emitting layer (quantum dot light emitting layer). Thus, a plurality of differently sized quantum dots may embody a display that discharge's (or emits) light of multiple wavelengths. The sizes of the quantum dots may be selected to emit red, green, and blue light to form a color display.

In addition, the sizes of the quantum dots may be combined so that various color lights emit white light.

The semiconductor nanoparticles (quantum dots) may be semiconductor material of a Group II-VI semiconductor compound; a Group III-V semiconductor compound; a Group IV-VI semiconductor compound; a Group IV element or compound; or a combination thereof.

The Group II-VI semiconductor compound is not particularly limited, but includes, for example, a binary compound of CdSe, CdTe, ZnS, ZnSe, ZnTe, ZnO, HgS, HgSe, HgTe, or a mixture thereof; a ternary compound CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, or a mixture thereof, or a quaternary compound of CdZnSeS, CdZnSeTe, CdZnSTe, CdHgSeS, CdHgSeTe, CdHgSTe, HgZnSeS, HgZnSeTe, HgZnSTe, or a mixture thereof; or a combination thereof.

The Group III-V semiconductor compound is not particularly limited, but includes, for example, a binary compound of GaN, GaP, GaAs, GaSb, AlN, AlP, AlAs, AlSb, InN, InP, InAs, InSb, or a mixture thereof; a ternary compound GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; or a quaternary compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The Group IV-VI semiconductor compound is not particularly limited, but includes, for example, a binary compound of SnS, SnSe, SnTe, PbS, PbSe, PbTe, or a mixture thereof; a ternary compound SnSeS, SnSeTe, SnSTe, PbSeS, PbSeTe, PbSTe, SnPbS, SnPbSe, SnPbTe, or a mixture thereof; or a quaternary compound SnPbSSe, SnPbSeTe, SnPbSTe, or a mixture thereof.

The Group IV element or compound is not particularly limited, but includes, for example, a single element compound of Si, Ge, or a mixture thereof; or a binary compound of SiC, SiGe, or a mixture thereof, or a combination thereof.

The semiconductor nanoparticles (quantum dots) may have a homogeneous single structure or a double structure of a core-shell. The core-shell may include different materials. The material constituting each core and shell may be made of different semiconductor compounds. However, an energy bandgap of the shell material is larger than an energy bandgap of the core material. Specifically, structures such as ZnTeSe/ZnSe/ZnS, InP/ZnSe/ZnS, CdSe/ZnS, InP/ZnS, and the like are desirable.

For example, a process of producing a quantum dot having a core (CdSe)·shell (ZnS) structure is described. First, crystals are formed by injecting core (CdSe) precursor materials of $(CH_3)_2Cd$ (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in the embodiment (OLED) in which the light emitting layer includes an organometallic complex, the light emitting layer 150 may include, for example 6,9-diphenyl-9'-(5'-phenyl-[1,1':3',1"-terphenyl]-3-yl)3,3'-bi[9H-carbazole], 3,9-diphenyl-5-(3-(4-phenyl-6-(5'-phenyl-[1,1':3',1"-terphenyl]-3-yl)-1,3,5,-triazin-2-yl)phenyl)-9H-carbazole, 9,9'-diphenyl-3,3'-bi[9H-carbazole], tris(8-quinolinato)aluminum $(Alq_3)$, 4,4'-bis(carbazol-9-yl)biphenyl (CBP), poly (n-vinyl carbazole (PVK), 9,10-di(naphthalene)anthracene (ADN), 4,4',4"-tris(N-carbazolyl)triphenylamine (TCTA), 1,3,5-tris(N-phenyl-benzimidazol-2-yl)benzene (TPBI), 3-tert-butyl-9,10-di(naphth-2-yl)anthracene (TBADN), distyrylarylene (DSA), 4,4'-bis(9-carbazole)-2,2'-dimethyl-bipheny (dmCBP), and the like, as a host material.

In addition, the light emitting layer 150 may include, for example, perylene and a derivative thereof, rubrene and a derivative thereof, coumarin and a derivative thereof, 4-dicyanomethylene-2-(pdimethylaminostyryl)-6-methyl-4H-pyran (DCM) and a derivative thereof, an iridium (Ir) complex such as bis[2-(4,6-difluorophenyl)pyridinate]picolinate iridium (III) (Flrpic)), bis(1-phenylisoquinoline) (acetylacetonate)iridium (III) $(Ir(piq)_2(acac))$, tris(2-phenylpyridine)iridium (III) $(Ir(ppy)_3)$, tris(2-(3-p-xylyl)phenyl)pyridine iridium (III), an osmium (Os) complex, a platinum complex, and the like, as a dopant material. Among these, it is desirable that the light emitting material is a light emitting organometallic complex compound.

A method for forming the light emitting layer is not particularly limited. It may be formed by coating (solution coating method) coating composition including a semiconductor nanoparticle or an organometallic complex. At this time, it is desirable to select a solvent which does not dissolve the materials (hole transport material, particularly the compound/composition) in the hole transport layer as the solvent constituting the coating composition.

On the light emitting layer 150, the electron transport layer 160 is formed. The electron transport layer 160 is a layer having a function of transporting electrons, and is formed using a vacuum deposition method, a spin coating method, an inkjet printing method, or the like. For example, the electron transport layer 160 may be formed to have a thickness of greater than or equal to about 15 nm and less than or equal to about 50 nm.

The electron transport layer 160 may be formed of a known electron transport material. The known electron transport material may include, for example, (8-quinolinato) lithium (lithium quinolate, Liq), tris(8-quinolinato)aluminum (Alq3) and a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene (TPBI). The electron transport material may be used alone or as a mixture of two or more thereof.

On the electron transport layer 160, the electron injection layer 170 is formed. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate, Liq) and lithium fluoride (LiF), sodium chloride (NaCl), cesium fluoride (CsF), lithium oxide ($Li_2O$), or barium oxide (BaO).

On the electron injection layer 170, the second electrode 180 is formed. The second electrode 180 is formed using a vacuum deposition method or the like. Specifically, the second electrode 180 is a cathode, and is formed by a material having a small work function such as metals, alloys, or conductive compounds. For example, the second electrode 180 is may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide ($In_2O_3$—$SnO_2$), and indium zinc oxide ($In_2O_3$—ZnO).

The EL device 100 has been described above as an example of the electroluminescent device. The EL device 100 according to the present embodiment further improves durability (luminescence life-span) by including an organic layer (particularly a hole transport layer or a hole injection layer) including the compounds/compositions. In addition, the luminous efficiency (current efficiency) may be further improved and the driving voltage may be reduced.

The stacked structure of the EL device 100 according to the present embodiment is not limited to the aforementioned embodiments. The EL device 100 according to the present embodiment may have another known stacked structure. For example, in the EL device 100, one or more layers of the hole injection layer 130, the hole transport layer 140, the electron transport layer 160 and the electron injection layer 170 may be omitted or another layer may be further included. In addition, each layer of the EL device 100 may be formed in a single layer or in a plurality of layers.

For example, the EL device 100 may further include a hole blocking layer between the hole transport layer 140 and the light emitting layer 150 in order to prevent excitons or holes from diffusing into the electron transport layer 160. The hole blocking layer may be formed by, for example, an oxadiazole derivative, a triazole derivative, or a phenanthroline derivative.

In addition, the compounds/compositions according to the present embodiment may be applied to electroluminescent devices other than the QLED or OLED. Other electroluminescent devices including the compounds/compositions according to the present embodiment may include, but are not particularly limited to, for example, organic inorganic perovskite light emitting devices.

The electroluminescent device according to the embodiment may be manufactured by inkjet printing. In other words, according to an embodiment, a method of manufacturing the electroluminescent device including a first electrode, a second electrode, and at least one organic layer disposed between the first electrode and the second electrode may include applying the aforementioned liquid composition by inkjet printing and drying the solvent to form a hole transport layer.

In addition, the manufacturing method may further include applying an ink for a light emitting layer including semiconductor nanoparticles and a solvent for a light emitting layer on the surface of the hole transport layer and drying the solvent for a light emitting layer.

Herein, the solvent for a light emitting layer may be desirably a solvent sufficiently dispersing semiconductor nanoparticles (quantum dots) but as described above, not dissolving a material of the hole transport layer (a hole transport material, particularly, a compound/composition). Specifically, the solvent for a light emitting layer may be at least one of hexane, octane, decane, tetradecane, indane, butanol, octanol, cyclohexylbenzene, dodecylbenzene, o-dichlorobenzene, the like, or any combination thereof.

The manufacturing method makes it easy to enlarge the electroluminescent device. In addition, an electroluminescent device with higher quality is provided. Furthermore, higher manufacturing efficiency and a lower cost may be achieved.

EXAMPLES

Effects of the embodiments are described using the following examples and comparative examples. However, the technical scope of the present disclosure is not limited to the following examples. On the other hand, in the following examples, unless otherwise specified, operations are performed at room temperature (25° C.). In addition, unless otherwise specified, "%" and "parts" respectively indicate "wt %" and "parts by weight".

SYNTHESIS EXAMPLES (Synthesis of Intermediate-1)

Intermediate-1 is synthesized according to Reaction Scheme 1.

[Reaction Scheme 1]

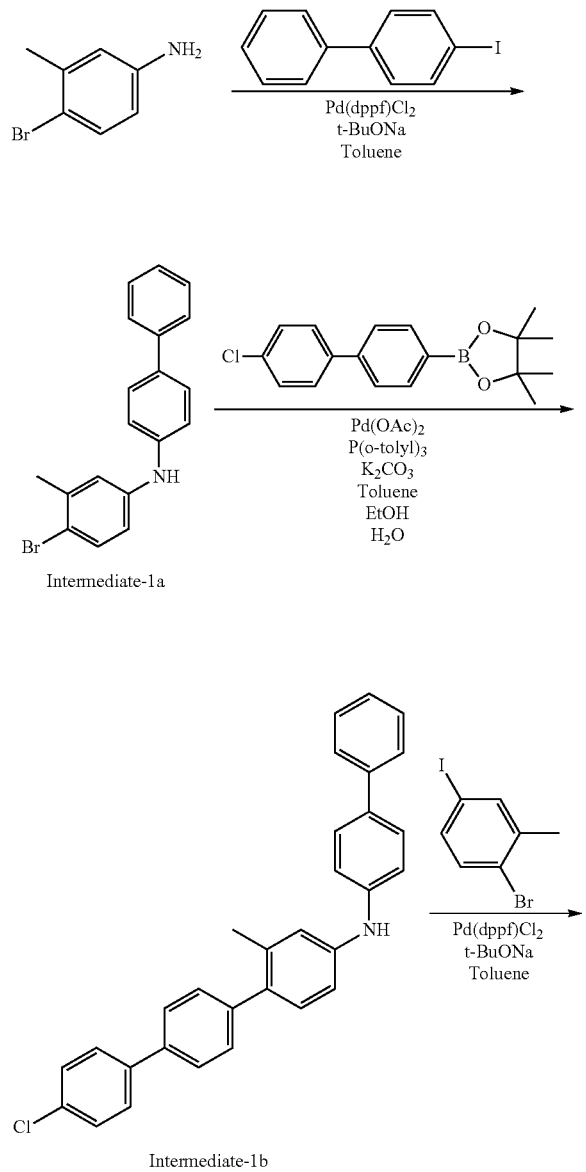

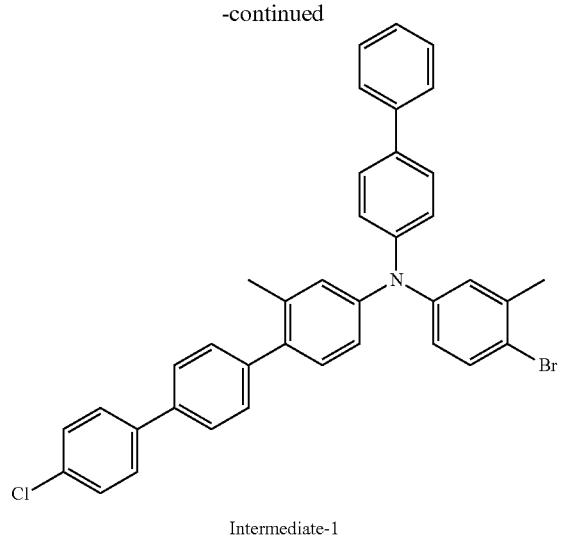

Intermediate-1

4-bromo-3-methylaniline (449 mmol, 83.5 g), 4-iodobiphenyl (427.6 mmol, 119.8 g), t-BuONa (641.4 mmol), toluene (1710 ml), and Pd(dppf)Cl₂ (21.4 mmol, 15.7 g) are placed in a 3 L-four-neck flask, and the reaction is initiated by heating and stirring at 80° C. under a nitrogen atmosphere. Thereafter, the temperature is gradually increased while confirming the progress of the reaction, and the mixture is heated and stirred at 100° C. for 5 hours.

When a reaction is completed, the reaction mixture is cooled down to room temperature and filtered through CELITE. The filtrate is filtered using a silica gel shot column to remove impurities. After concentration, recrystallization is performed three times using toluene and hexane. By vacuum drying (50° C., 16 hours), Intermediate-1a is obtained (101.8 g, Yield: 67.0%).

N-(4-bromo-3-methylphenyl)-[1,1'-biphenyl]-4-amine (170 mmol, 57.5 g), Cl biphenyl Bpin form (178.5 mmol, 56.2 g), 2M potassium carbonate aqueous solution (170 ml), toluene (340 ml) and EtOH (85 ml) are placed in a 1 L-four-neck flask, and the mixture is uniformly dissolved. Then Pd(OAc)₂ (8.5 mmol, 1.9 g) and P(o-tolyl)₃ (13.6 mmol, 4.14 g) are added, and the mixture is heated and stirred at 70° C. under a nitrogen atmosphere for 8 hours.

The reaction mixture is cooled down to room temperature, and diluted with methanol, and a solid precipitated therein is recovered through filtration. A crude product therefrom is vacuum-dried at 50° C., heated and dissolved in toluene, and then, eluted through a silica gel short column. After concentration, recrystallization is performed twice using toluene, and then the crude product is vacuum-dried (50° C., 12 hours) to obtain Intermediate-1b (59.9 g, Yield: 78.9%).

Intermediate-1b (83.2 mmol, 37.1 g) and tert-BuONa (124.85 mmol, 12.0 g) are placed in a three-neck flask, and toluene (420 ml) is added and stirred. Thereafter, 2-bromo-5-iodotoluene (91.6 mmol, 27.2 g) and Pd(dppf)Cl₂ (4.16 mmol, 3.05 g) are added, and the mixture is stirred at 120° C. under an inert atmosphere for 3 hours. The reaction mixture is cooled down to room temperature and diluted with toluene, and filtered using CELITE to remove insoluble matter.

The filtrate is washed with saturated brine, and the organic layer is dried over MgSO₄. After concentration, the crude product is purified by silica gel chromatography (hexane: toluene=7:3 volume ratio). After concentration, the reaction mixture is purified by recrystallization using ethyl acetate, toluene, and acetone. The obtained solid is vacuum-dried (50° C., 12 hours) to obtain Intermediate-1 (30.7 g, Yield: 60%).
(Synthesis of Intermediate-2)
Intermediate-2 is synthesized according to Reaction Scheme 2.
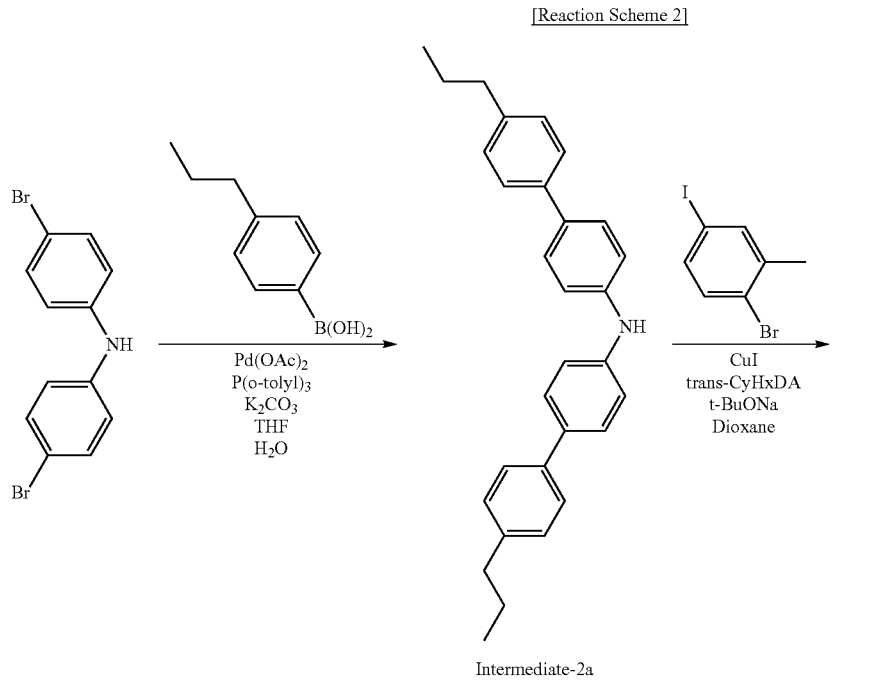
Intermediate-2a
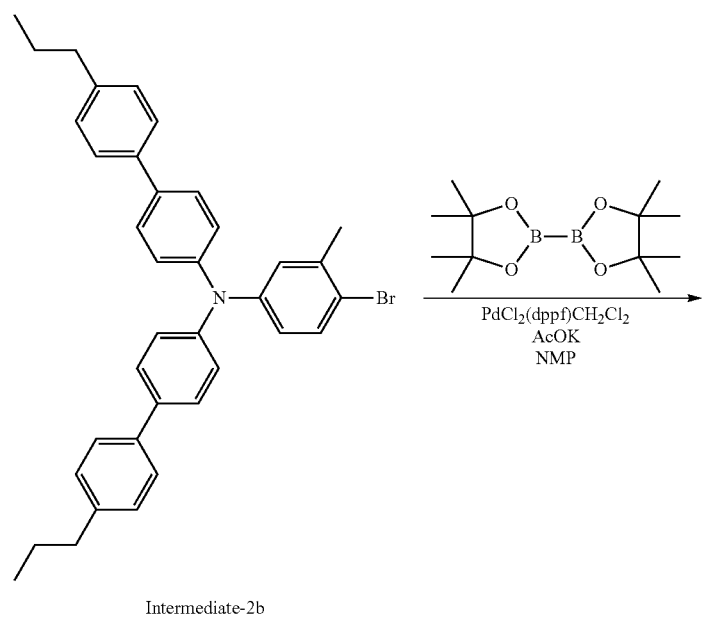
Intermediate-2b -continued
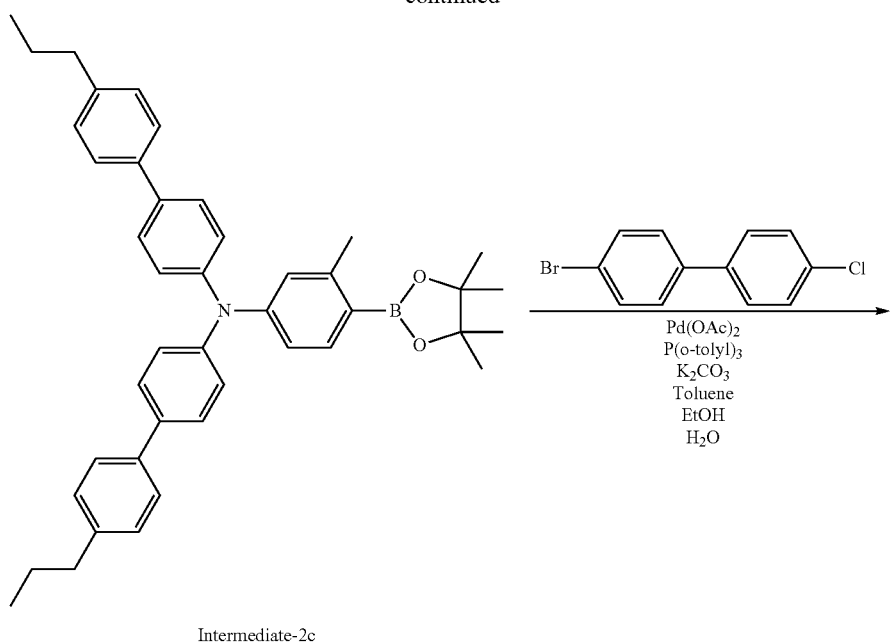
Intermediate-2c
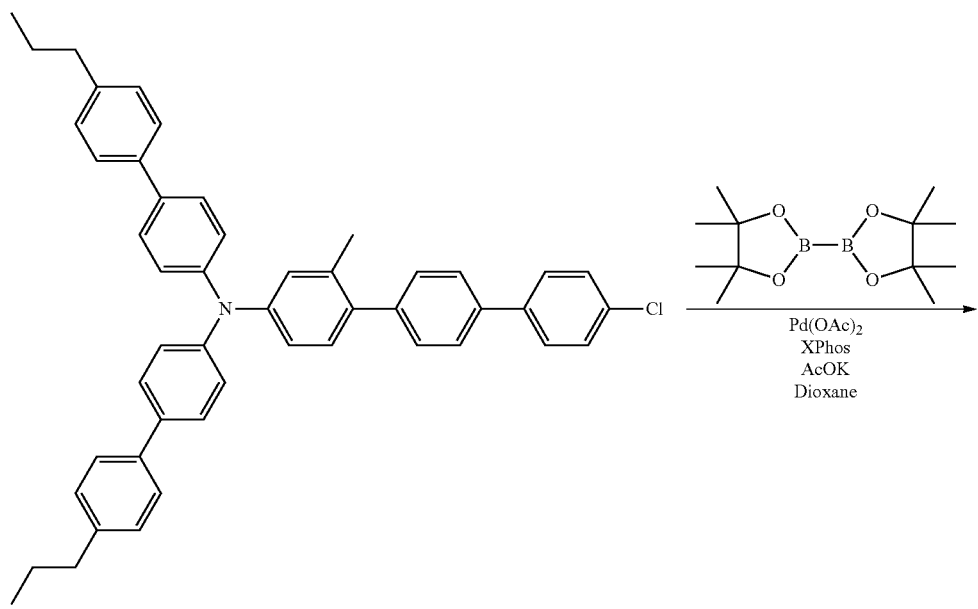
Intermediate-2d -continued
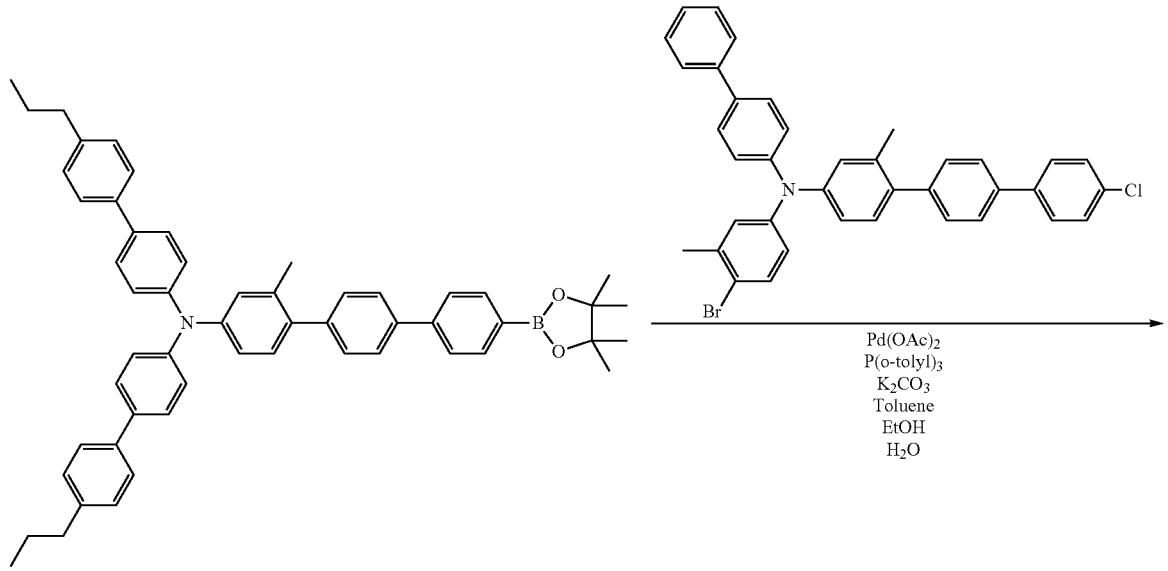
Intermediate-2e
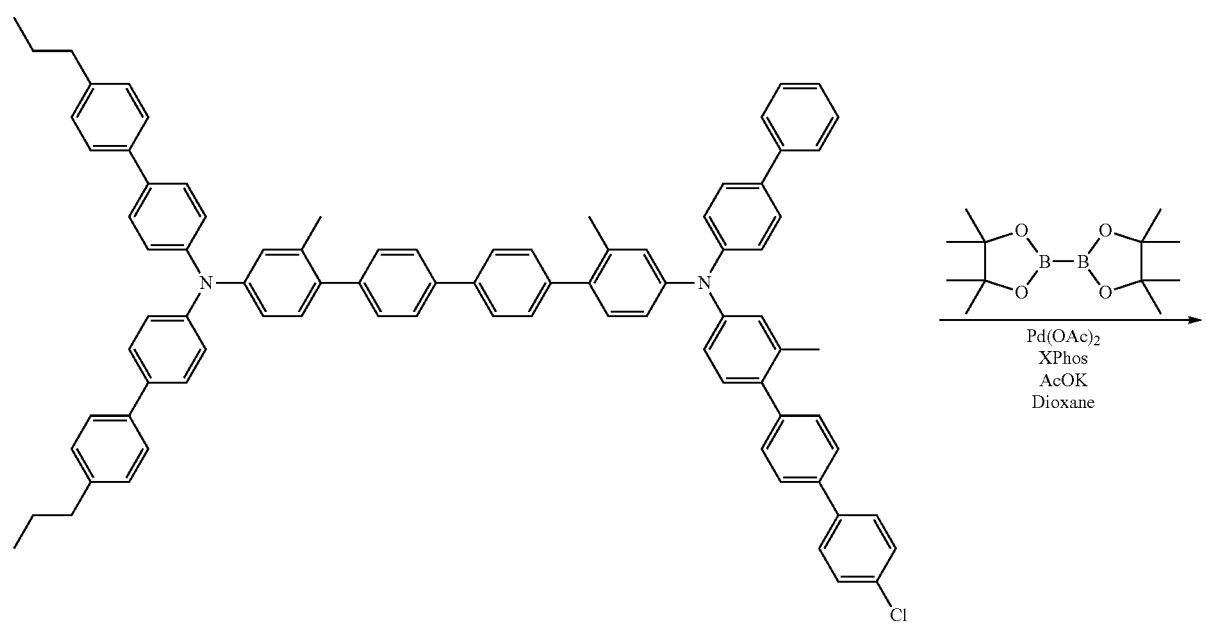
Intermediate-2f

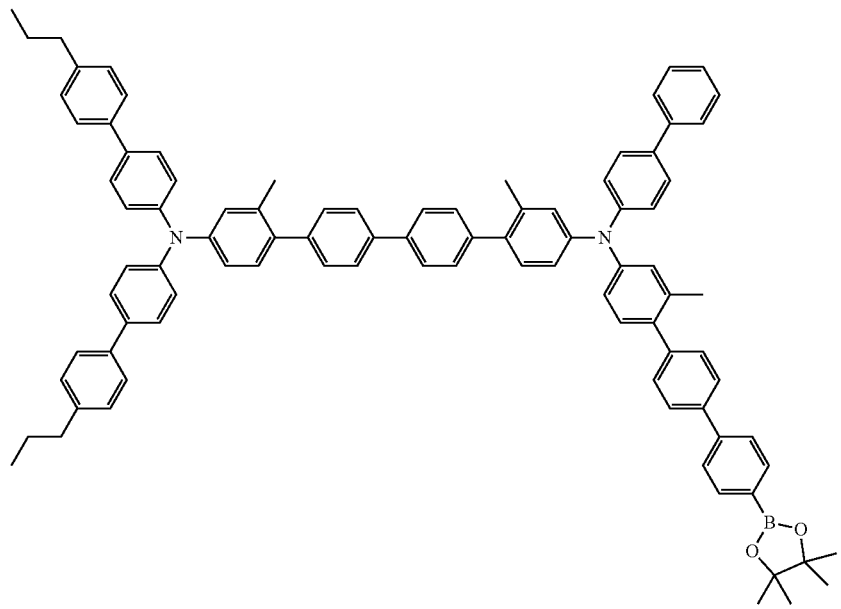

Intermediate-2

In a 5 L-4 neck flask, dibromodiphenylamine (581.0 mmol, 190.0 g), propylphenylboronic acid (1162 mmol, 190.6 g), and THF (2905 ml) are placed and dissolved. 1162 ml of K$_2$CO$_3$ 2M aqueous solution is added, and then, Pd(OAc)$_2$ (34.9 mmol, 7.83 g), and P(o-tolyl)$_3$ (52.3 mmol, 15.92 g) are added and refluxed under nitrogen atmosphere for 5 hours. When a reaction is completed, the reaction mixture is cooled down to room temperature and diluted with toluene and extracted. After drying with MgSO$_4$, the solution is filtered through a silica gel pad. After the solvent is removed under reduced pressure, recrystallization is performed twice in methanol and vacuum-dried (50° C., 16 hours) to obtain Intermediate-2a (200.3 g, Yield: 85%).

Intermediate-2a (246.6 mmol, 100 g), 2-bromo-5-iodo-toluene (258.9 mmol, 76.87 g), tert-BuONa (493.2 mmol, 47.4 g), and 1,4-dioxane (493 ml) are placed in a 1 L-four-neck flask, and dispersed by stirring, and CuI (7.4 mmol, 1.41 g) and trans-1,2-diaminocyclohexane (37.0 mmol, 4.4 ml) are added thereto, followed by refluxing for 10 hours.

When a reaction is completed, the reaction mixture is cooled down to room temperature, diluted with toluene, and filtered using CELITE. After concentration, the crude product is purified by silica gel chromatography (hexane:toluene=7:3 volume ratio), and then recrystallized with acetone. The purified product is vacuum-dried (50° C., 16 hours) to obtain Intermediate-2b (99.2 g, Yield: 70%).

Intermediate-2b (129.3 mmol, 74.3 g), bis(pinacolato)diboron (142.2 mmol, 36.1 g), potassium acetate (297.4 mmol, 29.1 g), and NMP (650 ml) are placed in a 2 L-four-neck flask, and dispersed by stirring, PdCl2(dppf) dichloromethane adduct (2.57 mmol, 21.1 g) is added thereto, and refluxed under argon atmosphere for 7 hours.

When a reaction is completed, the reaction mixture is cooled down to room temperature and filtered using CELITE. After washing the filtrate three times with pure water, the organic layer is filtered using MgSO$_4$. After concentration, the reaction mixture is purified by silica gel chromatography (hexane:toluene=7:3 volume ratio). After concentration, the residue is dissolved in THF, and recrystallization is performed by adding methanol. By vacuum-drying (50° C., 16 hours), Intermediate-2c is obtained (65.6 g, Yield: 81.6%).

Intermediate-2c (300.0 mmol, 186.5 g), 4-bromo-4'-chloro-1,1'-biphenyl (300.0 mmol, 80.3 g), toluene (600 ml) and ethanol (150 ml) are placed in a 2 L-four-neck flask and dispersed.

Potassium carbonate (450.0 mmol, 62.2 g) dissolved in pure water (225 ml) is placed in a flask, and dispersed by stirring, Pd(OAc)$_2$ (12.0 mmol, 2.69 g), P(o-tolyl)$_3$ (18.0 mmol, 5.48 g) are added and the reaction mixture is refluxed under argon atmosphere for 3 hours.

When a reaction is completed, the reaction mixture is cooled down to room temperature and filtered using CELITE. The filtrate is washed three times with pure water, and then the organic layer is dried over MgSO$_4$. After concentration, the reaction mixture is filtered through a silica gel pad. After concentration, recrystallization is performed using hexane. By vacuum-drying (50° C., 16 hours), Intermediate-2d is obtained (168 g, Yield: 82.1%).

Intermediate-2d (246 mmol, 168 g), bis(pinacolato)diboron (270.6 mmol, 68.7 g), potassium acetate (492 mmol, 48.3 g), and 1,4-dioxane (492 ml) are placed in a 1 L-four-neck flask and dispersed. Pd(OAc)$_2$ (4.92 mmol, 1.10 g) and XPhos (9.84 mmol, 4.69 g) are added thereto, and the mixture is refluxed under argon atmosphere for 4 hours.

When a reaction is completed, the reaction mixture is cooled down to room temperature and filtered using CELITE. After concentration, the reaction mixture is filtered through a silica gel pad. After concentration, recrystallization is performed using toluene and hexane. By vacuum-drying (50° C., 16 hours), Intermediate-2e is obtained (164.7 g, Yield: 86.5%).

Intermediate-1 (63.0 mmol, 38.8 g), Intermediate-2e (60.0 mmol, 46.4 g), toluene (240 ml), and ethanol (30 ml) are placed in a 2 L-four-neck flask, and dispersed.

Potassium carbonate (90.0 mmol, 12.4 g) dissolved in pure water (45 ml) is placed in a flask, and dispersed by stirring, Pd(OAc)$_2$ (2.4 mmol, 0.54 g) and P(o-tolyl)$_3$ (3.6 mmol, 1.10 g) are added and refluxed under argon atmosphere for 4 hours.

When a reaction is completed, the reaction mixture is cooled down to room temperature and filtered using CELITE. The filtrate is washed three times with pure water, and then the organic layer is dried over MgSO$_4$. After concentration, the crude product is filtered through a silica gel pad. After concentration, the reaction mixture is purified by silica gel chromatography (hexane:toluene=6:4 volume ratio). The obtained solid is vacuum-dried (50° C., 16 hours), obtaining Intermediate-2f (49.0 g, Yield: 69.2%).

Intermediate-2f (41.5 mmol, 49.0 g), bis(pinacolato)diboron (53.9 mmol, 13.7 g), potassium acetate (83.0 mmol, 8.15 g), and 1,4-dioxane (208 ml) are placed in 1 L-four-neck flask and dispersed. Pd(OAc)$_2$ (0.83 mmol, 0.186 g) and XPhos (1.66 mmol, 0.791 g) are added, and refluxed under argon atmosphere for 4 hours.

When a reaction is completed, the reaction mixture is cooled down to room temperature, diluted with toluene and filtered using CELITE. After concentration, the reaction mixture is filtered through a silica gel pad. After concentration, the reaction mixture is dissolved in toluene and washed with pure water three times, and the organic layer is dried using MgSO$_4$. After concentration, the reaction mixture is purified by silica gel chromatography (hexane:toluene=8:2 volume ratio). The obtained solid is vacuum-dried (50° C., 16 hours), obtaining Intermediate-2 (45.0 g, Yield: 85.1%).

(Synthesis of Intermediate-3)

Intermediate-3 is synthesized according to Reaction Scheme 3.

[Reaction Scheme 3]

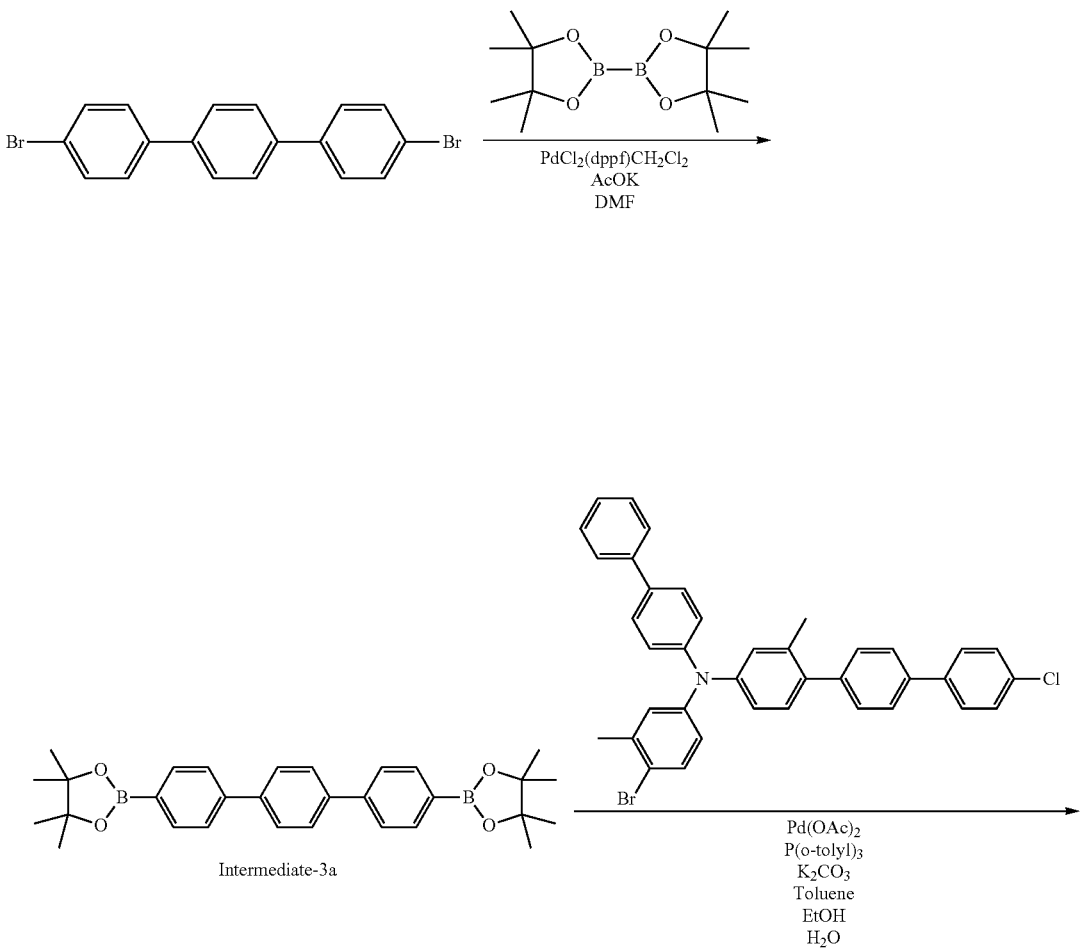

Intermediate-3a

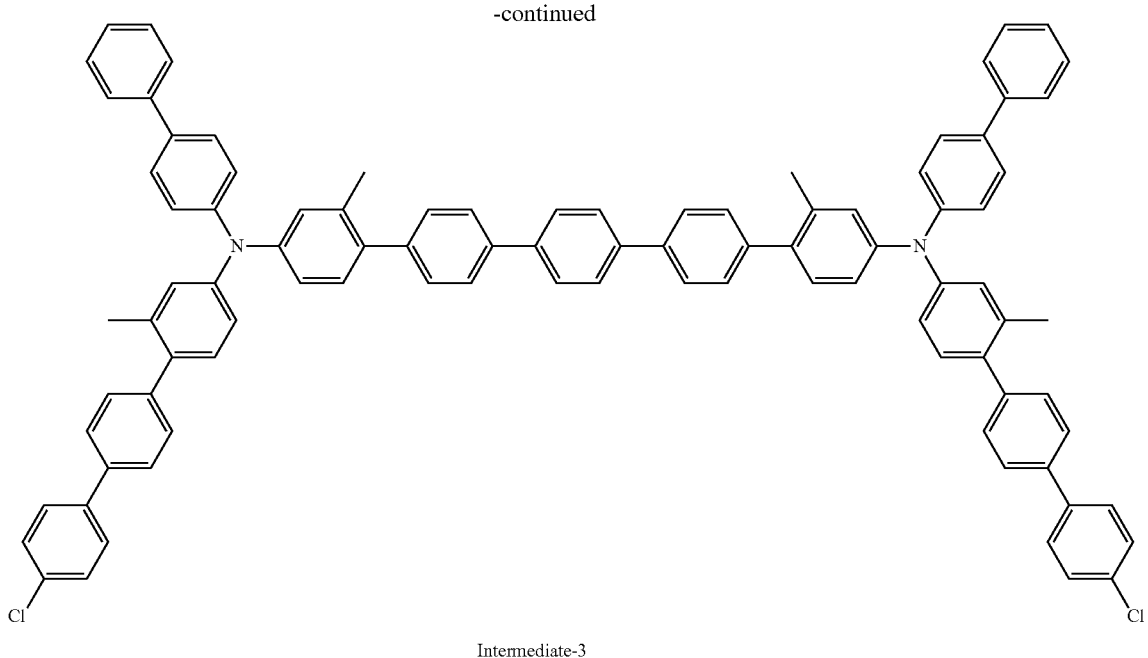

Intermediate-3

4,4''-dibromo-1,1':4',1''-terphenyl (26 mmol, 10.1 g), bis(pinacolato)diboron (57.2 mmol, 14.5 g), potassium acetate (104 mmol, 10.2 g), toluene (130 ml) and DMF (130 ml) are placed in a 500 mL-four-necked flask and then, dispersed. Subsequently, a PdCl$_2$(dppf) dichloromethane adduct (5.2 mmol, 3.80 g) is added thereto and then, heated and stirred at 80° C. for 4 hours. under a nitrogen atmosphere When a reaction is completed, the reaction mixture is cooled down to room temperature and diluted with methanol, and a solid precipitated therein is recovered through filtration. A crude product therefrom is vacuum-dried (50° C.) and dissolved in chloroform and then, filtered through a silica gel pad. After concentration, dispersion washing with hexane is performed. The obtained solid is vacuum-dried (50° C., 16 hours), obtaining Intermediate-3a (10.51 g, Yield: 83.8%).

Intermediate-3 is synthesized in the same order as the synthesis of Intermediate-2f except that 10.51 g of Intermediate-3a and 2 equivalents of Intermediate-1 relative to that of Intermediate-3a are used: (23.2 g, Yield: 82.1%).

(Synthesis of Intermediate 4)

Intermediate-4 is synthesized according to Reaction Scheme 4.

[Reaction Scheme 4]

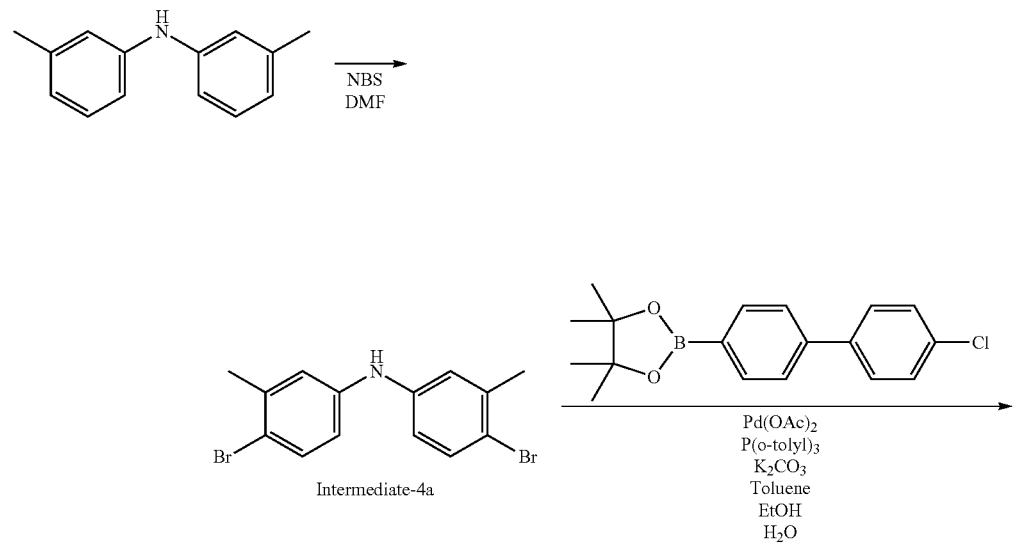

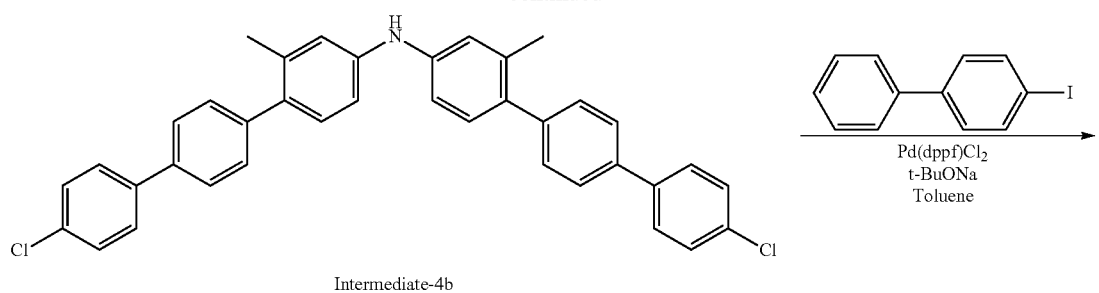
Intermediate-4b
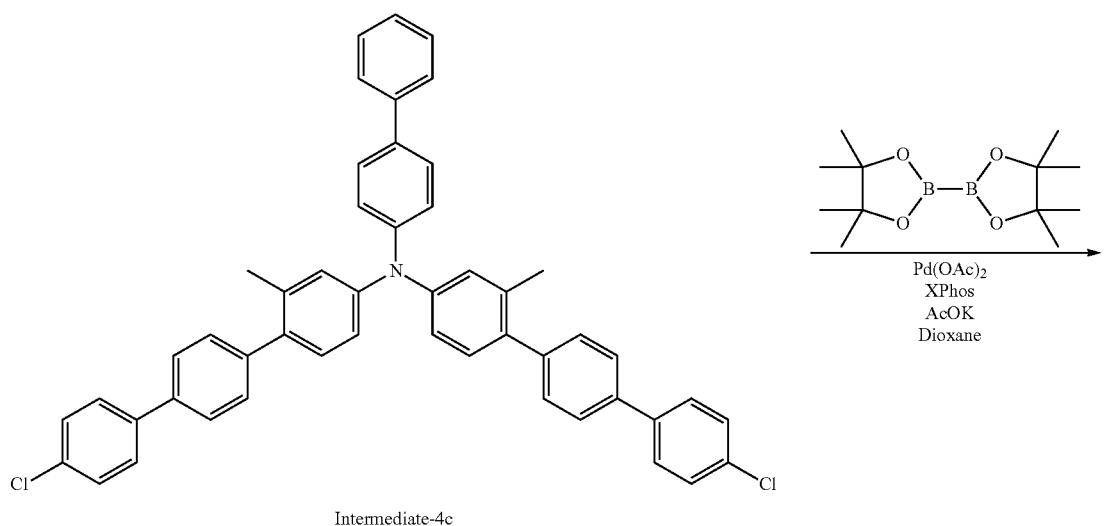
Intermediate-4c
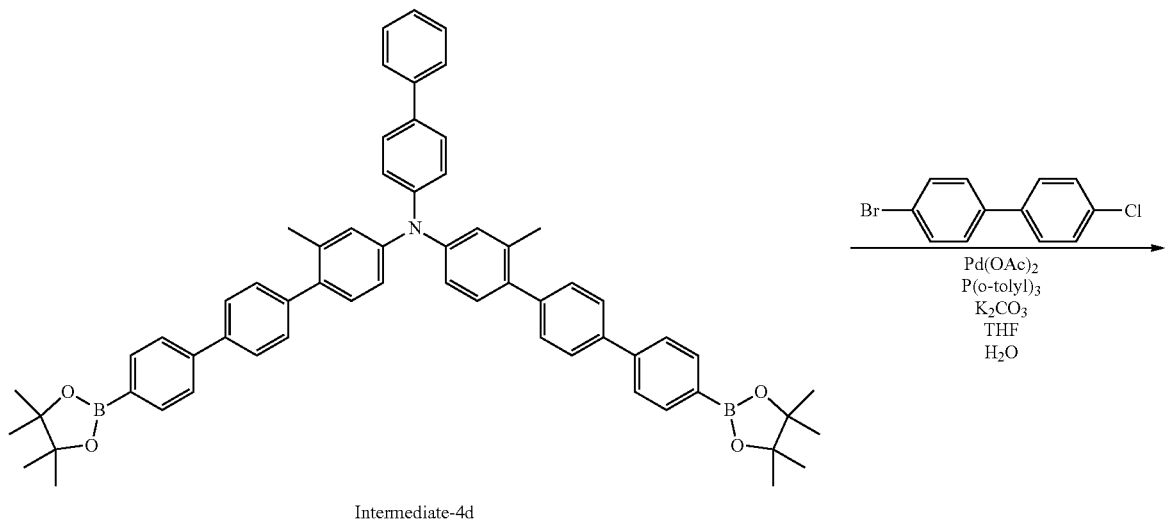
Intermediate-4d -continued

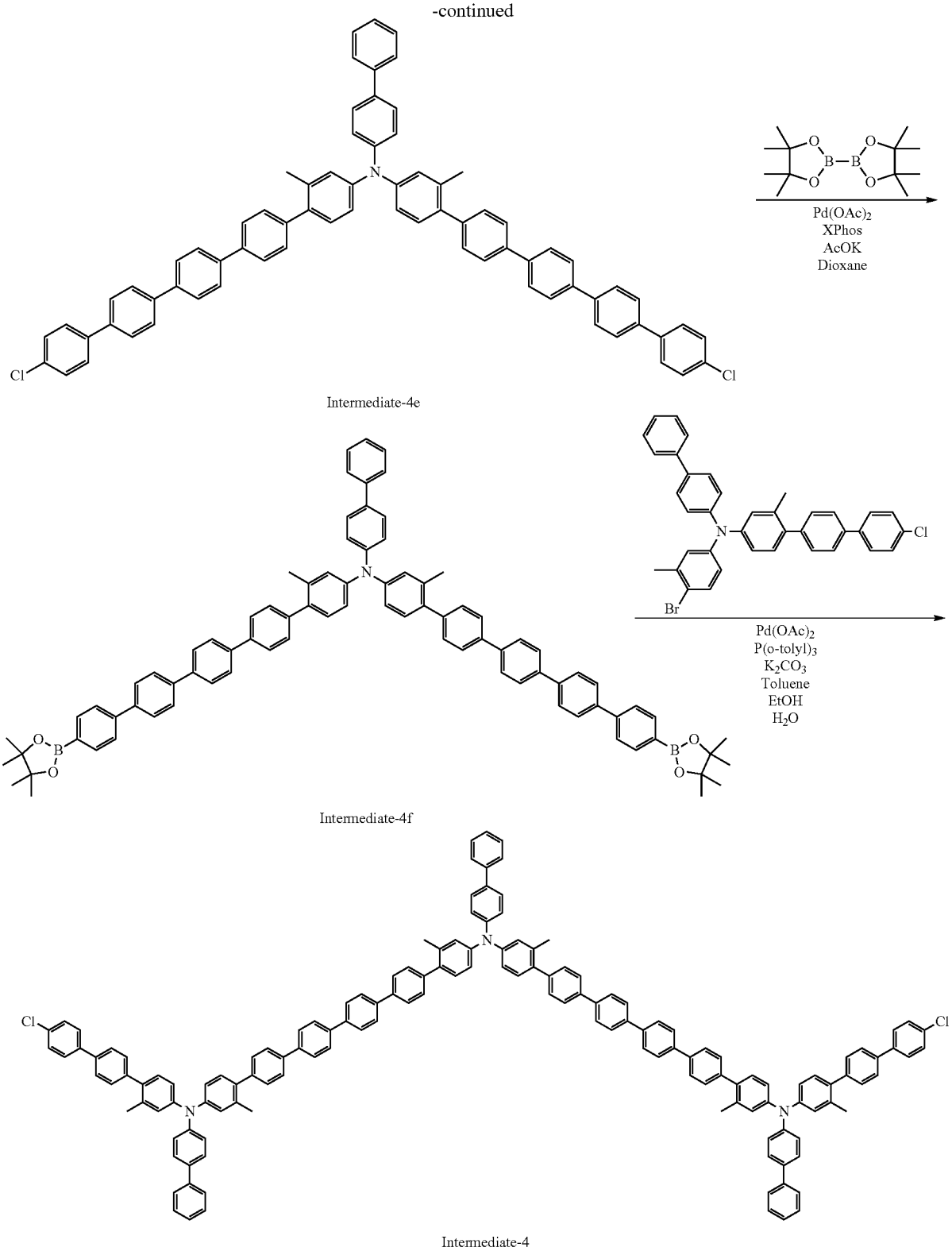

N,N-ditolyl amine (50.31 g) and DMF (510 ml) are placed in a 2 L-four-necked flask and then, dissolved by stirring under a nitrogen atmosphere. After cooled down to 0° C., a DMF solution (255 mL) of N-bromosuccinimide (90.77 g) is added thereto in a dropwise fashion. The obtained mixture is stirred at room temperature (25° C., hereinafter, the same) for 5 hours. Subsequently, 1 L of pure water is added to the reaction solution, and a solid precipitated therein is irradiated by ultrasonic waves for 30 minutes and then, filtered. After vacuum-dried (50° C., 12 hours), the solid is dissolved in 1 L of THF and filtered through a silica gel pad. The solvent is removed under a reduced pressure, obtaining crystal solids. This crude product is heated and dissolved in toluene, and hexane is added thereto to recrystallize a solid, which is filtered. The solid is vacuum-dried (50° C., 12 hours), obtaining Intermediate-4a (72.4 g, Yield: 80%).

Intermediate-4a (204 mmol, 72.4 g), a Cl biphenyl Bpin (428.4 mmol, 134 g), a 2 M potassium carbonate aqueous solution (306 ml), toluene (816 ml), and EtOH (102 ml) are placed in a 2 L-four-necked flask and dispersed, and Pd(OAc)$_2$ (8.16 mmol, 1.83 g) and P(o-tolyl)$_3$ (12.24 mmol, 3.73 g) are added thereto and then, heated and stirred at 80° C. for 4 hours under a nitrogen atmosphere. The reaction mixture is cooled down to room temperature and diluted with methanol, and a solid precipitated therein is recovered through filtration. A crude product therefrom is vacuum-dried at 50° C., heated and dissolved in toluene, and then, passed through silica gel short column to perform hot filtration and removed. After concentration, dispersion washing is performed using methanol. A solid is recrystallized therefrom using toluene and hexane and vacuum-dried (50° C., 12 hours), obtaining Intermediate-4b (63.5 g, Yield: 54.6%).

In a 300 mL-four-necked flask, Intermediate-4b (10 mmol, 5.71 g), 4-iodobiphenyl (10.5 mmol, 2.94 g), t-BuONa (15.0 mmol, 1.44 g), toluene (100 mL) and Pd(dppf)Cl$_2$ (0.5 mmol, 0.366 g) are heated and stirred at 110° C. for 6 hours under a nitrogen atmosphere. When a reaction is completed, the reaction mixture is cooled down to room temperature and filtered through CELITE. A filtrate therefrom is filtered through silica gel short column to remove; impurities. After concentration, recrystallization is three times performed using toluene and hexane. A product therefrom is vacuum-dried (50° C., 16 hours), obtaining Intermediate-4c (4.11 g, Yield: 56.9%).

Intermediate-4d is synthesized according to the same order of the synthesis of Intermediate-3a except that the 4,4"-dibromo-1,1':4',1"-terphenyl is used instead of Intermediate-4c (2.5 g, Yield: 78.0%).

Intermediate-4d (3.3 mmol, 2.97 g), 4-bromo-4'-chloro-1,1'-biphenyl (7.26 mmol, 1.94 g), a 2 M potassium carbonate aqueous solution (13.2 ml), and THF (13.2 ml) are placed in a 100 mL-four-necked flask, and dispersed, and Pd(OAc)$_2$ (0.17 mmol, 38 mg) and P(o-tolyl)$_3$ (0.26 mmol, 79 mg) are added thereto and then, heated and stirred at 60° C. for 6 hours under a nitrogen atmosphere. The reaction mixture is cooled down to room temperature and diluted with methanol, and a solid precipitated therein is recovered through filtration. A crude product therefrom is vacuum-dried at 50° C., and dispersion, washing is performed using ethyl acetate. A solid obtained therefrom is vacuum-dried at 50° C. for 12 hours, obtaining Intermediate-4e (3.20 g, Yield: 99%).

Intermediate-4f is synthesized according to the synthesis of Intermediate-3a except that the 4,4"-dibromo-1,1':4',1"-terphenyl is used instead of Intermediate-4e (2.5 g, Yield: 63.0%).

Intermediate-4 is synthesized according to the synthesis of Intermediate-3 except that 2.50 g of Intermediate-4f is used instead of Intermediate-3a (2.43 g, Yield: 55.6%).

(Synthesis of Intermediate-5)

Intermediate-5 is synthesized according to Reaction Scheme 5.

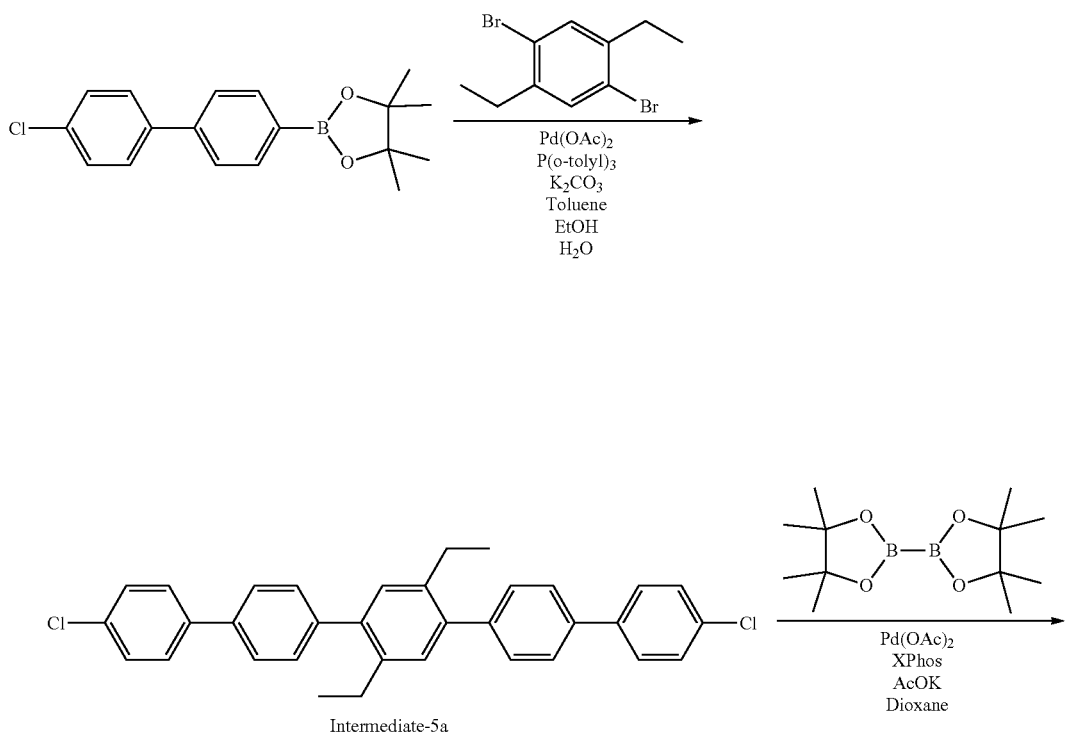

-continued

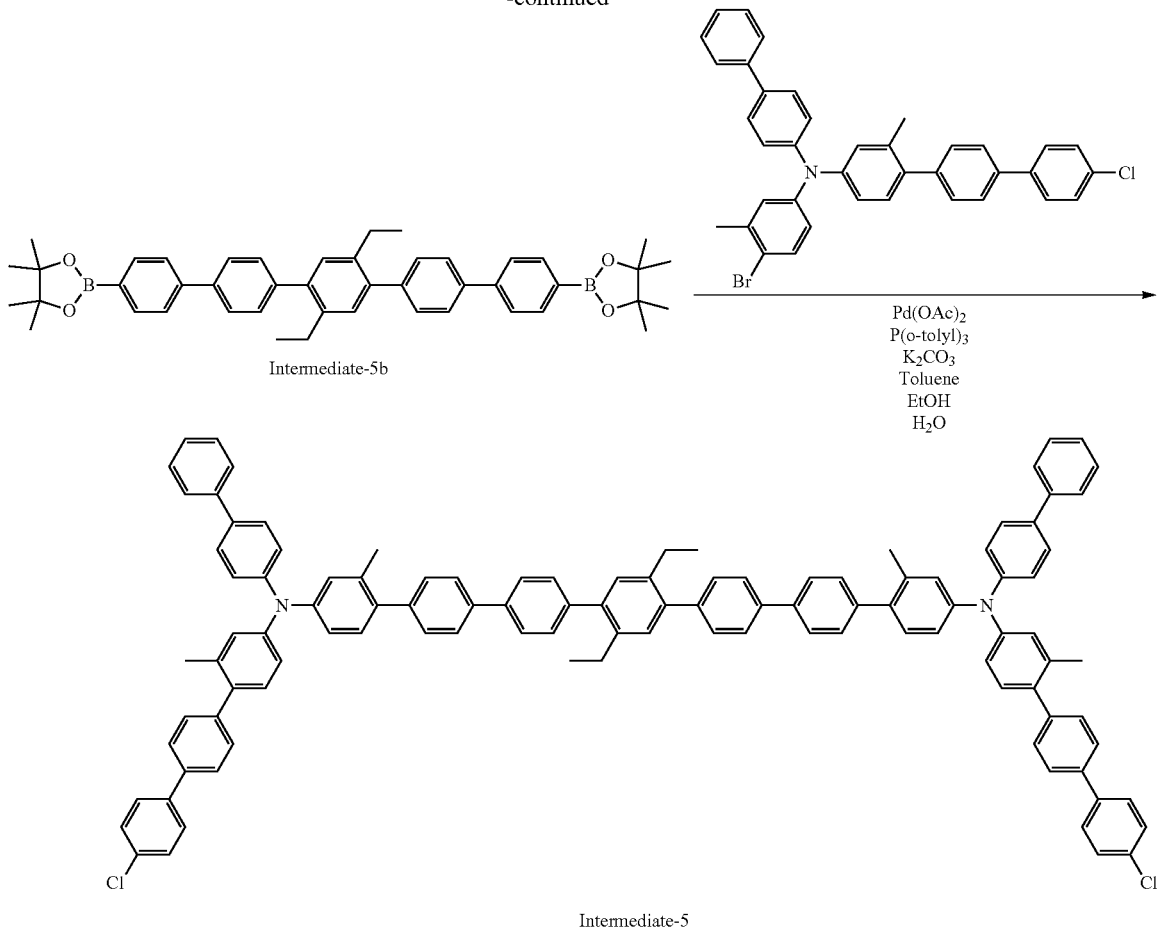

Intermediate-5

Intermediate-5a is synthesized according to the same method as the synthesis of Intermediate-4b except that Intermediate-4a is used instead of the 4-dibromo-2,6-diethylbenzene (13.1 g, Yield: 93%).

Intermediate-5b is synthesized according to the same order as the synthesis of Intermediate-3a except that the 4,4''-dibromo-1,1':4',1''-terphenyl is used instead of Intermediate-5a (8.7 g, Yield: 89%).

In a 2 L-four-necked flask, Intermediate-1 (18.7 mmol, 11.5 g), Intermediate-5b (8.9 mmol, 6.15 g), toluene (178 ml), and ethanol (9 ml) are placed and dispersed. Subsequently, a solution prepared by dissolving potassium carbonate (35.6 mmol, 4.92 g) in pure water (36 ml) is added to the flask and then, dispersed by stirring, and Pd(OAc)$_2$ (0.36 mmol, 81 mg) and P(o-tolyl)$_3$ (0.53 mmol, 161 mg) are added thereto and then, refluxed for 20 hours under an argon atmosphere. When a reaction is completed, the reaction mixture is cooled down to room temperature and filtered by using CELITE. After three times washing the filtrate with pure water, an organic layer is dried with MgSO$_4$. The dried product is concentrated and filtered through a silica gel pad. After the concentration, dispersion washing is performed with ethyl acetate, and a solid is filtered therefrom. The obtained solid is vacuum-dried at 50° C. for 16 hours, obtaining Intermediate-5 (4.60 g, Yield: 34.3%).

(Synthesis of Intermediate-6)

Intermediate-6 is synthesized according to Reaction Scheme 6.

[Reaction Scheme 6]

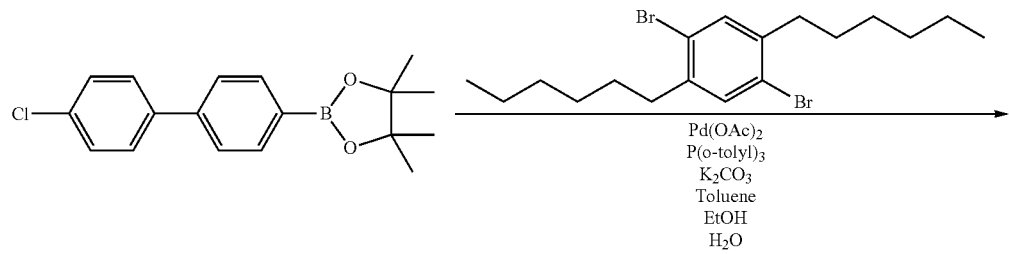

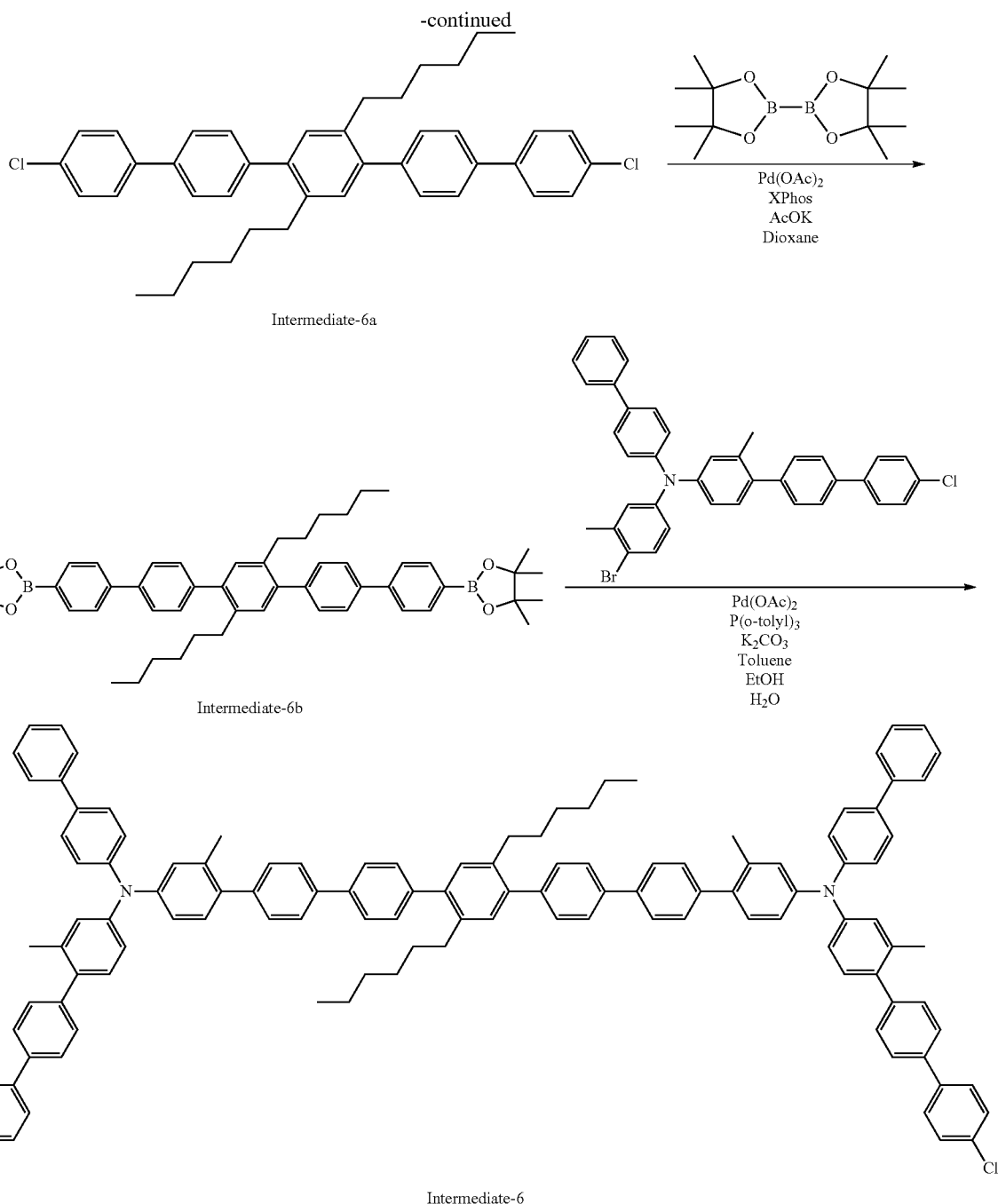

Intermediate-6a is synthesized in the same manner as the synthesis of Intermediate-5a except that the 4-dibromo-2,6-diethylbenzene is used instead of 4-dibromo-2,6-dihexylbenzene (3.8 g, Yield: 91%).

Intermediate-6b is synthesized in the same manner as the synthesis of Intermediate-3a except that 4,4''-dibromo-1,1': 4',1''-terphenyl is used instead of Intermediate-6a (1.5 g, Yield: 71%).

Intermediate-6 is synthesized in the same manner as the synthesis of Intermediate-3 except that 1.0 g of Intermediate-6b is used instead of Intermediate-3a (0.81 g, Yield: 40.5%).

Example 1

Synthesis of Compound C-1

Compound C-1 is synthesized according to Reaction Scheme C-1.

[Reaction Scheme C-1]
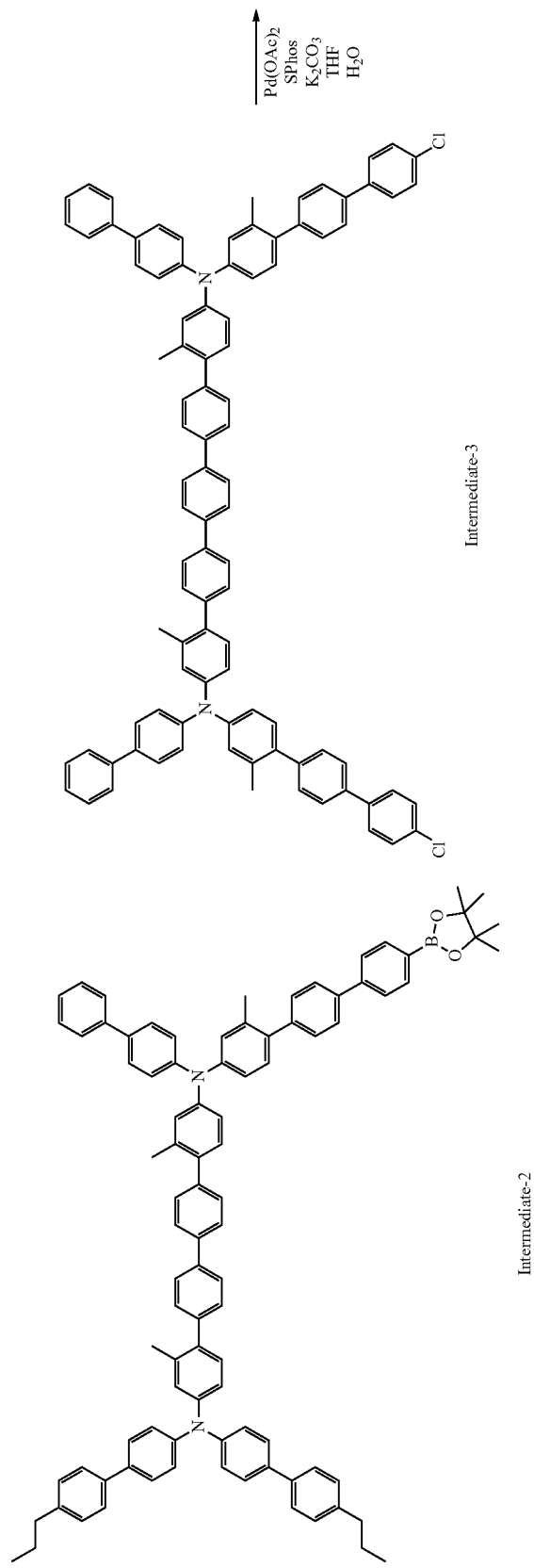

-continued
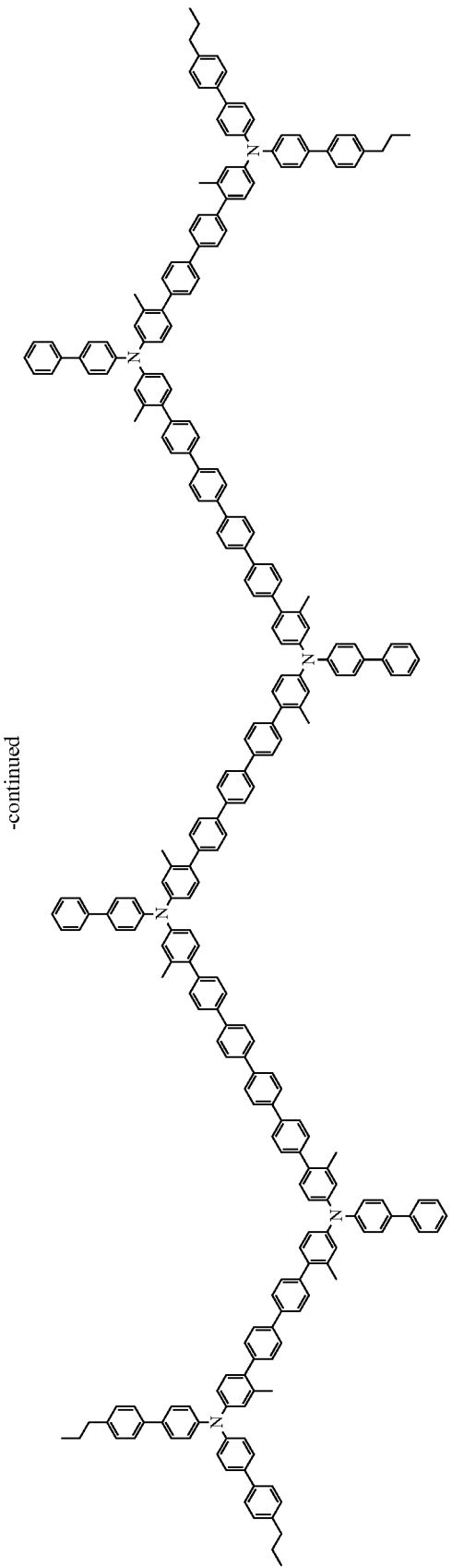
Compound C-1

In a 500 mL-four-necked flask, Intermediate-2 (1.05 mmol, 1.34 g), Intermediate-3 (0.5 mmol, 649 mg), THF (50 ml), and a 2 M potassium carbonate aqueous solution (3 ml) are placed and stirred. The mixture is dispersed, and Pd(OAc)$_2$ (0.05 mmol, 11 mg) and SPhos (0.10 mmol, 41 mg) are added thereto and then, heated and stirred at 60° C. for 6 hours under a nitrogen atmosphere. When a reaction is completed, the reaction mixture is cooled down to room temperature and diluted with ethyl acetate and pure water and then, washed with ultrasonic waves for 30 minutes. Subsequently, precipitates therein are filtered and washed with methanol. A crude product is vacuum-dried (50° C., 12 hours), heated and dissolved in toluene, and then, passed through silica gel short column to perform hot filtration and removed. After concentration, a solid is recrystallized therefrom using toluene and ethyl acetate and vacuum-dried (50° C., 12 hours), obtaining Compound C-1 (1.64 g).

In addition, Compound C-1 has a molecular weight of 3500 g/mole (theoretical value: 3521), when measured by GPC using polystyrene as a standard material.

Preparation of Composition M-1

Compound C-1 and a low molecular weight compound represented by Chemical Formula M-1 (molecular weight: 679) are mixed to have a weight ratio of 95:5, preparing Composition M-1.

[Chemical Formula M-1]

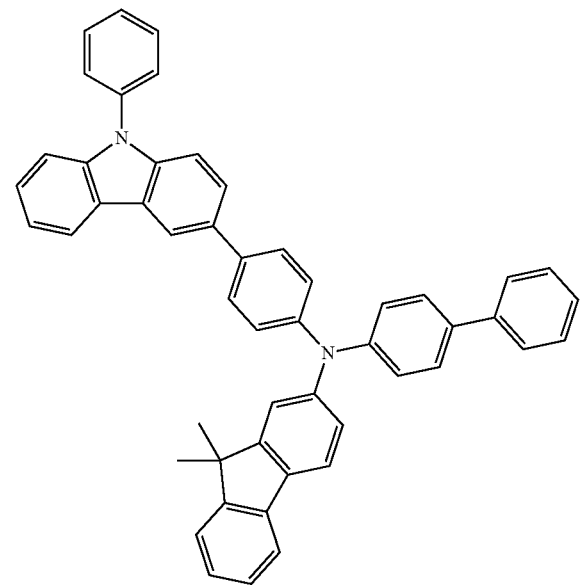

Preparation of Composition M-2

Compound C-1 and a polymer compound represented by Chemical Formula M-2 (molecular weight: 12000 g/mole) are mixed to have a weight ratio of 90:10, preparing Composition M-2.

[Chemical Formula M-2]

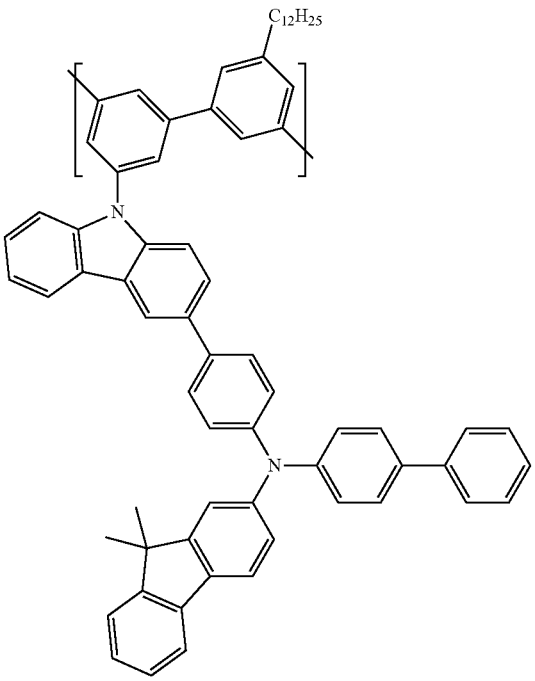

Manufacture of Quantum Dot Electroluminescent Device D-1

As for a first electrode (an anode), a glass substrate adhered with indium tin oxide (ITO) which is patterned to have a film thickness of 150 nm is used. This ITO-adhered glass substrate is sequentially washed with a neutral detergent, deionized water, water, and isopropyl alcohol and then, treated with UV-ozone.

Subsequently, on this ITO-adhered glass substrate, poly (3,4-ethylenedioxythiophene)/poly(4-styrenesulfonate) (PEDOT/PSS) (Sigma-Aldrich Co., Ltd.) is spin-coated and dried to have a dry film thickness of 30 nm. As a result, a hole injection layer having a thickness (dry film thickness) of 30 nm is formed on the ITO-adhered glass substrate.

On this hole injection layer, a toluene solution including 1.0 wt % of Compound C-1 (hole transport material) is spin-coated to have a drying film thickness of 30 nm and then, heat-treated at 230° C. for 60 minutes, forming a hole transport layer. As a result, the hole transport layer is formed to have a thickness (drying film thickness) of 30 nm on the hole injection layer.

Figure 2:
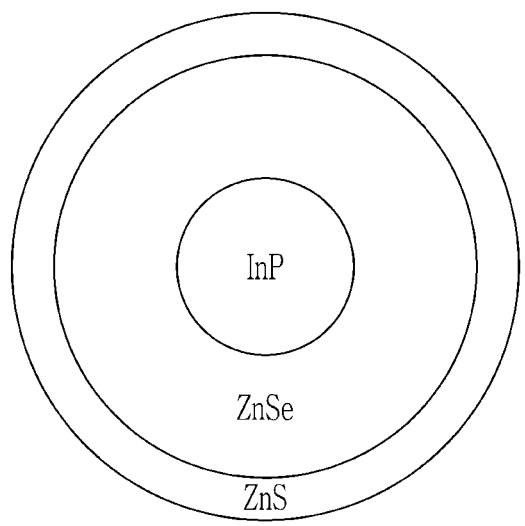
FIG. 2 is a cross-sectional view showing the structure of a quantum dot used in the examples.

Quantum dot dispersion is prepared by dispersing red quantum dots of InP/ZnSe/ZnS (core/shell/shell; average diameter=about 10 nm) having a structure shown in FIG. 2 in cyclohexane at 1.0 wt %.

On the other hand, the hole transport layer (particularly, Compound C-1) is not dissolved in cyclohexane.

This quantum dot dispersion is spin-coated to have a dry film thickness of 30 nm on the hole transport layer and dried. As a result, a quantum dot light emitting layer with a thickness (dry film thickness) of 30 nm is formed on the hole transport layer.

On the other hand, when the quantum dot dispersion is irradiated by ultraviolet (UV), light generated therefrom has a central wavelength of 672 nm and a full width at half maximum of 30 nm.

89

This quantum dot light emitting layer is completely dried. On this quantum dot light emitting layer, lithium quinolate (Liq) and 1,3,5-tris(N-phenylbenzimidazol-2-yl)benzene (TPBI) (Sigma-Aldrich Co., Ltd.) as an electron transport material are codeposited by using a vacuum deposition apparatus. As a result, a 36 nm-thick electron transport layer is formed on the quantum dot light emitting layer.

Using a vacuum deposition apparatus, (8-quinolato) lithium (lithium quinolate, Liq) is deposited on this electron transport layer. As a result, a 0.5 nm-thick electron injection layer is formed on the electron transport layer.

90

Using a vacuum deposition apparatus, aluminum (Al) is deposited on the electron injection layer. As a result, a 100 nm-thick second electrode. (cathode) is formed on the electron injection layer.

Accordingly, Quantum dot electroluminescent device D-1 is obtained.

Example 2

Synthesis of Compound C-2

Compound C-2 is synthesized according to Reaction Scheme C-2.

[Reaction Scheme C-2]

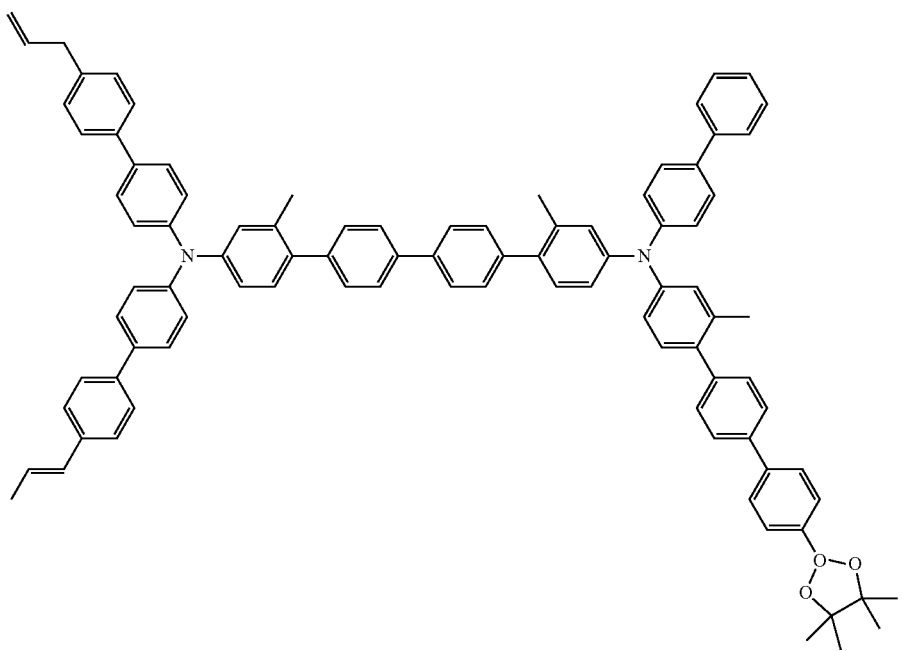

Intermediate-2

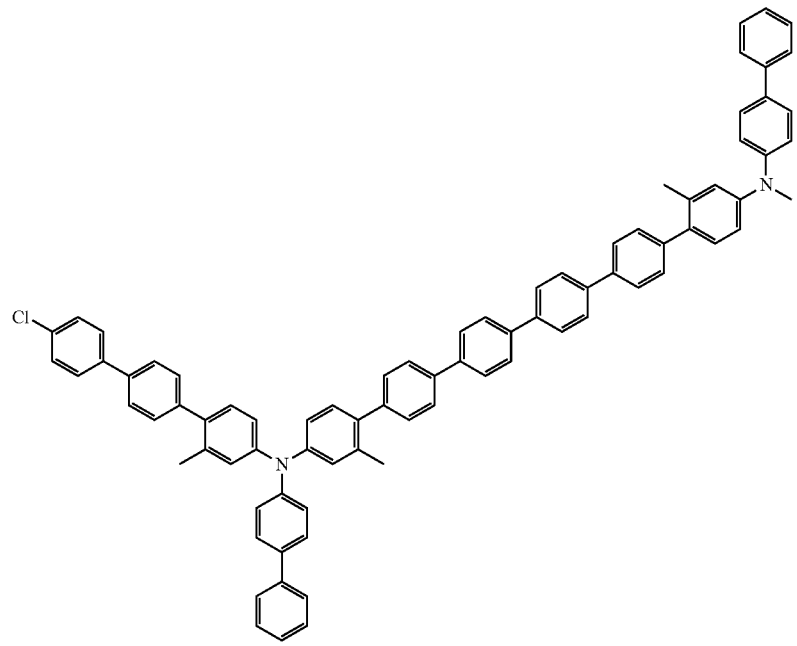

-continued
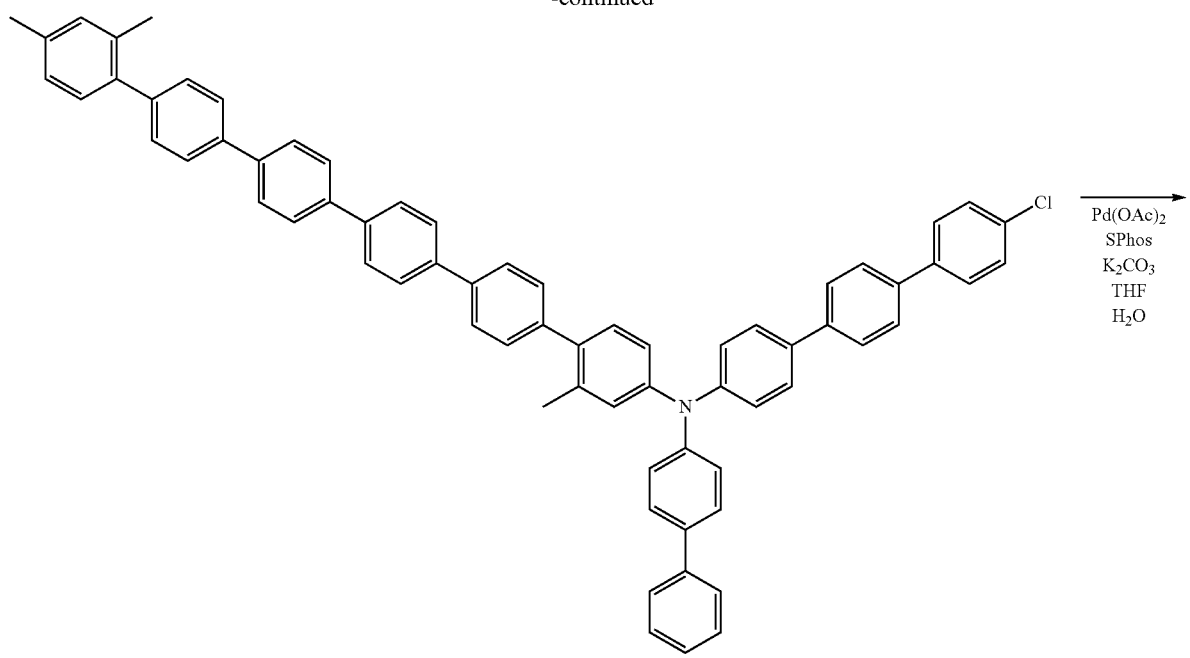
Intermediate-4
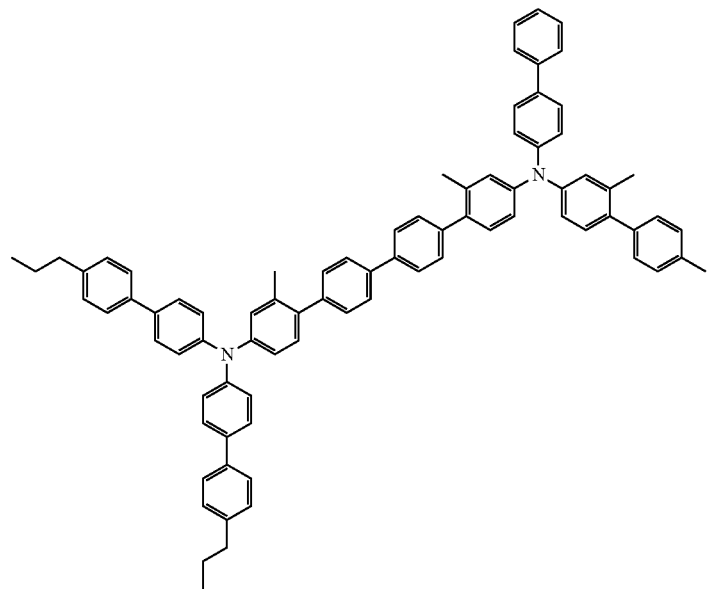

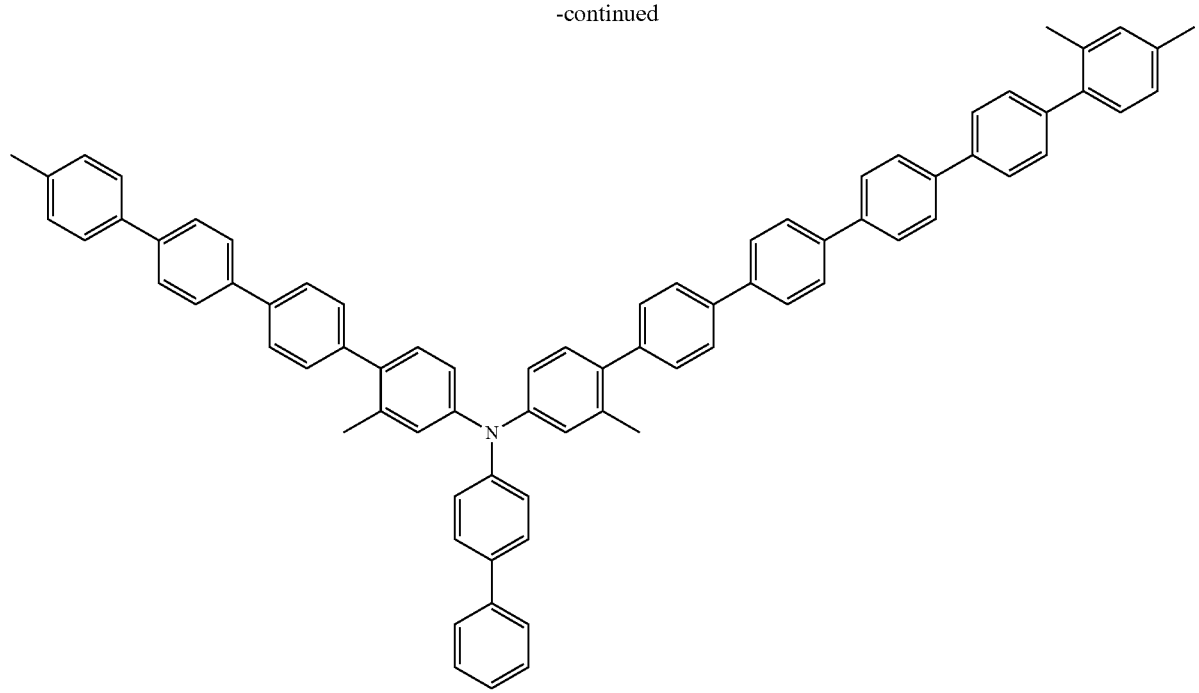
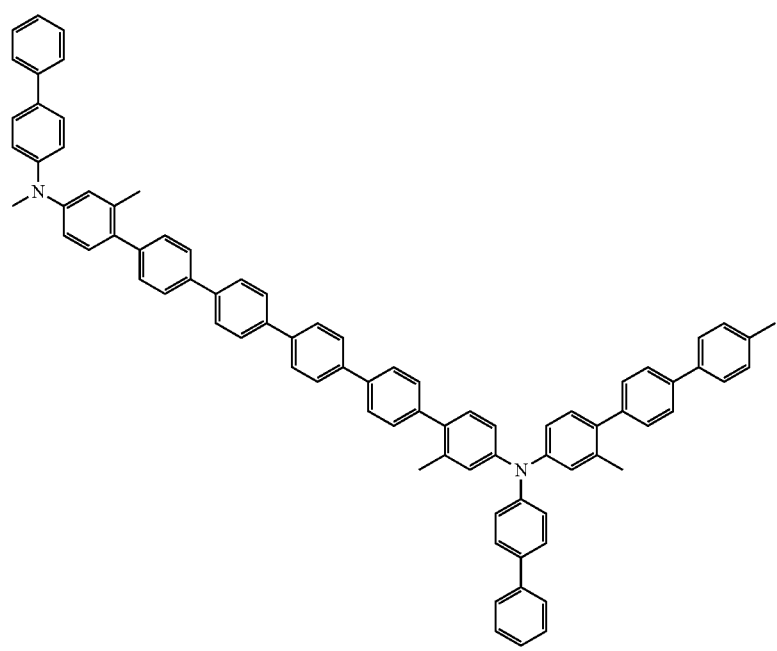

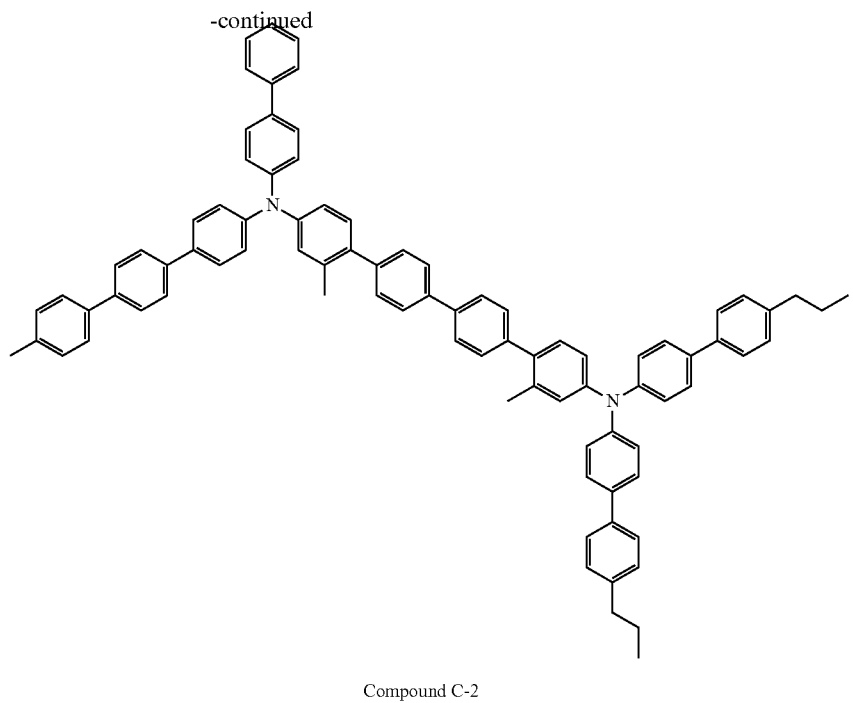

Compound C-2

Compound C-2 is synthesized in the same manner as the synthesis of Compound C-1 except that 1.01 g of Intermediate-4 is used instead of Intermediate-3 (1.6 g, Yield: 82%).

On the other hand, Compound C-2 has a molecular weight of 4200 g/mole (theoretical value: 4235), when measured by GPC using polystyrene as a standard material.

Preparation of Composition M-3

Composition M-3 is prepared in the same manner as the preparation of Composition M-1 except that Compound C-1 is used instead of Compound C-2.

Preparation of Composition M-4

Composition M-4 is prepared in the same manner as the preparation of Composition M-2 except that Compound C-1 is used instead of Compound C-2.

Manufacture of Quantum Dot Electroluminescent Device D-2

Quantum dot electroluminescent device D-2 is manufactured in the same manner as Example 1 (manufacture of Quantum dot electroluminescent device D-1) except that Compound C-2 is used instead of Compound C-1.

Example 3

Synthesis of Compound C-3

Compound C-3 is synthesized according to Reaction Scheme C-3.

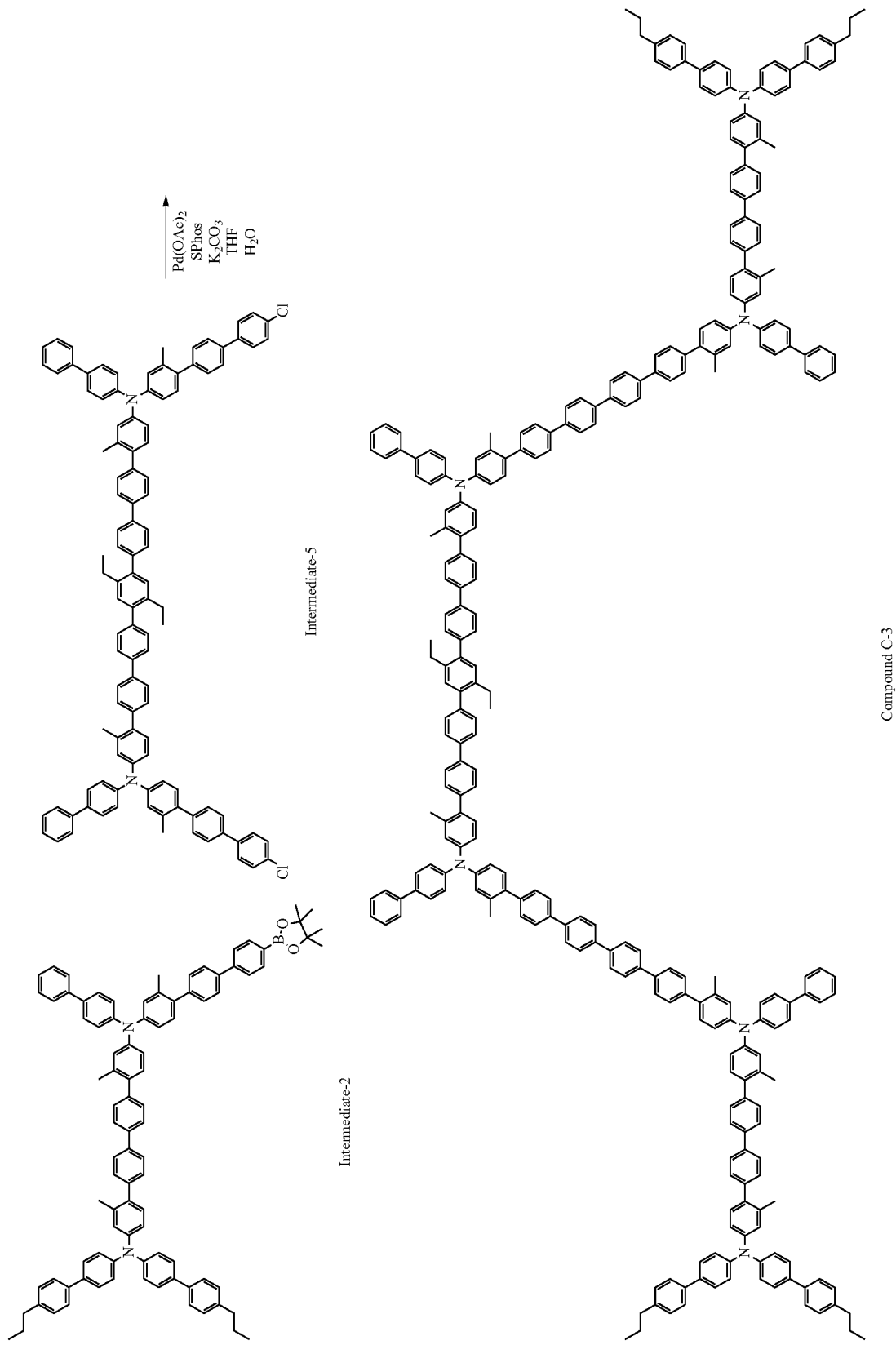

Compound C-3 is synthesized in the same manner as the synthesis of Compound C-1 except that 753 mg of Intermediate-5 is used instead of Intermediate-3 (1.5 g, Yield: 80%).

On the other hand, Compound C-3 has a molecular weight of 3700 g/mole (theoretical value: 3729), when measured by GPC using polystyrene as a standard material.

Example 4

Synthesis of Compound C-4

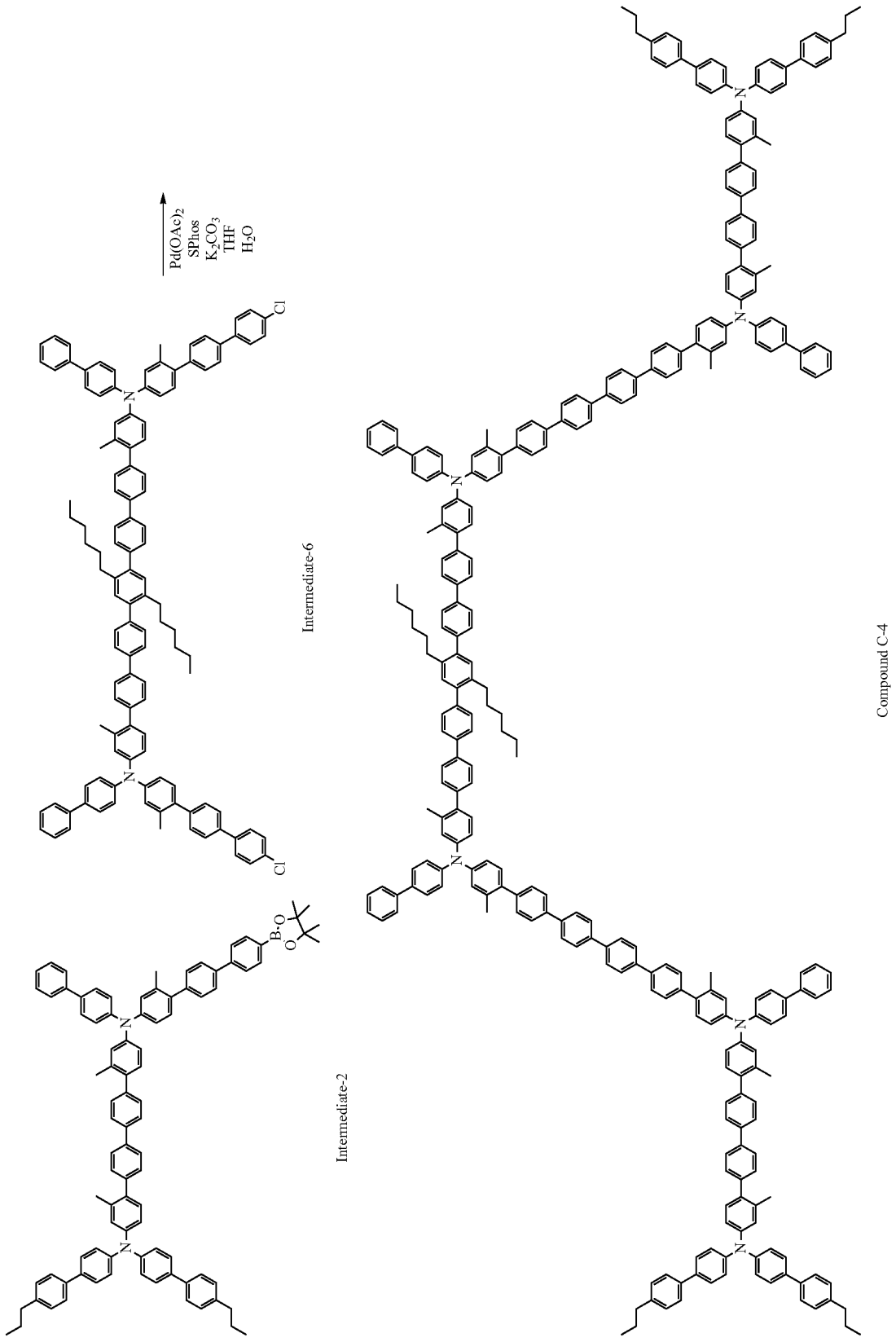

Compound C-4 (1.7 g, Yield: 90%) is synthesized in the same manner as the synthesis of Compound C-1 except that 0.81 mg of Intermediate-6 is used instead of Intermediate-3. In addition, Compound C-4 has a molecular 5 weight of 3900 g/mole (theoretical value: 3841), when measured by GPC using polystyrene as a standard material.

Comparative Example 1

Manufacture of Quantum Dot Electroluminescent device D-3

Quantum dot electroluminescent device D-3 is manufactured in the same manner as Example 1 (Quantum dot electroluminescent device D-1) except that poly[(9,9-dioctylfluorenyl-2,7-diyl)-co-(4,4'-(N-(4-sec-butylphenyl)diphenylamine)] having the following structure (TFB, Luminescence Technology Corp.) is used instead of Compound C-1. TFB has a weight average molecular weight (Mw) of 320,000 g/mole when measured by GPC using polystyrene as a standard material.

TFB

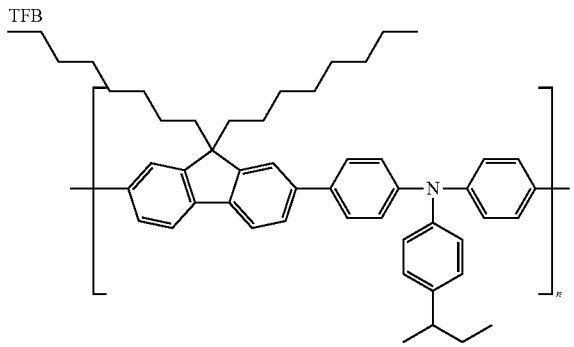

Evaluation

Evaluation of Compound/Composition

Each compound/composition is evaluated with respect to viscosity and a residual film rate (%) in the following method. The results are shown in Table 1.

Viscosity

Each compound/composition is dissolved in 3-phenoxy toluene at a solid concentration of 1.5 wt %, preparing a liquid composition. The obtained liquid composition is measured with respect to viscosity (mPa·s) at 25° C. by using a rheometer (made by Anton-Paar GmbH). When the viscosity is 10 mPa·s or less, the compounds/compositions may be suitable for inkjet printing.

Residual Film Rate

The liquid composition used for evaluating the viscosity is spin-coated to have a film thickness of 100 nm on a quartz substrate. The coated substrate is heat-treated at 230° C. for 60 minutes, obtaining Thin Film 1.

On the surface of Thin Film 1, a solvent (cyclohexylbenzene, dodecylbenzene) used in an ink composition for a quantum dot light emitting layer is dropped. The solvent is waited for 10 seconds in a burned state and then, spin-coated. The spin-coated solvent is heat-treated at 230° C. for 60 minutes, obtaining Thin Film 2.

Thin films 1 and 2 are measured with respect to a film thickness by using Elipsometer (made by Horiba Jobin Yvon Inc.) and used to calculate a residual film rate according to Equation 1:

$$\text{Residual film rate} = B/A \times 100(\%) \quad \text{[Equation 1]}$$

In Equation 1, A is a thickness (nm) of Thin Film 1, and B is a thickness (nm) of Thin Film 2.

TABLE 1

| | Compound/composition | Molecular weight | | | Viscosity (mPa · s) | Residual film rate (%) | |
| | | Compound | Low molecular weight compound | Polymer compound | | cyclohexylbenzene | dodecylbenzene |
|---|---|---|---|---|---|---|---|
| Ex. 1 | Compound C-1 | 3,500 | — | — | 5.4 | 98 | 100 |
| | Composition M-1 | | 679 | — | 5.4 | 97 | 99 |
| | Composition M-2 | | — | 12,000 | 5.9 | 100 | 100 |
| Ex. 2 | Compound C-2 | 4,200 | — | — | 4.5 | 100 | 100 |
| | Composition M-3 | | 679 | — | 4.5 | 96 | 98 |
| | Composition M-4 | | — | 12,000 | 5.8 | 100 | 100 |
| Ex. 3 | Compound C-3 | 3,700 | — | — | 5.2 | 98 | 99 |
| Ex. 4 | Compound C-4 | 3,900 | — | — | 5.1 | 97 | 98 |
| Comp. Ex. 1 | TFB | 320,000 | — | — | 24.2 | 20 | 80 |

As shown in Table 1, the compound/composition has two features (low viscosity of an ink and high residual film rate) required for manufacturing an EL device by inkjet printing and thus turns out to be suitable for inkjet printing.

Evaluation of Quantum Dot Electroluminescent Device

Each quantum dot electroluminescent device is evaluated with respect to luminous efficiency and luminescence life-span according to the following method.

The results are shown in Table 2.

Luminous Efficiency

When a voltage is applied to each quantum dot electroluminescent device, a current starts to flow at a constant voltage, and the electroluminescent device emits light.

A DC constant voltage power supply (a source meter, Keyence Corp.) is used to gradually increase a voltage, at which a current of each device is measured, and a luminance measuring device (SR-3, Topcon Technology Co., Ltd.) is used to measure luminance during the light emission. Herein, the measurement is completed, when the luminance starts to decline. An area of each device is used to calculate a current per unit area (current density), and the luminance (cd/m$^2$) is divided by the current density (A/m$^2$) to obtain current efficiency (cd/A).

In addition, the highest current efficiency within the measured voltage range is provided as "cd/A max."

Furthermore, a spectral radiance luminance spectrum measured with a luminance-measuring device, assuming that Lambertian radiation is performed, is used to calculate external quantum efficiency (EQE) (%) at the cd/A max and thus evaluate luminous efficiency.

Luminescence Life-Span

The DC constant voltage power supply (a source meter made by KEYENCE Corp.) is used to apply a predetermined voltage to each quantum dot electroluminescent device and thus make the quantum dot electroluminescent device emit light.

While the light emission of the quantum dot electroluminescent device is measured by using the luminance-measuring device (SR-3, Topcon Technology Co., Ltd.), a current is gradually increased and then, is made constant, when the luminance reaches 280 nit (cd/m$^2$), and then, the device is left alone.

The time that luminance that is measured by a luminance-measuring device gradually decreases and reaches 50% of the initial luminance is provided as "LT50(hr)", and "Relative LT" is calculated based on 100 of LT50 of Comparative Example 1.

TABLE 2

| | Compound | EQE (%) | Relative LT |
|---|---|---|---|
| Example 1 | Compound C-1 | 10.2 | 216 |
| Example 2 | Compound C-2 | 12.1 | 144 |
| Comparative Example 1 | TFB | 9.3 | 100 |

Referring to Table 2, the quantum dot electroluminescent devices of the examples exhibit significantly high luminous efficiency and durability (particularly, luminescence lifespan), compared with the quantum dot electroluminescent devices of the comparative examples.

On the other hand, in the present exemplary embodiments, red quantum dot electroluminescent devices are evaluated, but the same results as above may be obtained in blue quantum dot electroluminescent devices and the like.

While this disclosure has been described in connection with what is presently considered to be practical exemplary embodiments, it is to be understood that the invention is not limited to the disclosed embodiments. On. 10 the contrary, it is intended to cover various modifications and equivalent arrangements included within the spirit and scope of the appended claims.

DESCRIPTION OF SYMBOLS

100: electroluminescent device (EL device)
110: substrate
120: first electrode
130: hole injection layer
140: hole transport layer
150: light emitting layer
160: electron transport layer
170: electron injection layer
180: second electrode

What is claimed is:

1. A compound represented by Chemical Formula 1:

[Chemical Formula 1]

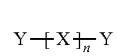

wherein, in Chemical Formula 1, n is an integer of greater than or equal to 3 and less than or equal to 10, X is a group represented by Chemical Formula 2 and a plurality of X's are the same or different from each other, and Y is a group represented by Chemical Formula 3 and a plurality of Y's are the same or different from each other,

[Chemical Formula 2]

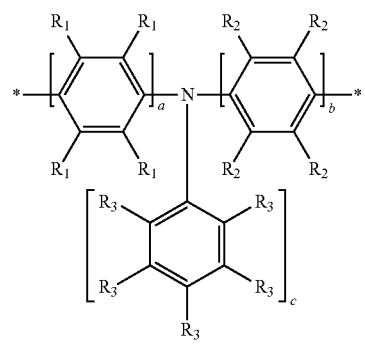

wherein, in Chemical Formula 2, $R_1$, $R_2$, and $R_3$ are each independently a hydrogen atom, a single bond, or an alkyl group having 1 to 10 carbon atoms and are the same or different and are optionally linked to each other to form a ring, a and b are each independently an integer of greater than or equal to 2 and less than or equal to 10, and c is greater than or equal to 1 and less than or equal to 6;

[Chemical Formula 3]

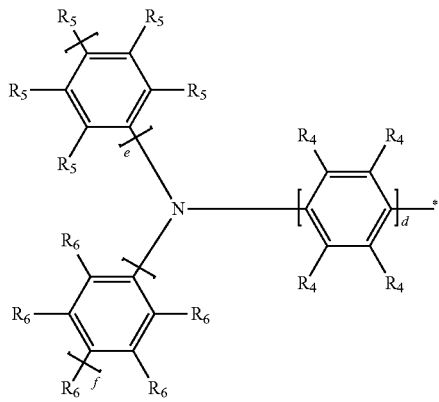

wherein, in Chemical Formula 3,
$R_4$, $R_5$, and $R_6$ are each independently a hydrogen atom, a single bond, or an alkyl group having 1 to 8 carbon atoms and are the same or different and are optionally linked to each other to form a ring,
d is greater than or equal to 1 and less than or equal to 5, and
e and f are each independently greater than or equal to 1 and less than or equal to 6.

2. The compound of claim 1, wherein the compound has a molecular weight of greater than or equal to about 3000 g/mole and less than or equal to about 10000 g/mole.

3. A composition comprising
the compound of claim 1, and
a low molecular weight compound having a molecular weight of less than about 2000 g/mole,
wherein a content of the low molecular weight compound is less than or equal to about 30 wt %.

4. A composition comprising
the compound of claim 1, and
a polymer compound having a molecular weight of greater than or equal to about 10000 g/mole,
wherein a content of the polymer compound is less than or equal to about 60 wt %.

5. A composition comprising
the compound of claim 1,
a low molecular weight compound having a molecular weight of less than about 2000 g/mole, and
a polymer compound having a molecular weight of greater than or equal to about 10000 g/mole,
wherein a content of the low molecular weight compound is less than or equal to about 30 wt %, and
a content of the polymer compound is less than or equal to about 60 wt %.

6. A liquid composition comprising
the compound of claim 1, and
a solvent.

7. A liquid composition comprising
the composition of claim 3, and
a solvent.

8. A liquid composition comprising
the composition of claim 4, and
a solvent.

9. A liquid composition comprising
the composition of claim 5, and
a solvent.

10. An electroluminescent device material, comprising the compound of claim 1, and
a solvent.

11. An electroluminescent device material, comprising the composition of claim 3, and
a solvent.

12. An electroluminescent device material, comprising the composition of claim 4, and
a solvent.

13. An electroluminescent device material, comprising the composition of claim 5, and
a solvent.

14. An electroluminescent device, comprising
a first electrode and a second electrode, and
at least one organic layer between the first electrode and the second electrode,
wherein at least one layer of the organic layer comprises the compound of claim 1.

15. The electroluminescent device of claim 14, wherein the organic layer comprising the compound is a hole transport layer or a hole injection layer.

16. The electroluminescent device of claim 14, wherein the organic layer comprises a light emitting layer comprising semiconductor nanoparticles or an organometallic complex.

17. An electroluminescent device, comprising
a first electrode and a second electrode, and
at least one organic layer between the first electrode and the second electrode,
wherein at least one layer of the organic layer comprises the composition of claim 3.

18. The electroluminescent device of claim 17, wherein the organic layer comprising the composition is a hole transport layer or a hole injection layer.

19. The electroluminescent device of claim 17, wherein the organic layer comprises a light emitting layer comprising semiconductor nanoparticles or an organometallic complex.

20. An electroluminescent device, comprising
a first electrode and a second electrode, and
at least one organic layer between the first electrode and the second electrode,
wherein at least one layer of the organic layer comprises the composition of claim 4.

21. The electroluminescent device of claim 20, wherein the organic layer comprising the composition is a hole transport layer or a hole injection layer.

22. The electroluminescent device of claim 20, wherein the organic layer comprises a light emitting layer comprising semiconductor nanoparticles or an organometallic complex.

23. An electroluminescent device, comprising
a first electrode and a second electrode, and
at least one organic layer between the first electrode and the second electrode,
wherein at least one layer of the organic layer comprises the composition of claim 5.

24. The electroluminescent device of claim 23, wherein the organic layer comprising the composition is a hole transport layer or a hole injection layer.

25. The electroluminescent device of claim 23, wherein the organic layer comprises a light emitting layer comprising semiconductor nanoparticles or an organometallic complex.

26. A method of manufacturing an electroluminescent device comprising
a first electrode and a second electrode, and
at least one organic layer between the first electrode and the second electrode, comprising
applying the liquid composition according to claim 6 by inkjet printing, and drying the liquid composition to remove a solvent to form a hole transport layer.

27. The method of claim 26, which comprises
applying an ink for a light emitting layer comprising semiconductor nanoparticles and a solvent for a light emitting layer on the surface of the hole transport layer by a wet method, and
drying the ink for the light emitting layer to remove the solvent to form the light emitting layer.

28. A method of manufacturing an electroluminescent device comprising
a first electrode and a second electrode, and
at least one organic layer between the first electrode and the second electrode, comprising
applying the liquid composition according to claim 7 by inkjet printing, and
drying the liquid composition to remove a solvent to form a hole transport layer.

29. The method of claim 28, which comprises
applying an ink for a light emitting layer comprising semiconductor nanoparticles and a solvent for a light emitting layer on the surface of the hole transport layer by a wet method, and
drying the ink for the light emitting layer to remove the solvent to form the light emitting layer.

30. A method of manufacturing an electroluminescent device comprising
a first electrode and a second electrode, and
at least one organic layer between the first electrode and the second electrode, comprising
applying the liquid composition according to claim 8 by inkjet printing, and
drying the liquid composition to remove a solvent to form a hole transport layer.

31. The method of claim 30, which comprises
applying an ink for a light emitting layer comprising semiconductor nanoparticles and a solvent for a light emitting layer on the surface of the hole transport layer by a wet method, and
drying the ink for the light emitting layer to remove the solvent to form the light emitting layer.

32. A method of manufacturing an electroluminescent device comprising
a first electrode and a second electrode, and
at least one organic layer between the first electrode and the second electrode, comprising
applying the liquid composition according to claim 9 by inkjet printing, and
drying the liquid composition to remove a solvent to form a hole transport layer.

33. The method of claim 32, which comprises
applying an ink for a light emitting layer comprising semiconductor nanoparticles and a solvent for a light emitting layer on the surface of the hole transport layer by a wet method, and
drying the ink for the light emitting layer to remove the solvent to form the light emitting layer.

* * * * *